United States Patent
Nakata et al.

(10) Patent No.: US 7,262,142 B2
(45) Date of Patent: Aug. 28, 2007

(54) SEMICONDUCTOR DEVICE FABRICATION METHOD

(75) Inventors: Yoshihiro Nakata, Kawasaki (JP); Shirou Ozaki, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/259,209

(22) Filed: Oct. 27, 2005

(65) Prior Publication Data

US 2006/0128167 A1 Jun. 15, 2006

Related U.S. Application Data

(63) Continuation-in-part of application No. 11/080,448, filed on Mar. 16, 2005, now abandoned.

(30) Foreign Application Priority Data

Dec. 9, 2004 (JP) ............................. 2004-356618
Aug. 16, 2005 (JP) ............................. 2005-235850

(51) Int. Cl.
  *H01L 21/00* (2006.01)
(52) U.S. Cl. ......... 438/795; 257/E21.16; 257/E21.241; 438/798
(58) Field of Classification Search .......... 257/E21.16, 257/E21.241; 427/595; 250/492.2; 438/798, 438/788, 795
  See application file for complete search history.

(56) References Cited

U.S. PATENT DOCUMENTS 6,165,890 A 12/2000 Kohl et al.

2006/0081830 A1* 4/2006 Knorr et al. .................... 257/3

FOREIGN PATENT DOCUMENTS

| JP | 2002-26121 | 1/2002 |
| JP | 2003-68850 | 3/2003 |
| KR | 2002-75412 A | 10/2002 |

OTHER PUBLICATIONS

Korean Office Action dated Oct. 31, 2006 (mailing date), issued in corresponding Korean Patent Application No. 10-2005-0115729.

* cited by examiner

*Primary Examiner*—Caridad Everhart
(74) *Attorney, Agent, or Firm*—Westerman, Hattori, Daniels & Adrian, LLP.

(57) ABSTRACT

The semiconductor device fabrication method comprises the step of forming a first porous insulation film 38 over a semiconductor substrate 10; the step of forming a second insulation film 40 whose density is higher than that of the first porous insulation film 38; and the step of applying electron beams, UV rays or plasmas with the second insulation film 40 present to the first porous insulation film 38 to cure the first porous insulation film 38. The electron rays, etc. are applied to the first porous insulation film 38 through the denser second insulation film 40, whereby the first porous insulation film 38 can be cured without being damaged. The first porous insulation film 38 can be kept from being damaged, whereby the moisture absorbency and density increase can be prevented, and resultantly the dielectric constant increase can be prevented. Thus, the present invention can provide a semiconductor device including an insulation film of low dielectric constant and high mechanical strength.

17 Claims, 19 Drawing Sheets

SEMICONDUCTOR DEVICE FABRICATION METHOD

CROSS-REFERENCE TO RELATED APPLICATION

This application is a continuation-in-part of Ser. No. 11/080,448, filed on Mar. 16, 2005 now abandoned.

This application is based upon and claims the benefit of priorities from the prior Japanese Patent Application No. 2004-356618, filed on Dec. 9, 2004, and the prior Japanese Patent Application No. 2005-235850, filed on Aug. 16, 2005, the entire contents of which are incorporated herein by reference.

BACKGROUND OF THE INVENTION

The present invention relates to a semiconductor device fabrication method, more specifically a method for fabricating a semiconductor device including insulation film of low dielectric constant.

Recently, as semiconductor devices are increasingly integrated, the interconnection width and the interconnection pitch are set increasing much smaller. It is proposed to make the interconnection pitch 0.1 μm or below. The parasitic capacitance between the interconnections is inversely proportional the interconnection pitch, and the parasitic capacitance between the interconnections is increased as the interconnection pitch is made smaller. The increase of the parasitic capacitance between the interconnections leads to the delay of the propagation speed, which is a factor for blocking the improvement of the operation speed of the semiconductor devices. To decrease the parasitic capacitance between the interconnections it is effective to use materials of low dielectric constants as the materials of the inter-layer insulation films.

Conventionally, as materials of the inter-layer insulation film, inorganic films, as of silicon dioxide ($SiO_2$), silicon nitride (SiN), Phosphorus-Silicate Glass (PSG), etc., have been used. As materials of the inter-layer insulation film, organic film, etc., as of polyimide, etc., have been used. For example, the dielectric constant of $SiO_2$ film formed by CVD is about 4.

As an insulation film having a dielectric constant lower than $SiO_2$ film, SiOF film is proposed. The dielectric constant of SiOF film is about 3.3-3.5. However, to sufficiently lower the parasitic capacitance between the interconnection, it is necessary to use insulation films of further lower dielectric constants.

Recently as insulation films of very low dielectric constants, porous insulation film is noted. The porous insulation film is a film having a number of pores therein. A porous insulation film is used as a material of the inter-layer insulation films, whereby the parasitic capacitance between the interconnection can be decreased.

Following references disclose the background art of the present invention.

[Patent Reference 1]
Specification of Japanese Patent Application Unexamined Publication No. 2002-26121
[Patent Reference 2]
Specification of Japanese Patent Application Unexamined Publication No. 2003-68850

However, it cannot be said that the porous insulation film, in which a number of pores are formed, is mechanically sufficiently strong. Cracks are often made in the insulation film, and the insulation film is often broken in bonding.

SUMMARY OF THE INVENTION

An object of the present invention is to provide a method for fabricating a semiconductor device including insulation films of very low dielectric constant and sufficient mechanical strength.

According to one aspect of the present invention, there is provided a semiconductor device fabrication method comprising the steps of: forming a fist porous insulation film over a semiconductor substrate; forming over the first porous insulation film a second insulation film the density of which is higher than that of the first porous insulation film; and applying electron beams, UV rays or plasmas to the first porous insulation film with the second insulation film present on the first porous insulation film to cure the first porous insulation film.

In the present invention, a porous inter-layer insulation film is formed, then a dense insulation film is formed on the porous inter-layer insulation film, and electron beams, UV (ultraviolet) rays or plasmas are applied to the porous inter-layer insulation film through the dense insulation film. According to the present invention, in which the porous inter-layer insulation film is cured with electron beams or others, the porous inter-layer insulation film can have very high mechanical strength. Thus, according to the present invention, cracking of the inter-layer insulation film and breakage of the inter-layer insulation film in bonding, etc. can be prevented. Furthermore, according to the present invention, in which the electron beams or others are applied through the dense insulation film, the porous inter-layer insulation film is kept from being damaged. Thus, according to the present invention, the moisture absorbency increase of the porous inter-layer insulation film can be prevented. The density increase of the porous inter-layer insulation film can be prevented. Resultantly, according to the present invention, the dielectric constant increase of the porous inter-layer insulation film can be prevented. Thus, the present invention can provide a porous inter-layer insulation film of low dielectric constant and high mechanical strength. The present invention can provide a semiconductor device of high operation speed and high reliability.

DETAILED DESCRIPTION OF THE INVENTION

As described above, it cannot be said that the porous insulation is mechanically sufficiently strong.

Electron beams, etc. are applied to a porous insulation film, whereby the film quality of the porous insulation film is modified, and the mechanical strength of the porous insulation film can be improved.

However, when electron beams, etc. are applied to a porous insulation film, the porous insulation film is damaged. When the porous insulation film is damaged, the moisture absorbency of the porous insulation film is increased. When the porous insulation film absorbs water, the dielectric constant is increased. When the porous insulation film is damaged, the porous insulation film is excessively shrunk, which is also a factor for increasing the dielectric constant.

The inventors of the present application made earnest studies and have obtained an idea that an insulation film of high density is formed on a porous insulation film, and electron beams, etc. are applied the porous insulation film through the dense insulation film so that the electron beams, etc. can be applied to the porous insulation film while the porous insulation film is kept from being damaged. According to the present invention, while the porous insulation film is kept from being damaged, electron beams, etc. are applied to the porous insulation film, whereby the moisture absorbency increase and shrinkage of the porous insulation film can be prevented while the porous insulation film can be sufficiently cured. Thus, according to the present invention, a porous insulation film of sufficiently high mechanical strength and low dielectric constant can be formed.

An Embodiment

The semiconductor device fabrication method according to one embodiment of the present invention will be explained with reference to FIGS. 1A to 8. FIGS. 1A to 8 are sectional views of a semiconductor device in the steps of the semiconductor device fabrication method according to the present embodiment.

Figure 1A:
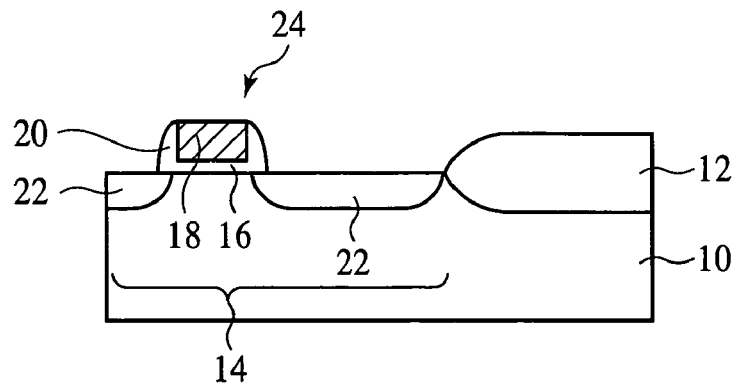
FIGS. 1A to 1C are sectional views of a semiconductor device in the steps of the semiconductor device fabrication method according to one embodiment of the present invention, which illustrate the method (Part 1).

As illustrated in FIG. 1A, a device isolation film 12 is formed on a semiconductor substrate 10 by, e.g., LOCOS (LOCal Oxidation of Silicon). The device isolation film 12 defines a device region 14. The semiconductor device 10 is, e.g., a silicon substrate.

Next, in the device region 14, a gate electrode 18 is formed through the intermediary of a gate insulation film 16. Then, a sidewall insulation film 20 is formed on the side wall of the gate electrode 18. Next, with the sidewall insulation film 20 and the gate electrode 18 as the mask, a dopant impurity is implanted into the semiconductor substrate 10 to form a source/drain diffused layer 22 in the semiconductor substrate 10 on both sides of the gate electrode 18. Thus a transistor 24 including the gate electrode 18 and the source/drain diffused layer 22 is fabricated.

Next, an inter-layer insulation film 26 of a silicon oxide film is formed on the entire surface by, e.g., CVD.

Then, a stopper film 28 of, e.g., a 50 nm-thickness is formed on the inter-layer insulation film 26. The stopper film 28 is formed of, e.g., SiN film,. SiC hydride film (SiC:H film), SiC hydride oxide (SiC:O:H film), SiC nitride film (SiC:N film) or others. Then, SiC:H film is SiC film in which hydrogen is present. SiC:O:H film is SiC film in which oxygen (O) and hydrogen (H) are present. SiC:N film is SiC film in which N (nitrogen) is present. The stopper film 28 functions as the stopper for polishing a tungsten film 34, etc. by CMP in a later step. The stopper film 28 functions also as the etching stopper for forming a trench 46 in an inter-layer insulation film 38, etc. in a later step.

Figure 1B:
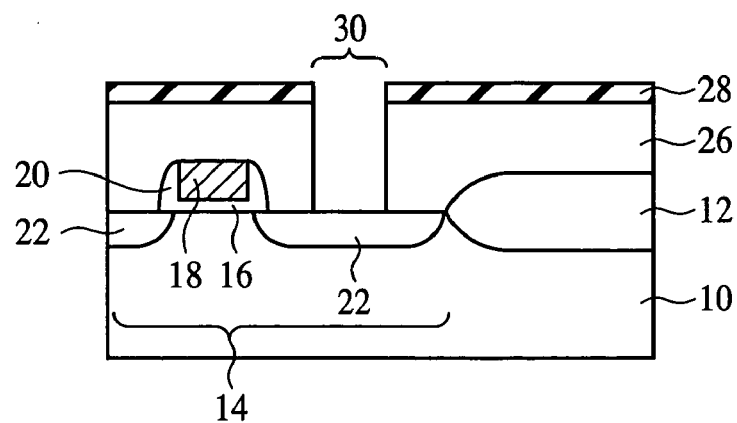

Next, a contact hole 30 is formed down to the source/drain diffused layer 22 by photolithography (see FIG. 1B).

Next, an adhesion layer 32 of a 50 nm-TiN film is formed on the entire surface by, e.g., sputtering. The adhesion layer 32 is for ensuring the adhesion of a conductor plug which will be described later to the lower layer.

Then, a tungsten film 34 of, e.g., a 1 μm-film thickness is formed on the entire surface by, e.g., CVD.

Then, the adhesion layer 32 and the tungsten film 34 are polished by, e.g., CMP until the surface of the stopper film 28 is exposed. Thus, the conductor plug 34 of the tungsten is buried in the contact hole (see FIG. 1C).

Next, an insulation film 36 of SiC hydride oxide (SiC:O:H film) is formed on the entire surface by vapor deposition, more specifically plasma enhanced CVD. As described above, SiC:O:H film is SiC film in which oxygen (O) and hydrogen (H) are present. SiC film is electrically conductive, but SiC:O:H film is dielectric. The insulation film 36 has high density. The density of the insulation film 36 is higher than that of a porous insulation film 38 which will be described later. The insulation film 36 also functions as a barrier film for preventing the diffusion of water, etc. The insulation film 36 can prevent water, etc. from arriving at the porous insulation film 38 and can prevent the increase of the dielectric constant of the porous insulation film 38.

The insulation film 36 of SiC:O:H film can be formed as exemplified below.

First, the semiconductor substrate 10 is loaded in the chamber of a plasma enhanced CVD system. The plasma enhanced CVD system is, e.g., a diode parallel plate plasma enhanced CVD system.

Then, substrate temperature is heated to 300-400° C.

Next, siloxane monomer having alkyl groups is vaporized by a vaporizer to generate the reactive gas. The reactive gas is introduced into the chamber on the carrier of an inert gas. The feed amount of the reactive gas is, e.g., 1 mg/min. At this time, when high-frequency power is applied between the plate electrodes, plasma of the reactive gas are generated, and the insulation film 36 of SiC:O:H film is formed.

The insulation film of SiC:O:H is thus formed.

Figure 2A:
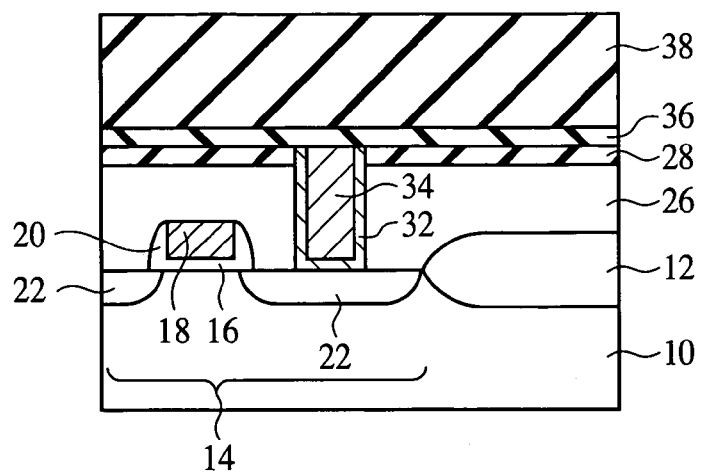
FIGS. 2A to 2C are sectional views of the semiconductor device in the steps of the semiconductor device fabrication method according to the embodiment of the present invention, which illustrate the method (Part 2).

Next, as illustrated in FIG. 2A, a porous inter-layer insulation film (a first insulation film) 38 is formed on the entire surface. The film thickness of the porous inter-layer insulation film 38 is, e.g., 160 nm. The porous inter-layer insulation film 38 can be formed as exemplified below.

First, an insulation film material (silica cluster precursor) containing a cluster silicon compound (silica) is prepared.

The insulation material containing cluster silica can be prepared as exemplified below. First, 20.8 g (0.1 mol) of tetraethoxysilane, 17.8 g (0.1 mol) of methyltriethoxysilane, 23.6 g (0.1 mol) of glycidoxypropyltrimethoxysilane and 39.6 g of methylisobutylketone are put in a reaction vessel, and 16.2 g of 1% tetrabutylammonium hydroxide aqueous solution is dropped in 10 minutes. After the drop, the aging reaction is conducted for 2 hours. Then, 5 g of magnesium sulfate to remove excessive water. Then, ethanol produced in the aging reactin is removed by a rotary evaporator until the reactant solution becomes 50 ml. Methylisobutylketone is added by 20 ml to the thus produced reactant solution, and the insulation film material (silica cluster precursor) containing cluster silica is formed.

As such insulation film material, for example, Nano-Clustering Silica (NCS) (Type No. CERAMATE NCS) by CATALYSTS & CHEMICALS IND. CO. LTD. can be used. Such insulation material contains cluster silica formed by using quarternary alkylamine as the catalyst.

Then, the insulation material is applied to the entire surface by, e.g., spin coating. Conditions for the application are, e.g., 3000 rotations/minute and 30 seconds. Thus, the inter-layer insulation film 38 is formed on the semiconductor substrate 10.

Then, thermal processing (soft bake) is conducted. For the thermal processing, a hot plate, for example, is used. The thermal processing temperature is, e.g., 200° C. The thermal processing period of time is, e.g., 15 seconds. This thermal processing evaporate the solvent in the insulation film material, and the porous inter-layer insulation film 38 is formed. The inter-layer insulation film 38 is formed of the insulation film material containing cluster silica, and can be porous with a very fine pores. To be specific,. the diameter of the pores is, e.g., 2 nm or less. The inter-layer insulation film 38, which is formed of the insulation material containing cluster silica, can have a very uniform distribution of the pores. The inter-layer insulation film 38 is formed of the insulation film material containing cluster silica, whereby the inter-layer insulation film 38 can be porous and have very high quality. The size of the pores can be measured b, e.g., X-ray small angle scattering method.

Figure 16A:
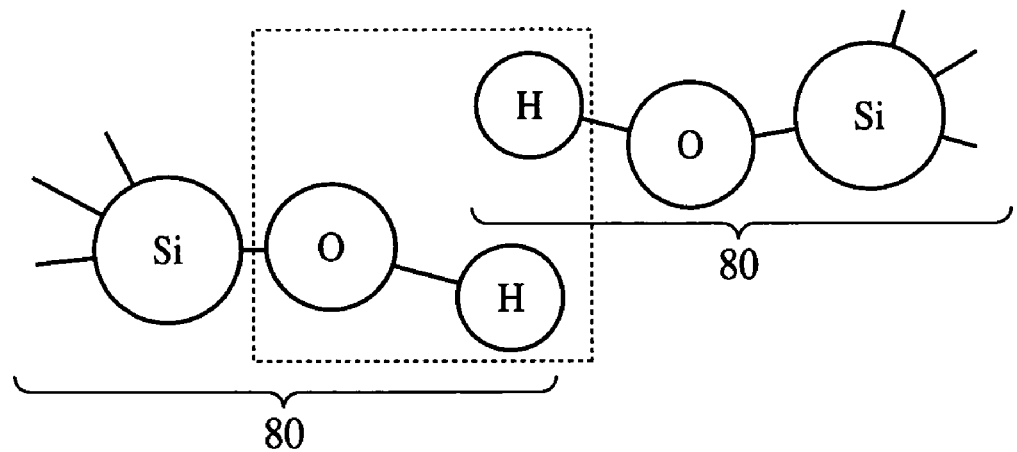
FIGS. 16A and 16B are conceptual views of the cross-linking reaction in the porous inter-layer insulation film.
Figure 16B:
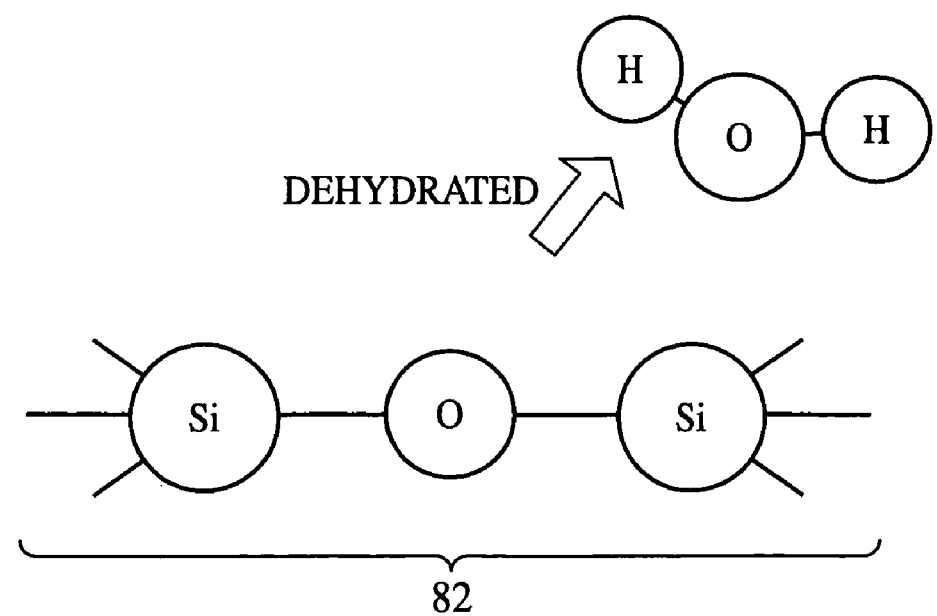

When the thermal processing (soft bake) is conducted on the inter-layer insulation film 38, it is preferable to make the thermal processing so that the cross-linking percentage is 10% or more. That is, when the thermal processing is made on the inter-layer insulation film 38, the cross-linking reaction advances in the inter-layer insulation film 38. FIG. 16 is conceptual views of the cross-linking reaction in the inter-layer insulation film. As illustrated in FIG. 16, silanol groups 80 in the inter-layer insulation film 38 are dehydration condensated, and siloxane groups 82 which are the principal skeletons go on being formed. FIG. 16A illustrates the state of the silanol groups before dehydration condensated. In FIG. 16A, the part enclosed by the dot line indicates the hydrogen and oxygen to be eliminated upon the dehydration condensation. FIG. 16B illustrates the state of the silanol group which has been dehydration condensated. The cross-links of the inter-layer insulation film 38 includes two-dimensional cross-links and three-dimensional cross-links. Both are formed by the dehydration condensation of the silanol groups. When the thermal processing is made on the inter-layer insulation film 38, first the two-dimensional cross-linking advances, and the when the two-dimensional cross-linking has advanced to some extent, the two-dimensional cross-links are cross-linked with each other to form the three-dimensional cross-links. The cross-linking percentage X in the inter-layer insulation film 38 can be determined as follows, based on infrared absorption spectra given by a Fourier transform infrared spectrophotometer. As the Fourier transform infrared spectrophotometer, for example, a Fourier transform infrared spectrophotometer (Type number: JIR-100) by JEOL Ltd., or others can be used. In the infrared absorption spectra, the spectrum component corresponding to the three-dimensional siloxane groups appears near 1050 $cm^{-1}$, and the spectrum component corresponding to the two-dimensional siloxane group appears near 1140 $cm^{-1}$. The cross-linking percentage X in the inter-layer insulation film 38 is given by $$X=A/(A+B)$$

wherein a peak intensity of the spectrum component corresponding to the three-dimensional siloxane group is represented by A, and a peak intensity of the spectrum component corresponding to the two-dimensional siloxane bond is represented by B.

For the following reason, the thermal processing (soft bake) is conducted so that the cross-linking percentage X in the inter-layer insulation film 38 is 10-90%. That is, when the thermal processing is made so that the cross-linking percentage X is below 10%, a large amount of the solvent remain in the inter-layer insulation film 38. When a large amount of the solvent remains in the inter-layer insulation film 38, there is a risk that the insulation film 36, etc. below the inter-layer insulation film 38 may be solved by the solvent. Accordingly, when the cross-linking percentage X in the inter-layer insulation film 38 is below 10%, it is very difficult to ensure sufficient reliability. On the other hand, it is actually difficult to make the cross-linking percentage higher than 90% by the thermal processing (soft bake) alone.

When the thermal processing is made so that the cross-linking percentage is above 90% including 90%, there is a risk that the inter-layer insulation film 38 may be excessively damaged. For this reason, it is preferable to make the thermal processing (soft bake) so that the cross-linking percentage X in the inter-layer insulation film 38 is 10%-90%.

Thus, the porous inter-layer insulation film 38 is formed.

As the cluster compound, the insulation film material containing silicon compound is applied here. However, the cluster compound is not essentially silicon compound, and the insulation film material containing a cluster compound of any other material may be applied.

The material of the porous inter-layer insulation film 38, the method for forming the porous inter-layer insulation film 38, etc. are not limited to the above.

The inter-layer insulation film (porous silica film) 38 of porous silica may be formed as exemplified below.

An insulation film material for forming the porous inter-layer insulation film 38 is prepared. To be specific, a liquid insulation film material is prepared by adding a thermally decomposable compound to a polymer prepared by hydrolysis or condensation polymerization using as the raw material, e.g., tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane,. divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, propylvinyldialkoxysilane or others. The thermally decomposable compound is, e.g., acryl resin or others.

Then, the insulation film material is applied to the entire surface by, e.g., spin coating. Conditions for the application are, e.g., 3000 rotations/minute and 30 seconds. The inter-layer insulation film 38 of the insulation material is thus formed.

Then, thermal processing (soft bake) is performed. In the thermal processing, a hot plate, for example, is used. The thermal processing thermally decomposes the thermally decomposable compound, and pores (voids) are formed in the inter-layer insulation film 38. The diameter of the pores is, e.g., about 10-20 nm. The thermal processing temperature is set at 200-350° C. For the following reason, the thermal processing temperature is set at 200-350° C. When the thermal processing temperature is below 200° C., the thermally decomposable compound is not sufficiently thermally decomposed, and sufficient pores cannot be formed. Oppositely, when the thermal processing temperature is below 200° C., the speed of the thermal decomposition of the thermally decomposable compound is so slow that it takes long time to form pores. On the other hand, when the thermal processing temperature is above 350° C., the cure of the insulation film material rapidly advances, and the formation of pores is blocked. For this reason, it is preferable to set the thermal processing temperature at 200-350° C. The thermal processing temperature here is, e.g., 200° C.

The inter-layer insulation film (porous silica film) 38 of porous silica is thus formed.

As described above, the porous inter-layer insulation film (porous silica film) 38 may be formed by applying the insulation film material containing a thermally decomposable compound and making thermal processing on the insulation film material.

As will be described, the porous inter-layer insulation film (Carbon Doped $SiO_2$ film) 38 may be formed by vapor deposition.

First, the semiconductor substrate 10 is loaded into the chamber of the plasma enhanced CVD system. The plasma enhanced CVD system is, e.g., a diode parallel plate plasma enhanced CVD system.

Next, the substrate temperature is set at, e.g., 300-400° C.

Next, siloxane monomer containing alkyl groups is vaporized by a vaporizer to generate a reactive gas. The reactive gas is fed on a carrier gas into the chamber. At this time, high-frequency power is applied between the plate electrodes, and plasmas of the reactive gas are generated. At this time, the deposition rate is set to be relatively higher, whereby the porous inter-layer insulation film 38 can be formed. Specifically, under the following film deposition conditions set as exemplified below, the porous inter-layer insulation film 38 can be formed. The reactive gas is, e.g., hexamethyldisiloxane. The supply amount of the reactive gas is, e.g., 3 mg/min. The carrier gas is $CO_2$. The flow rate of the carrier gas is, e.g., 6000 sccm. The high-frequency power is, e.g., 13.56 MHz (500 W) and 100 kHz (500 W). Thus, the porous inter-layer insulation film 38 of silicon oxide film containing carbon is thus formed.

As described above, the porous inter-layer insulation film (Carbon Doped $SiO_2$ film) 38 may be formed by vapor deposition.

As will be described below, a raw material containing thermally decomposable atomic groups (thermally decomposable compound) or oxidation decomposable atomic groups (oxidation decomposable compound) is used, and the thermally decomposable or the oxidation decomposable atomic groups are decomposed by plasmas to form the porous inter-layer insulation film (porous carbon doped $SiO_2$ film) 38 may be formed by vapor deposition.

First, the semiconductor substrate 10 is loaded into the chamber of a plasma enhanced CVD system. The plasma enhanced CVD system is, e.g., a diode parallel plate plasma enhanced CVD system.

Next, the substrate temperature is set at, e.g., 250-350° C.

Then, siloxane monomer containing alkyl groups is vaporized by a vaporizer to generate a first reactive gas. Silane compound containing phenyl groups is vaporized by a vaporizer to generate a second reactive gas. The phenyl group is an atomic group (thermally decomposable and oxidation decomposable atomic group), which is heated and oxidized to be decomposed. $CO_2$ gas is used as the carrier gas to introduce these reactive gases into the chamber. At this time, when high-frequency power is applied between the plate electrodes, the $CO_2$ becomes plasma (oxygen plasmas) to decompose the phenyl groups. The inter-layer insulation film 38 is deposited with the phenyl groups being decomposed, whereby the inter-layer insulation film 38 which is porous is deposited. Conditions for the film deposition are set to be as exemplified below. The first reactive gas is more specifically, e.g., hexamethyldisiloxane. The supply amount of the first reactive gas is, e.g., 1 mg/min. The second reactive gas is more specifically, e.g., diphenylmethylsilane. The supply amount of the second reactive gas is, e.g., 1 mg/min. The flow rate of the carrier gas is, e.g., 3000 sccm. The high-frequency power to be applied between the plate electrodes is, e.g., 13.56 MHz (300 W) and 100 kHz (300 W). The porous inter-layer insulation film 38 of silicon oxide film containing carbon is thus formed.

A material containing thermally decomposable and oxidation decomposable atomic groups, which is heated to be oxidized and decomposed, is exemplified here. However, the porous inter-layer insulation film 38 may be formed, by vapor deposition, of a raw material containing thermally decomposable atomic groups which can be thermally decomposed without oxidation, or a raw material containing oxidation decomposable atomic groups which can be oxidized and decomposed without being heated.

As described above, the porous inter-layer insulation film (porous carbon doped $SiO_2$ film) 38 maybe formed of a raw material containing thermally decomposable atomic groups or oxidation decomposable atomic groups (thermally decomposable compound or oxidation decomposable compound) by vapor deposition while the thermally decomposable atomic groups or the oxidation decomposable atomic groups are being decomposed by plasmas.

As will be described below, the porous inter-layer insulation film (organic porous film) 38 may be formed by applying an insulation film material containing thermally decomposable organic compound and thermally decomposing the thermally decomposable atomic groups.

First, polyallylether polymer containing thermally decomposable organic compound is diluted with a solvent to form an insulation film material. The thermally decomposable organic compound is an organic compound which is thermally decomposable at, e.g., 200-300° C. is used. Such organic compound is, e.g., acryl resin, polyethylene resin, polypropylene resin, acryl oligomer, ethylene oligomer, propylene oligomer or others. The solvent is, e.g., chyclohexanone.

Next, the insulation film material is applied to the entire surface of the semiconductor substrate 10 by spin coating. The inter-layer insulation film 38 of the insulation material is formed on the semiconductor substrate 10.

Next, thermal processing is performed with a hot plate. The thermal processing temperature is, e.g., 100-400° C. The solvent in the inter-layer insulation film 38 is vaporized, and the inter-layer insulation film 38 is formed dry.

Then, the semiconductor substrate 10 is loaded into a curing oven to perform thermal processing. The thermal processing temperature is, e.g., 300-400° C. The thermally decomposable organic compound is thus thermally decomposed, and pores are formed in the inter-layer insulation film 38. Thus, the porous inter-layer insulation film 38 is formed.

The porous inter-layer insulation film (organic porous film) 38 may be thus formed by applying the insulation film material containing the thermally decomposable organic compound and thermally decomposing the thermally decomposable organic compound.

Figure 2B:
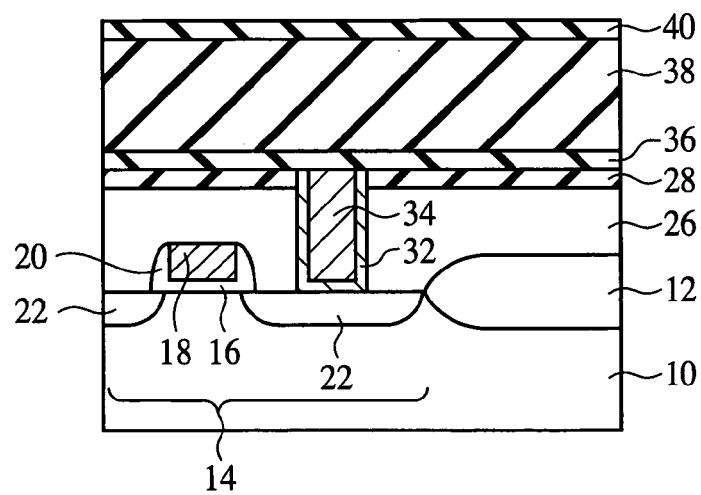

Then, as illustrated in FIG. 2B, a dense insulation film (a second insulation film) 40 is formed on the entire surface of the semiconductor substrate 10 with the porous inter-layer insulation film 38 formed on. For example, the insulation film 40 of silicon oxide film is formed by vapor deposition, more specifically plasma enhanced CVD. The insulation film 40 has higher density than the porous inter-layer insulation film 38. When the porous inter-layer insulation film 38 is cured by applying electron beams, etc. in a later step, the insulation film 40 is for keeping the porous inter-layer insulation film 38 from being much damaged by electron beams, etc. while permitting a suitable quantity of electron beams, etc. to arrive at the porous inter-layer insulation film 38.

Without the dense insulation film 40 formed on the porous inter-layer insulation film 38, the damage with the electron beams will be depressed by setting low the acceleration voltage for applying the electron beams. However, when electron beams are applied directly to the porous inter-layer insulation film 38, concavities and convexities are often formed in the surface of the porous insulation film 38. With the acceleration voltage set low, the electron beams cannot be applied stably homogeneously, and the inter-layer insulation film 38 cannot be homogeneously cured. Thus, it is very difficult to form the inter-layer insulation film 38 in good quality without forming the dense insulation film 40 on the porous inter-layer insulation film 38 and with the acceleration voltage for applying the electron beams set low.

The density of the insulation film is preferably 1-3 $g/cm^3$. The density of the insulation film 40 is set at 1-3 $g/cm^3$ for the following reason. When the density of the insulation film 40 is below 1 $g/cm^3$, in the sep of applying electron beams, etc. which will be described later, the electron beams, etc. easily passes the insulation film 40, and the porous inter-layer insulation film 38 is much damaged. Then, the porous inter-layer insulation film 38 has the moisture absorbency increased and is shrunk, and resultantly the dielectric constant is increased. On the other hand, when the density of the insulation film 40 is above 3 $g/cm^3$, in the step of applying electron beams, etc. which will be described alter, the electron beams, etc. are blocked by the insulation film 40, which makes it difficult to sufficiently cure the porous inter-layer insulation film 38. For this reason, it is preferable to set the density of the insulation film 40 at above 1-3 $g/cm^3$. However, when the density of the insulation film 40 is set above 2.5 $g/cm^3$, in the step of applying electron beams, etc. which will be described later, the electron beams, etc. are considerably blocked by the insulation film 40, and the electron beams, etc. cannot often arrive sufficiently at the porous insulation film 38. Thus, it is more preferable to set the density of the insulation film 40 at 1-2.5 $g/cm^3$.

It is preferable to set the film thickness of the insulation film 40 at, e.g., 5-70 nm. The film thickness of the insulation film 40 is set at 5-70 nm for the following reason. When the film thickness of the insulation film 40 is set at below 5 nm, in the step of applying electron beams, etc. which will be described alter, the electron beams, etc. easily pass the insulation film 40, and the porous inter-layer insulation film 38 is much damaged. Then, the porous inter-layer insulation film 38 has the moisture absorbency increased and is shrunk, and resultantly the dielectric constant is increased. On the other hand, when the film thickness of the insulation film 40 is above 70 nm, in the step of applying electron beams, etc which will be described alter, the electron beams, etc. are blocked by the insulation film 40, which makes it difficult to sufficiently cure the porous inter-layer insulation film 38. Thus, it is preferable to set the film thickness of the insulation film 40 at 5-70 nm. However, when the film thickness of the insulation film 40 is set at above 50 nm, in the step of applying electron beams, etc. which will be described later, the electron beams, etc. are blocked by the insulation film 40 and often do not sufficiently arrive at the porous insulation film 38. When the film thickness of the insulation film 40 is set at below 10 nm, in the step of applying electron beams, etc. which will be described alter, the electron beams relatively easily pass the insulation film 40 and often somewhat damage the porous inter-layer insulation film 38. Then, the porous inter-layer insulation film 38 has the moisture absorbency increased and is shrunk, and resultantly, the dielectric constant is increased. Accordingly, it is more preferable to set the film thickness of the insulation film 40 at about 10-50 nm.

The insulation film 40 of dense silicon oxide film is formed as follows.

First, a semiconductor substrate 10 is loaded into the chamber of a plasma enhanced CVD system. The plasma enhanced CVD system is, e.g., a diode parallel plate plasma enhanced CVD system.

Next, the substrate temperature is set at, e.g., 400° C.

Next, trimethylsilane is vaporized by a vaporizer to generate reactive gas. The reactive gas is fed on the carrier of an inert gas into the chamber. At this time, high-frequency power is applied between the plate electrodes, and plasmas of the reactive gas are generated. At this time, when the deposition rate is set relatively low, the dense insulation film 40 can be formed. Specifically, conditions for the deposition are set as exemplified below, whereby the dense insulation film 40 can be formed. The supply amount of the reactive gas is, e.g., 1 mg/min. The carrier gas is, e.g., $CO_2$. The flow rate of the carrier gas is, e.g., 100 sccm. The high-frequency power to be applied between the plate electrodes is, e.g., 13.56 MHz (200 W) and 100 kHz (200 W). The period of time of applying high-frequency power between the plate electrodes and generating the plasmas is, e.g., 5 seconds.

The insulation film 40 of the silicon oxide film formed under these conditions has a density of, e.g., about 2 g/cm³. The film thickness of the insulation film 40 here is, e.g., 30 nm. Thus, the dense insulation film 40 is formed on the porous inter-layer insulation film 38.

The material of the dense insulation film 40 and the deposition method for forming the dense insulation film 40 are not limited to the above.

For example, as described below, the dense insulation film 40 of carbon doped silicon oxide film (Carbon Doped $SiO_2$ film) may be formed by vapor deposition.

First, the semiconductor substrate 10 is loaded in the chamber of a plasma enhanced CVD system. The plasma enhanced CVD system is, e.g., a diode parallel plate plasma enhanced CVD system.

Next, the substrate temperature is set at, e.g., 400° C.

Next, hexamethyldisiloxane is vaporized by a vaporizer to generate reactive gas. Then, the reactive gas is fed on the carrier of an inert gas into the chamber. At this time, high-frequency power is applied between the plate electrodes, and plasmas of the reactive gas are generated. At this time, when the deposition rate is set relatively low, the insulation film 40 can be formed dense. Specifically, conditions for the deposition are set as exemplified below, whereby the dense insulation film 40 can be formed. The supply amount of the reactive gas is, e.g., 1 mg/min. The flow rate of the carrier gas is, e.g., 500 sccm. The high-frequency power to be applied between the plate electrodes is, e.g., 13.56 MHz (200 W) and 100 kHz (200 W). The period of time of applying high-frequency power between the plate electrodes and generating the plasmas is, e.g., 5 seconds.

Thus, the dense insulation film 40 of carbon doped silicon oxide film (Carbon Doped $SiO_2$ film) may be formed by vapor deposition.

As described below, the dense insulation film 40 of SiC hydride film (SiC:H film) may be formed by vapor deposition. As described above, the SiC:H film is SiC film in which H (hydrogen) is present.

First, the semiconductor substrate 10 is loaded into the chamber of a plasma enhanced CVD system. The plasma enhanced CVD system is, e.g., a diode parallel plate plasma enhanced CVD.

Next, the substrate temperature is set at, e.g., 400° C.

Next, trimethylsilane is vaporized by a vaporizer to generate reactive gas. The reactive gas is fed on a carrier gas into the chamber. At this time, high-frequency power is applied between the plate electrodes, and plasmas of the reactive gas are generated. At this time, when the deposition rate is set relatively low, the dense insulation film 40 can be formed. Specifically, conditions for the deposition are set as exemplified below, whereby the dense insulation film 40 can be formed. The supply amount of the reactive gas is, e.g., 1 mg/min. The carrier gas is, e.g., nitrogen. The flow rate of the carrier gas is, e.g., 1000 sccm. The high-frequency power to be applied between the plate electrodes is, e.g., 13.56 MHz (200 W) and 100 kHz (200 W). The period of time of applying high-frequency power between the plate electrodes and generating the plasmas is, e.g., 5 seconds.

Thus, the dense insulation film 40 of SiC:H film may be deposited by vapor deposition.

As described below, the dense insulation film 40 of SiC nitride film (SiC:N film) may be formed by vapor deposition. As described above, SiC:N film is SiC film in which N (nitrogen) is present.

First, the semiconductor substrate 10 is loaded into the chamber of a plasma enhanced CVD system. The plasma enhanced CVD system is, e.g., a diode parallel plate plasma enhanced CVD system.

Next, the substrate temperature is set at, e.g., 400° C.

Next, trimethylsilane is vaporized by a vaporizer to generate the reactive gas. The reactive gas is fed on a carrier gas into the chamber. At this time, high-frequency power is applied between the plate electrodes, and plasmas of the reactive gas are generated. At this time, when the deposition rate is set relatively low, the dense insulation film 40 can be formed. Specifically, conditions for the deposition are set as exemplified below, whereby the dense insulation film 40 can be formed. The supply amount of the reactive gas is, e.g., 1 mg/min. The carrier gas is, e.g., ammonia. The high-frequency power to be applied between the plate electrodes is, e.g., 13.56 MHz (200 W) and 100 kHz (200 W). The period of time of applying high-frequency power between the plate electrodes and generating the plasmas is, e.g., 5 seconds.

Thus, the dense insulation film 40 of SiC:N film is formed by vapor deposition.

As described below, the dense insulation film 40 of SiC hydride oxide film (SiC:O:H film) may be formed by vapor deposition. As described above, SiC:O:H film is SiC film in which O (oxygen) and H (hydrogen) are present.

First, the semiconductor substrate 10 is loaded into the chamber of a plasma enhanced CVD system. The plasma enhanced CVD system is, e.g., a diode parallel plate plasma enhanced CVD system.

Next, the substrate temperature is set at, e.g., 400° C.

Next, trimethylsilane is vaporized by a vaporizer to generate the reactive gas. The reactive gas is fed on a carrier gas into the chamber. At this time, high-frequency power is applied between the plate electrodes, and plasmas of the reactive gas are generated. At this time, when the deposition rate is set relatively low, the dense insulation film 40 can be formed. Specifically, conditions for the deposition are set as exemplified below, whereby the dense insulation film 40 can be formed. The supply amount of the reactive gas is, e.g., 1 mg/min. The carrier gas is, e.g., $CO_2$. The flow rate of the carrier gas is, e.g., 100 sccm. The high-frequency power to be applied between the plate electrodes is, e.g., 13.56 MHz (200 W) and 100 kHz (200 W). The period of time of applying high-frequency power between the plate electrodes and generating the plasmas is, e.g., 5 seconds.

As described above, the dense insulation film 40 of SiC:O:H film may be formed by vapor deposition.

As described below, the dense insulation film 40 may be formed by applying organic SOG (Spin-On-Glass) film.

First, an insulation film material for forming the organic SOG film is prepared. The insulation film material is a polymer prepared by hydrolysis and condensation using, e.g., tetraethoxysilane and methyltriethoxysilane as the raw material.

Next, the insulation film material is applied to the entire surface by spin coating. Conditions for the application are, e.g., 3000 rotations/minute and 30 seconds. Thus, the insulation film 40 is formed on the porous inter-layer insulation film 38.

Next, thermal processing (soft bake) is performed. The thermal processing is performed with, e.g., a hot plate. The thermal processing temperature is, e.g., 200° C. The thermal processing period of time is, e.g., 150 seconds.

Thus, the insulation film 40 may be formed by applying the organic SOG film.

As described below, the dense insulation film 40 may be formed by applying inorganic SOG film.

First, an insulation film material for forming inorganic SOG film is prepared. The insulation film material is, e.g., a polymer prepared by hydrolysis and condensation using tetraethoxysilane.

Next, the insulation film material for forming the inorganic SOG film is applied to the entire surface by spin coating. Conditions for the application are, e.g., 3000 rotations/minute and 30 seconds. Thus, the insulation film 40 is formed on the porous inter-layer insulation film 38.

Next, thermal processing (soft bake) is performed. The thermal processing is performed with, e.g., a hot plate. The thermal processing temperature is, e.g., 200° C. The thermal processing period of time is, e.g., 150 seconds.

Thus, the dense insulation film 40 may be formed by applying inorganic SOG film.

Figure 2C:
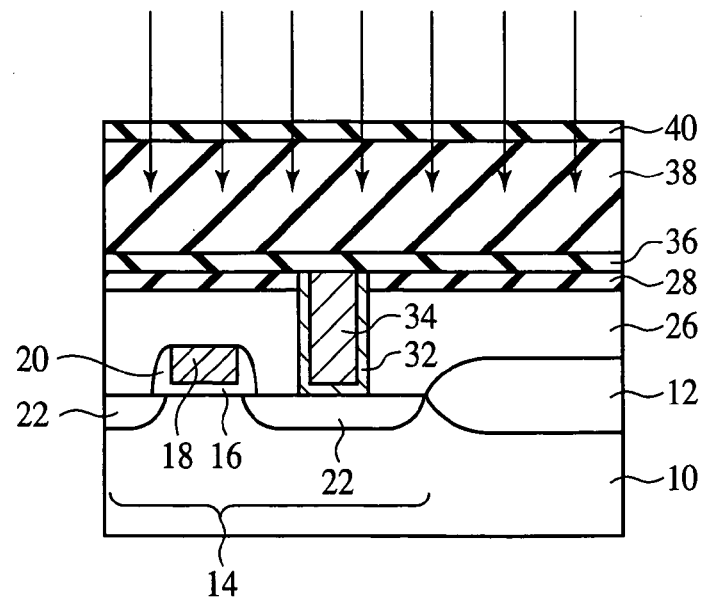

Then, as illustrated in FIG. 2C, with the dense insulation film 40 formed on the porous insulation film 38, electron beams are applied to the porous insulation film 38 through the dense insulation film 40. Electron beams are applied as follows.

First, the semiconductor substrate 10 is loaded in the chamber of a plasma enhanced CVD system.

Then, gas in the chamber is exhausted to place the interior of the chamber in a vacuum state. At this time, to adjust a pressure in the chamber or to modify the quality of the insulation film 40, etc., gas may be fed into the chamber. The gas to be fed into the chamber is, e.g., nitrogen gas, argon gas, helium gas, methane gas, ethane gas or others.

Then, with the dense insulation film 40 being present on the porous inter-layer insulation film 38, electron beams are applied to the inter-layer insulation film 38 through the insulation film 40 (electron beam cure). The electron beams are applied to the porous inter-layer insulation film 38 so as to further advance the cross-linking reaction by applying large energy to the porous inter-layer insulation film 38 and cure the porous inter-layer insulation film 38. As described above, the porous inter-layer insulation film 38 which has been damaged has the moisture absorbency increased and is excessively shrunk, and resultantly the dielectric constant of the porous inter-layer insulation film 38 is increased. In the present embodiment, with the dense insulation film 40 being present on the porous inter-layer insulation film 38, the electron beams are applied to the porous inter-layer insulation film 38 through the insulation film 40.

Figure 17A:
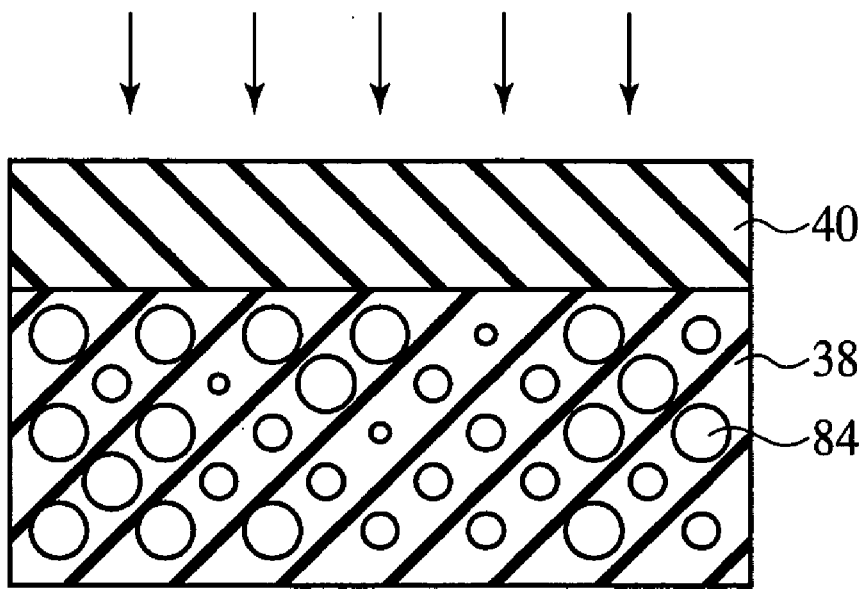
FIGS. 17A and 17B are conceptual views of sizes of the pores in the porous inter-layer insulation film.
Figure 17B:
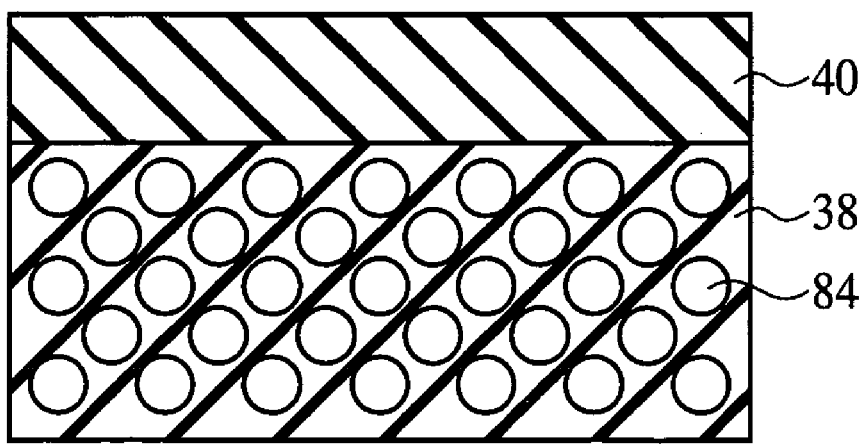

FIG. 17 is conceptual views of the size of the pores in the porous inter-layer insulation film. Before the electron beams are applied to the porous inter-layer insulation film 38, i.e., the cross-linking reaction in the porous inter-layer insulation film 38 is still insufficient, the size of the pores 84 is disuniform to some extent as illustrated in FIG. 17A. The size of the holes 84 is disuniform to some extent before the electron beams are applied to the porous inter-layer insulation film 38 is because the size of the pores 84 in parts of the porous inter-layer insulation film 38, where the cross-linking reaction has not sufficiently advanced has not yet become fully large. The application of the electron beams to the porous inter-layer insulation film 38 further advances the cross-linking in the porous inter-layer insulation film 38, and as the cross-linking reaction advances, water is eliminated from the porous inter-layer insulation film 38. As water is eliminated from the porous inter-layer insulation film 38, the size of the pores 84 in the porous inter-layer insulation film 38 become large. When the electron beams are applied to the porous inter-layer insulation film 38 suitably, the cross-linking reaction in the porous inter-layer insulation film 38 advances sufficiently, size of the pores 84 becomes sufficiently large, and as illustrated in FIG. 17B, the disuniformity of the size of the pores in the porous inter-layer insulation film 38 becomes very small. The very small disuniformity of the size of the pores in the porous inter-layer insulation film 38 makes the dispersion of the parasitic capacitance between the interconnections buried in the porous inter-layer insulation film 38 small and can prevent the exertion of unintended stresses to the porous inter-layer insulation film 38, etc.

In applying the electron beams to the porous inter-layer insulation film 38 through the insulation film 40, it is preferable to apply the electron beams while the thermal processing is being performed. The thermal processing temperature is, e.g., 200-500° C. The application of the electron beams with the thermal processing being performed advances the cure of the porous inter-layer insulation film 38, and the mechanical strength of the porous inter-layer insulation film 38 can be improved.

The thermal processing temperature upon the application of the electron beams is set at 500° C. or below is because there is a risk that when the electron beams are applied while the thermal processing is being conducted at a temperature exceeding 500° C., the porous inter-layer insulation film 38, etc. are much damaged. The thermal processing temperature upon the application of the electron beams is set at 500° C. or below, whereby the porous inter-layer insulation film 38 can be cured while being prevented from being much damaged. The thermal processing temperature upon the application of the electron beams is set at 200° C. or above is because when the thermal processing temperature is set low, it takes much time to cure the porous inter-layer insulation film 38. The thermal processing temperature upon the application of the porous inter-layer insulation film is set at 200° C. or above, whereby the porous inter-layer insulation film 38 can be cured in a short period of time.

The thermal processing temperature for the application of the electron beams is not limited to 200-500° C. The porous inter-layer insulation film 38 can be cured even by the thermal processing of below 200° C. with the electron beams being applied. However, to cure the porous inter-layer insulation film in a short period of time, it is preferable to set the thermal processing temperature upon the application of the electron beams is set at 200° C. or above.

To prevent the porous inter-layer insulation film 38 from being damaged, it is preferable that the thermal processing is not made when the electron beams are applied, intentionally. On the other hand, the porous inter-layer insulation film 38 can be cured by applying the electron beams without the thermal processing, i.e., heating the substrate, and the porous inter-layer insulation film 38 can have some mechanical strength. Accordingly, the porous inter-layer insulation film 38 may be cured by the application of the electron beams thereto without heating the substrate.

The acceleration voltage for applying the electron beams is, e.g., 10-20 keV. When the acceleration voltage is below 10 keV, it takes long time for the porous inter-layer insulation film 38 to be cured. On the other hand, when the acceleration voltage is above 20 keV, the porous inter-layer insulation film 38 is much damaged, and then the porous inter-layer insulation film 38 has the moisture absorbency increased or is shrunk. Resultantly, the dielectric constant of the porous inter-layer insulation film 38 may be increased. Thus, it is preferable that the acceleration voltage for the applying the electron beams is about 10-20 keV.

The acceleration voltage for applying the electron beams is not limited to 10-20 keV. The acceleration voltage may be set at below 10 keV when the cure of the porous inter-layer insulation film 38 may take sometime. Even with the acceleration voltage being relatively low, the electron beams can be sufficiently introduce into the porous inter-layer insulation film 38 by making the film thickness of the dense insulation film 40 on the porous inter-layer insulation film 38 somewhat small. Even when the acceleration voltage is above 20 keV, the period of time of applying the electron beams is set shorter, whereby the porous inter-layer insulation film 38 can be kept from being much damaged. Accordingly, even when the acceleration voltage is above 20 keV, the period of time applying the electron beams is set short, whereby the moisture absorbency increase of the porous inter-layer insulation film 38 and the shrinkage of the porous inter-layer insulation film 38 can be prevented. Even when the acceleration voltage is relatively high, the porous inter-layer insulation film 38 can be kept from being much damaged by forming somewhat thick the dense insulation film 40 on the porous inter-layer insulation film 38. Thus, the film thickness of the dense insulation film 40 on the porous inter-layer insulation film 38 is set somewhat thick, whereby even when the acceleration voltage is relatively high, the moisture absorbency increase of the porous inter-layer insulation film 38 can be prevented, and the shrinkage of the porous inter-layer insulation film 38 can be prevented.

Thus, the porous inter-layer insulation film 38 of low dielectric constant and high mechanical strength is formed.

Electron beams are applied to the porous inter-layer insulation film 38 through the dense insulation film 40 here. However, as described below, UV rays maybe applied to the porous inter-layer insulation film 38 through the dense insulation film 40.

First, the semiconductor substrate 10 is loaded into the chamber with an UV lamp provided. The UV lamp is, e.g., a high-pressure mercury lamp. The UV lamp is not limited to the high-pressure mercury lamp, and any other UV lamp, such as a xenon excimer lamp, a low-pressure mercury lamp, etc., may be used.

Then, gas in the chamber is exhausted to place the interior of the chamber in a vacuum state. At this time, to adjust a pressure in the chamber or to modify the quality of the insulation film 40, etc., gas may be fed into the chamber. The gas to be fed into the chamber is, e.g., nitrogen gas, an inert gas or others. The inert gas is, e.g., argon gas.

Next, with the dense insulation film 40 being present on the porous inter-layer insulation film 38, UV rays are applied to the inter-layer insulation film 38 through the insulation film 40 (UV ray cure). The application of the UV rays to the porous inter-layer insulation film 38 also exerts large energy to the porous inter-layer insulation film 38 and advances the cross-linking reaction in the porous inter-layer insulation film 38, and the porous inter-layer insulation film 38 can be cured. When the UV rays are simply applied to the porous inter-layer insulation film 38, the porous inter-layer insulation film 38 is much damaged. Then, the inter-layer insulation film 38 has the moisture absorbency increased and is shrunk, and resultantly the dielectric constant of the porous inter-layer insulation film 38 is often increased. In order to be kept from the porous inter-layer insulation film 38 from being much damaged, the UV rays are applied to the inter-layer insulation film 38 through the insulation film 40 with the dense insulation film 40 being present on the porous inter-layer insulation film 38.

Before the UV rays are applied to the porous inter-layer insulation film 38, i.e., the cross-linking reaction in the porous inter-layer insulation film 38 is still insufficient, the size of the pores 84 is disuniform to some extent as described above with reference to FIG. 17A. The size of the holes 84 is disuniform to some extent before the UV rays are applied to the porous inter-layer insulation film 38 is because the size of the pores 84 in parts of the porous inter-layer insulation film 38, where the cross-linking reaction has not sufficiently advanced has not yet become fully large. The application of the UV rays to the porous inter-layer insulation film 38 further advances the cross-linking in the porous inter-layer insulation film 38, and as the cross-linking reaction advances, water is eliminated from the porous inter-layer insulation film 38. As water is eliminated from the porous inter-layer insulation film 38, the size of the pores 84 in the porous inter-layer insulation film 38 become large. When the electron beams are applied to the porous inter-layer insulation film 38 suitably, the cross-linking reaction in the porous inter-layer insulation film 38 advances sufficiently, size of the pores 84 becomes sufficiently large, and as illustrated in FIG. 17B, the disuniformity of the size of the pores in the porous inter-layer insulation film 38 becomes very small. The very small disuniformity of the size of the pores in the porous inter-layer insulation film 38 makes the scattering of the parasitic capacitance between the interconnections buried in the porous inter-layer insulation film 38 small and can prevent the exertion of unintended stresses to the porous inter-layer insulation film 38, etc.

The damage due to the UV rays will be suppressed by setting the application period of time, etc. of the UV rays small without forming the dense insulation film 40 on the porous inter-layer insulation film 38. However, when the UV rays are applied with the surface of the porous inter-layer insulation film 38 exposed, a trace of oxygen present in the chamber changes to ozone. Then, the hydrophobic organic groups in the surface of the porous inter-layer insulation film 38 are oxidized and decomposed, and the porous inter-later insulation film 38 easily absorbs moisture. The porous inter-layer insulation film 38 absorbs moisture and then has the dielectric constant increased. Thus, it is very difficult to form the inter-layer insulation film 38 of good quality by setting the application period of time, etc. of the UV rays without forming the dense insulation film 40 on the porous inter-layer insulation film 38.

When the UV rays are applied to the porous inter-layer insulation film 38 through the insulation film 40, it is preferable to apply the UV rays while thermal processing is being performed. The temperature of the thermal processing is, e.g., 200-500° C. The application of the UV rays with the thermal processing being performed advances the cure of the porous inter-layer insulation film 38, and the mechanical strength of the inter-layer insulation film 38 can be improved.

The thermal processing temperature upon the application of the UV rays is set at 500° C. or below is because there is a risk that when the UV rays are applied while the thermal processing is being conducted at a temperature exceeding 500° C., the porous inter-layer insulation film 38, etc. are much damaged. The thermal processing temperature upon the application of the UV rays is set at 500° C. or below, whereby the porous inter-layer insulation film 38 can be cured while being prevented from being much damaged. The thermal processing temperature upon the application of the UV rays is set at 200° C. or above is because when the thermal processing temperature is set low, it takes much time to cure the porous inter-layer insulation film 38. The thermal processing temperature upon the application of the UV rays is set at 200° C. or above, whereby the porous inter-layer insulation film 38 can be cured in a short period of time.

The thermal processing temperature for the application of the UV rays is not limited to 200-500° C. The porous inter-layer insulation film 38 can be cured even by the thermal processing of below 200° C. with the UV rays being applied. However, to cure the porous inter-layer insulation film 38 in a short period of time, it is preferable to set the thermal processing temperature upon the application of the UV rays is set at 200° C. or above.

The porous inter-layer insulation film 38 can be cured by applying the UV rays without the thermal processing, i.e., heating the substrate, and the porous inter-layer insulation film 38 can have some mechanical strength. On the other hand, to prevent the porous inter-layer insulation film 38 from being damaged, it is preferable that the thermal processing is not made when the UV rays are applied, intentionally. Accordingly, the porous inter-layer insulation film 38 may be cured by the application of the UV rays thereto without the thermal processing, i.e., heating the substrate.

As described above, the UV rays may be applied to the porous inter-layer insulation film 38 through the dense insulation film 40.

The UV rays are applied in a vacuum here. However, the pressure for applying the UV rays is not limited to the vacuum. The UV rays may be applied under the atmospheric pressure.

In the above, electron beams and UV rays are applied to the porous inter-layer insulation film 38 through the dense insulation film 40. However, as described below, plasmas may be applied to the porous inter-layer insulation film 38 through the dense insulation film 40.

First, the semiconductor substrate 10 is loaded into the chamber of a plasma enhanced CVD system. The plasma enhanced CVD system is, e.g., a diode parallel plate plasma enhanced CVD system, a high density plasma enhanced CVD system or others. The reactive gas for generating plasmas is oxygen gas, hydrogen gas, nitrogen gas, argon gas, ammonia, helium gas, carbon dioxide or others. Preferably, oxygen gas or hydrogen gas is used as the reactive gas.

Next, with the dense insulation film 40 being present on the porous inter-layer insulation film 38, plasmas are applied to the inter-layer insulation film 38 through the insulation film 40 (plasma cure). The application of the plasmas to the porous inter-layer insulation film 38 as well, large energy is applied to the porous inter-layer insulation film 38 and advances the cross-linking reaction in the porous inter-layer insulation film 38, and the porous inter-layer insulation film 38 can be cured. When the plasmas are simply applied to the porous inter-layer insulation film 38, the porous inter-layer insulation film 38 is much damaged. Then, the inter-layer insulation film 38 has the moisture absorbency increased and is shrunk, and resultantly the dielectric constant of the porous inter-layer insulation film 38 is often increased. In order to be kept from the porous inter-layer insulation film 38 from being much damaged, the plasma are applied to the inter-layer insulation film 38 through the insulation film 40 with the dense insulation film 40 being present on the porous inter-layer insulation film 38.

Before the plasmas are applied to the porous inter-layer insulation film 38, i.e., the cross-linking reaction in the porous inter-layer insulation film 38 is still insufficient, the size of the pores 84 is disuniform to some extent as described above with reference to FIG. 17A. The size of the holes 84 is disuniform to some extent before the plasmas are applied to the porous inter-layer insulation film 38 is because the size of the pores 84 in parts of the porous inter-layer insulation film 38, where the cross-linking reaction has not sufficiently advanced has not yet become fully large. The application of the plasmas to the porous inter-layer insulation film 38 further advances the cross-linking in the porous inter-layer insulation film 38, and as the cross-linking reaction advances, water is eliminated from the porous inter-layer insulation film 38. As water is eliminated from the porous inter-layer insulation film 38, the size of the pores in the porous inter-layer insulation film 38 become large. When the electron beams are applied to the porous inter-layer insulation film 38 suitably, the cross-linking reaction in the porous inter-layer insulation film 38 advances sufficiently, size of the pores 84 becomes sufficiently large, and as illustrated in FIG. 17B, the disuniformity of the size of the pores in the porous inter-layer insulation film 38 becomes very small. The very small disuniformity of the size of the pores in the porous inter-layer insulation film 38 makes the scattering of the parasitic capacitance between the interconnections buried in the porous inter-layer insulation film 38 small and can prevent the exertion of unintended stresses to the porous inter-layer insulation film 38, etc.

The damage will be suppressed by setting low the power of the plasmas without forming the dense insulation film 40 on the porous inter-layer insulation film 38. However, with the power set low, it is difficult to apply the plasmas stably and homogeneously. The plasmas activate the surface of the porous inter-layer insulation film 38, and when the semiconductor substrate 10 is loaded out of the chamber, the surface of the porous inter-layer insulation film 38 reacts with the moisture in the air. Then, the dielectric constant of the porous inter-layer insulation film 38 is increased. Thus, it is very difficult to form the inter-layer insulation film 38 of good quality by setting low the power of the plasmas without forming the dense insulation film 40 on the porous inter-layer insulation film 38.

The application energy of the plasmas upon the application of the plasmas, i.e., the incidence energy of the plasmas incident on the insulation film 40 is preferably 1-100 eV. The application energy of the plasmas is set at 1-100 eV for the following reason.

When the application energy of the plasmas is set at below 1 eV, the cross-linking reaction in the inter-layer insulation film 38 does not much advance. Then, the size of the pores in the porous inter-layer insulation film 38 remains disuniform as illustrated in FIG. 17A.

Figure 18:
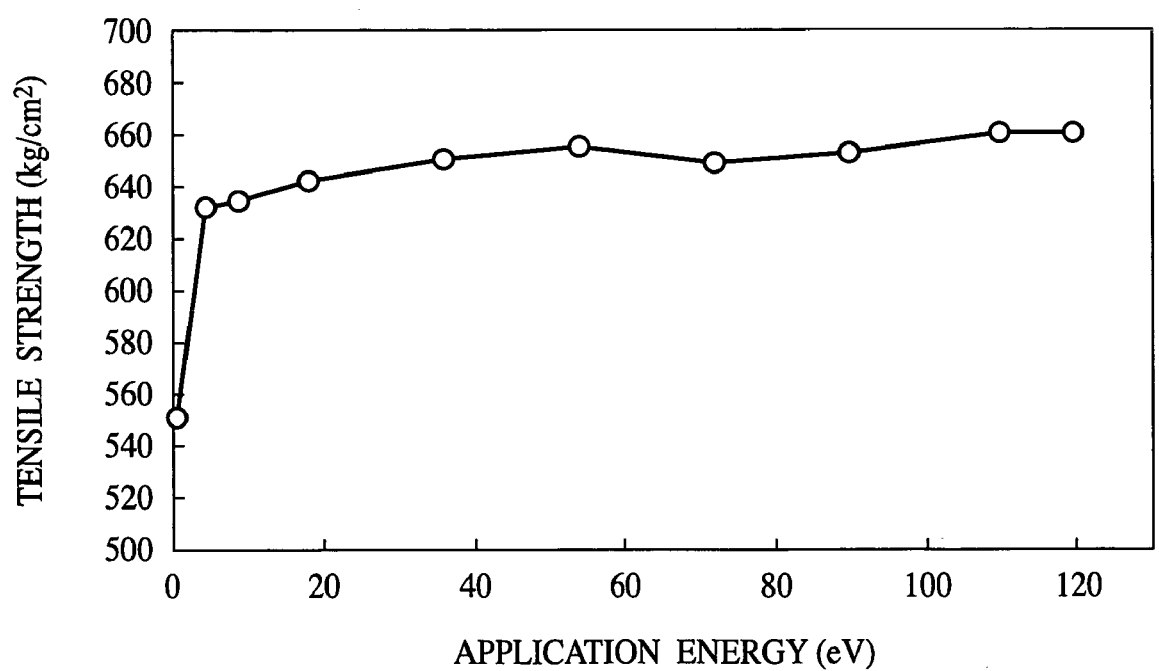
FIG. 18 is a graph of relationships between the application energy of the plasmas and the tensile strength of the porous inter-layer insulation film with respect to the base.

FIG. 18 is a graph of relationships between the application energy of the plasmas and the tensile strength of the porous inter-layer insulation film with respect to the base. The application energy of the plasmas is taken on the horizontal axis, and on the vertical axis, the tensile strength of the porous inter-layer insulation film with respect to the base is taken. As seen in FIG. 18, when the application energy of the plasmas is below 1 eV, the tensile strength of the porous inter-layer insulation film 38 with respect to the base is not sufficient. With the application energy of the plasmas set at below 1 eV, the tensile strength of the porous inter-layer insulation film 38 with respect to the base cannot be sufficient because the porous inter-layer insulation film 38 could not be sufficiently cured.

Figure 19:
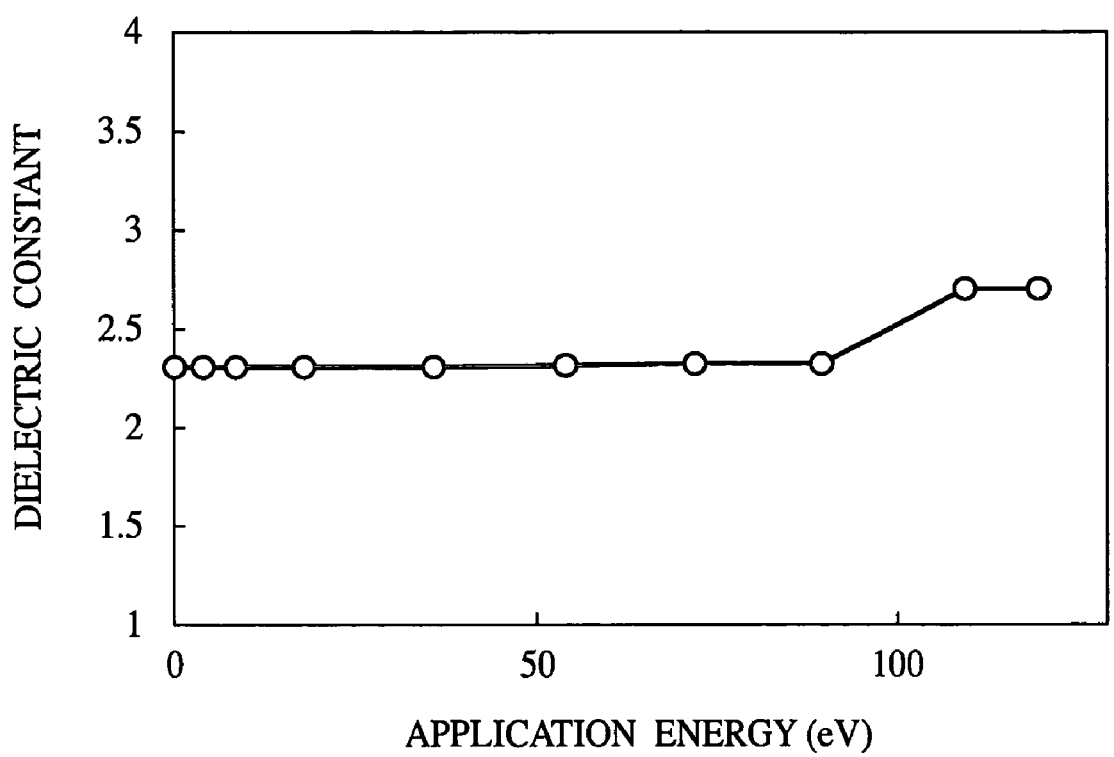
FIG. 19 is a graph of relationships between the application energy of the plasmas and the dielectric constant of the porous inter-layer insulation film.

FIG. 19 is a graph of relationships between the application energy of the plasmas and the dielectric constant of the porous inter-layer insulation film. The application energy of the plasmas is taken on the horizontal axis, and on the vertical axis, the dielectric constant of the porous inter-layer insulation film is taken. As seen in FIG. 18, when the application energy of the plasmas is above 10 eV, the dielectric constant of the porous inter-layer insulation film 38 becomes high. With the application energy of the plasmas set above 100 eV, the dielectric constant of the porous inter-layer insulation film 38 becomes high because when the application energy of the plasmas is too high, the porous inter-layer insulation film 38 will be excessively shrunk.

For this reason, the application energy of the plasmas upon the application of the plasmas is preferably set at 1-100 eV.

When the plasmas are applied to the porous inter-layer insulation film 38 through the insulation film 40, it is preferable to apply the plasmas with thermal processing being performed. The temperature of the thermal processing is, e.g., 200-500° C. The application of the plasmas with the thermal processing being performed advances the cure of the porous inter-layer insulation film 38, and the mechanical strength of the porous inter-layer insulation film 38 can be improved.

The thermal processing temperature upon the application of the plasmas is set at 500° C. or below is because there is a risk that when the plasmas are applied while the thermal processing is being conducted at a temperature exceeding 500° C., the porous inter-layer insulation film 38, etc. are much damaged. The thermal processing temperature upon the application of the plasmas is set at 500° C. or below, whereby the porous inter-layer insulation film 38 can be cured while being prevented from being much damaged. The thermal processing temperature upon the application of the plasmas is set at 200° C. or above is because when the thermal processing temperature is set low, it takes much time to cure the porous inter-layer insulation film 38. The thermal processing temperature upon the application of the plasmas is set at 200° C. or above, whereby the porous inter-layer insulation film 38 can be cured in a short period of time.

The thermal processing temperature for the application of the plasmas is not limited to 200-500° C. The porous inter-layer insulation film 38 can be cured even by the thermal processing of below 200° C. with the plasmas being applied. However, to cure the porous inter-layer insulation film 38 in a short period of time, it is preferable to set the thermal processing temperature upon the application of the plasmas is set at 200° C. or above.

The porous inter-layer insulation film 38 can be cured by applying the plasmas without the thermal processing, i.e., heating the substrate, and the porous inter-layer insulation film 38 can have some mechanical strength. On the other hand, to prevent the porous inter-layer insulation film 38 from being damaged, it is preferable that the thermal processing is not made when the plasmas are applied, intentionally. Accordingly, the porous inter-layer insulation film 38 may be cured by the application of the plasmas thereto without the thermal processing, i.e., heating the substrate.

The plasmas may be thus applied to the porous inter-layer insulation film 38 through the dense insulation film 40.

Next, a photoresist film 42 is formed on the entire surface by, e.g., spin coating.

Figure 3A:
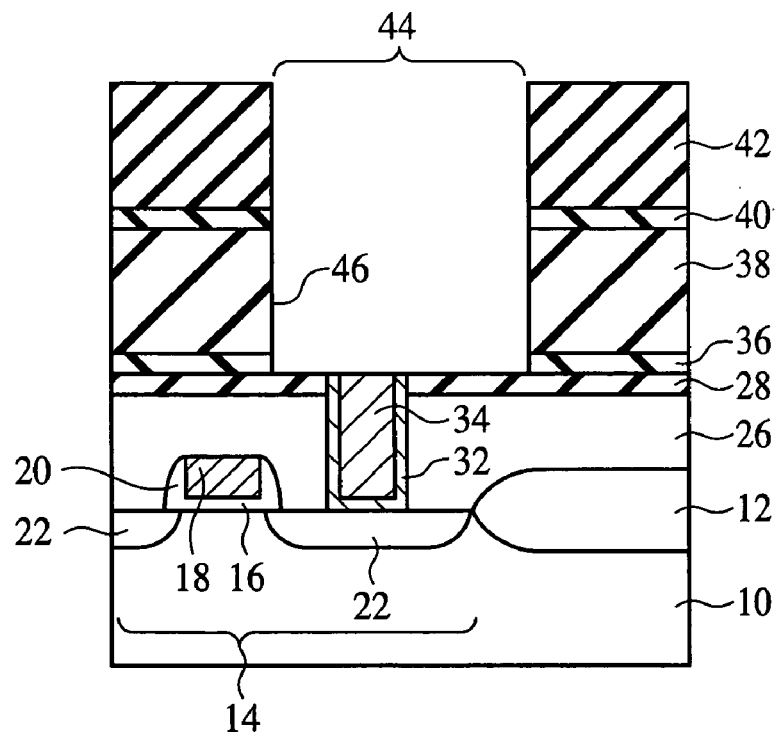
FIGS. 3A and 3B are sectional views of the semiconductor device in the steps of the semiconductor device fabrication method according to the embodiment of the present invention, which illustrate the method (Part 3).

Next, an opening 44 is formed in the photoresist film 42 by photolithography (see FIG. 3A). The opening 44 is for forming an interconnection (a first metal interconnection layer) 50 which is the first layer. The opening 44 is formed in the photoresist film 42 so that, for example, the interconnection width is 100 nm, and the interconnection pitch is 100 nm.

Next, with the photoresist film 42 as the mask, the interconnection film 40, the inter-layer insulation film 38 and the insulation film 36 are etched. The etching is performed with fluorine plasmas using $CF_4$ gas and $CHF_3$ gas as the raw material. At this time, the stopper film 38 functions as the etching stopper. A trench 46 for burying the interconnection is thus formed in the insulation film 40, the inter-layer insulation film 38 and the insulation film 36. The upper surface of the conductor plug 34 is exposed in the trench 46. Then, the photoresist film 42 is released.

Next, a barrier film (not illustrated) of a 10 nm-thickness TaN film is formed on the entire surface by, e.g., sputtering. The barrier film is for preventing the Cu in the interconnection which will be described later into the insulation film which will be described later. Then, a seed film (not illustrated) of a 10 nm Cu film is formed on the entire surface by, e.g., sputtering. The seed film functions as the electrode in forming interconnections of the Cu by electroplating. Thus, a layer film 48 of the barrier film and the seed film is formed.

Next, a 600 nm-thickness Cu film 50 is formed by, e.g., electroplating.

Next, the Cu film 50 and the layer film 46 are polished by CMP until the surface of the insulation film is exposed. Thus, the interconnection 50 of the Cu is buried in the trench. Such processing of forming the interconnection 50 is called single damascene.

Then, an insulation film 52 of a 30 nm-thickness SiC:O:H film is formed on the entire surface by, e.g., plasma enhanced CVD. The insulation film 52 functions as the barrier film for preventing the diffusion of moisture. The insulation film 52 prevents the arrival of moisture to the porous inter-layer insulation film 38. The insulation film 52 of the SiC:O:H film can be formed as exemplified below.

First, the semiconductor substrate 10 is loaded into the chamber of a plasma enhanced CVD system. The plasma enhanced CVD system is, e.g., a diode parallel plate plasma enhanced CVD.

Next, the substrate temperature is set at, e.g., 400° C.

Next, trimethylsilane is vaporized by a vaporizer to generate the reactive gas. The reactive gas is fed on a carrier gas into the chamber. At this time, high frequency power is applied between the plate electrodes, and plasmas of the reactive gas are generated. At this time, the deposition rate is set relatively low, whereby the insulation film 40 can be formed dense. Specifically, conditions for the deposition are set as exemplified below, whereby the dense insulation film 40 can be formed. The supply amount of the reactive gas is, e.g., 1 mg/min. The carrier gas is, e.g., $CO_2$. The flow rate of the carrier gas is, e.g., 100 sccm. The high frequency power to be applied between the plate electrodes is, e.g., 13.56 MHz (200 W) and 100 kHz (200 W). The period of time of applying the high frequency power between the plate electrodes to generate plasmas is, e.g., 5 seconds.

Figure 3B:
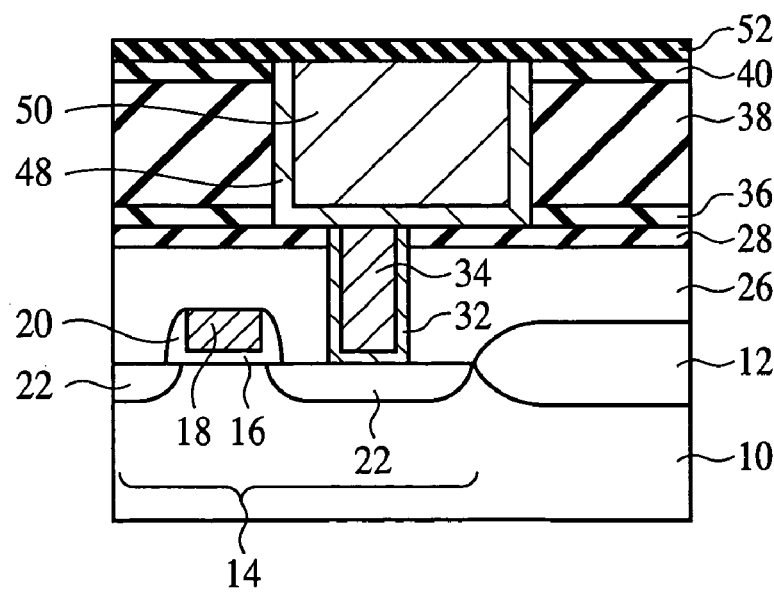

Thus, the insulation film 52 functioning as the barrier film is formed (see FIG. 3B).

Figure 4A:
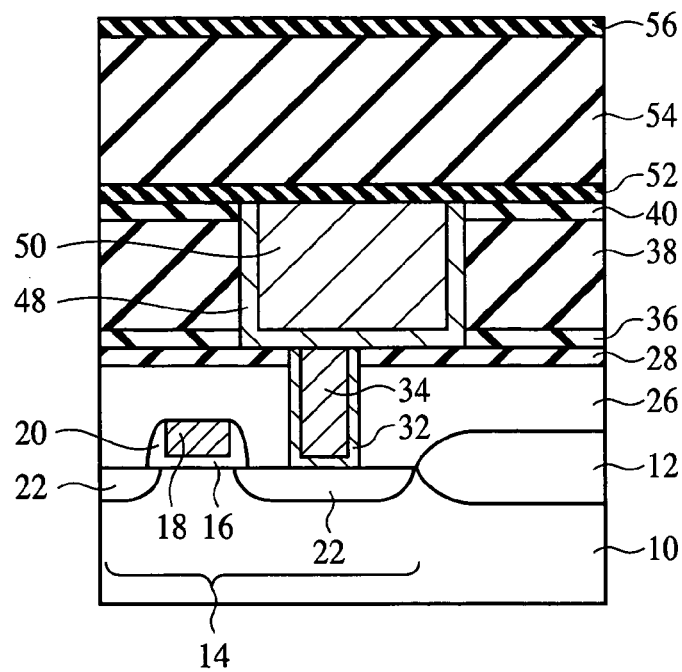
FIGS. 4A and 4B are sectional views of the semiconductor device in the steps of the semiconductor device fabrication method according to the embodiment of the present invention, which illustrate the method (Part 4).

Next, as illustrated in FIG. 4A, a porous inter-layer insulation film 54 is formed. The method of forming the porous inter-layer insulation film 54 is the same as the above-described method of forming, e.g., the porous inter-layer insulation film 38. The film thickness of the porous inter-layer insulation film 54 is, e.g., 180 nm.

Next, a dense insulation film 56 is formed on the entire surface of the porous inter-layer insulation film 54. The method of forming the dense insulation film 56 is the same as the above-described method of forming, e.g., the dense insulation film 40. A material of the dens insulation film 56 is, e.g., SiC:O:H film. The film thickness of the insulation film 56 is, e.g., 30 nm.

Figure 4B:
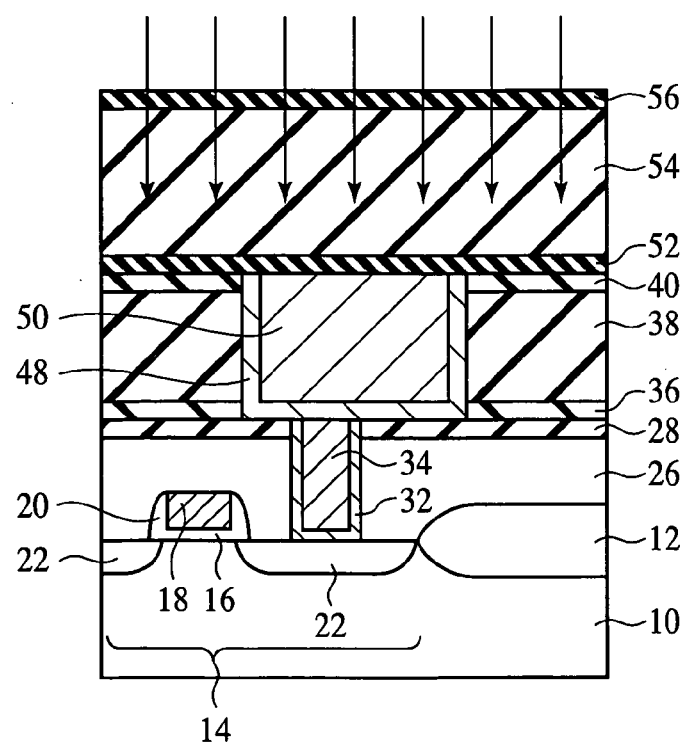

Then, as illustrated in FIG. 4B, with the dense insulation film 56 formed on the porous inter-layer insulation film 54, electron beams are applied to the inter-layer insulation film 54 through the insulation film 56. Conditions for applying the electron beams to the inter-layer insulation film 54 through the insulation film 56 are the same as the above-described conditions for applying electron beams to, e.g., the inter-layer insulation film 38 through the insulation film 40.

UV rays may be applied to the inter-layer insulation film 54 through the insulation film 56. Conditions for applying UV rays to the inter-layer insulation film 54 through the insulation film 56 are the same as the above-describe conditions for applying UV rays to, e.g., the inter-layer insulation film 38 through the insulation film 40.

Plasmas may be applied to the inter-layer insulation film 54 through the insulation film 56. Conditions for applying plasmas to the inter-layer insulation film 54 through the insulation film 56 are the same as the above-described conditions for applying plasmas to, e.g., the inter-layer insulation film 38 through the insulation film 40.

Thus, the porous inter-layer insulation film 54 of low dielectric constant and high mechanical strength is formed.

Figure 5A:
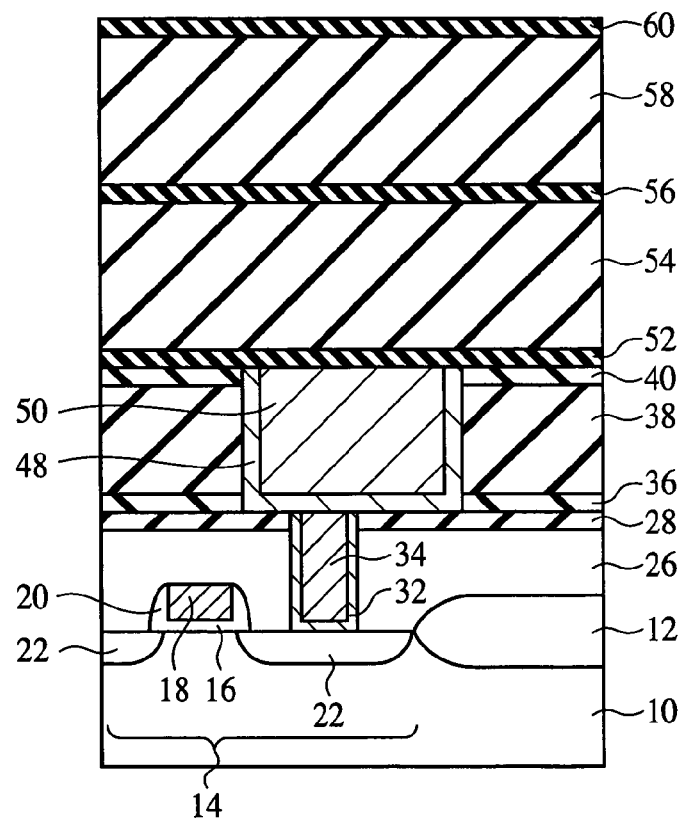
FIGS. 5A and 5B are sectional views of the semiconductor device in the steps of the semiconductor device fabrication method according to the embodiment of the present invention, which illustrate the method (Part 5).

Next, as illustrated in FIG. 5A, the porous inter-layer insulation film 58 is formed. The method of forming the porous inter-layer insulation film 58 is the same as the above-described method of forming, e.g., the porous inter-layer insulation film 38. The film thickness of the inter-layer insulation film 58 is, e.g., 160 nm.

Next, a dense insulation film 60 is formed on the entire surface of the porous inter-layer insulation film 58. The method of forming of the dense insulation film 60 is the same the above-described method of forming, e.g., the insulation film 40. A material of the dense insulation film 60 is, e.g., SiC:O:H film. The film thickness of the insulation film 60 is, e.g., 30 nm.

Figure 5B:
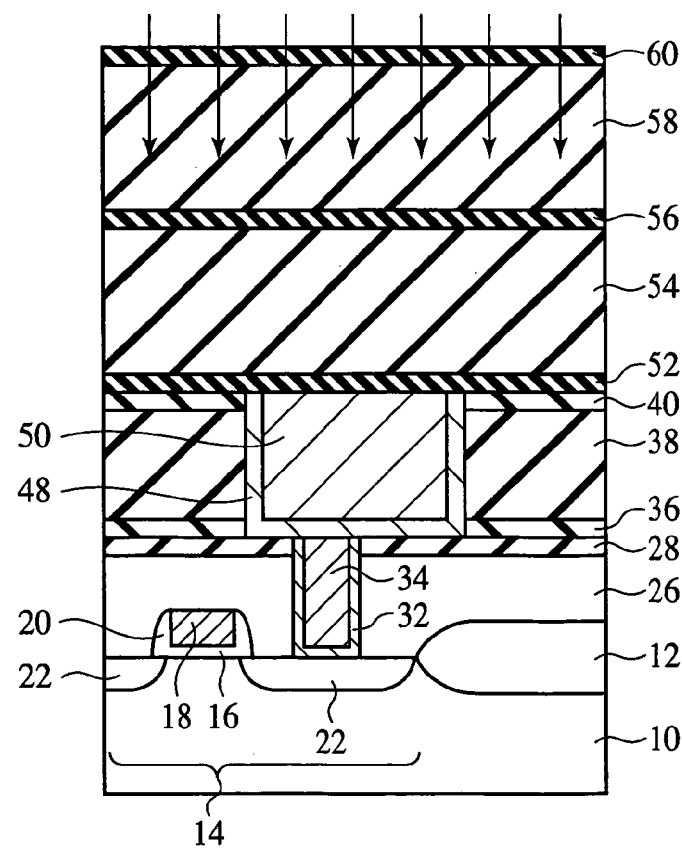

Then, as illustrated in FIG. 5B, with the dense insulation film 60 being present on the porous inter-layer insulation film 58, electron beams are applied to the inter-layer insulation film 58 through the insulation film 60. Conditions for applying the electron beams to the inter-layer insulation film 58 through the insulation film 60 are the same as the above-described conditions for applying electron beams to, e.g., the inter-layer insulation film 38 through the insulation film 40.

UV rays maybe applied to the inter-layer insulation film 58 through the insulation film 60. Conditions for applying the UV rays to the inter-layer insulation film 58 through the insulation film 60 are the same as the above-described conditions for applying UV rays to, e.g., the inter-layer insulation film 38 through the insulation film 40.

Plasmas may be applied to the inter-layer insulation film 58 through an insulation film 60. Conditions for applying the plasmas to the inter-layer insulation film 58 through the insulation film 60 are the same as the above-described conditions for applying plasmas to, e.g., the inter-layer insulation film 38 through the insulation film 40.

Thus, the porous inter-layer insulation film 58 of low dielectric constant and high mechanical strength is formed.

Next, a photoresist film 62 is formed on the entire surface by, e.g., spin coating.

Figure 6:
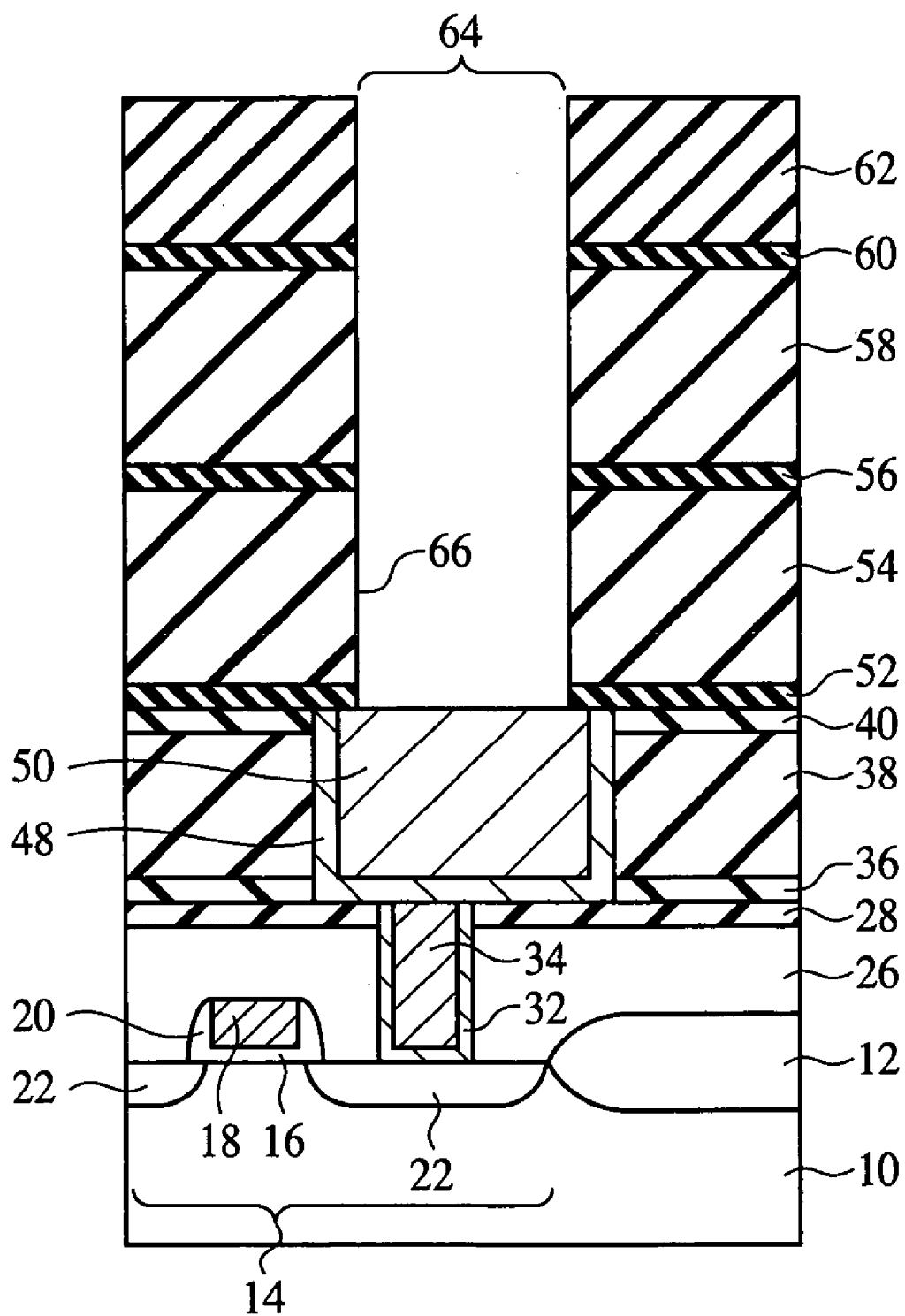
FIG. 6 is a sectional view of the semiconductor device in the step of the semiconductor device fabrication method according to the embodiment of the present invention, which illustrates the method (Part 6).

Next, as illustrated in FIG. 6, an opening 64 is formed in the photoresist film 62 by photolithography. The opening 64 is for forming a contact hole 66 down to the interconnection 50.

Then, with the photoresist film 62 as the mask, the insulation film 60, the inter-layer insulation film 58, the insulation film 56, the inter-layer insulation film 54 and the insulation film 52 are etched. Etching is performed by fluorine plasmas using $CF_4$ gas and $CHF_3$ gas as the raw material. The composition ratio of the etching gas, the pressure in the etching, etc. are suitable changed, whereby the insulation film 60, the inter-layer insulation film 58, the insulation film 56, the inter-layer insulation film 54 and the insulation film 52 can be etched. Thus, the contact hole 66 is formed down to the interconnection 50. Then, the photoresist film 62 is released.

Next, a photoresist film 68 is formed on the entire surface by, e.g., spin coating.

Figure 7:
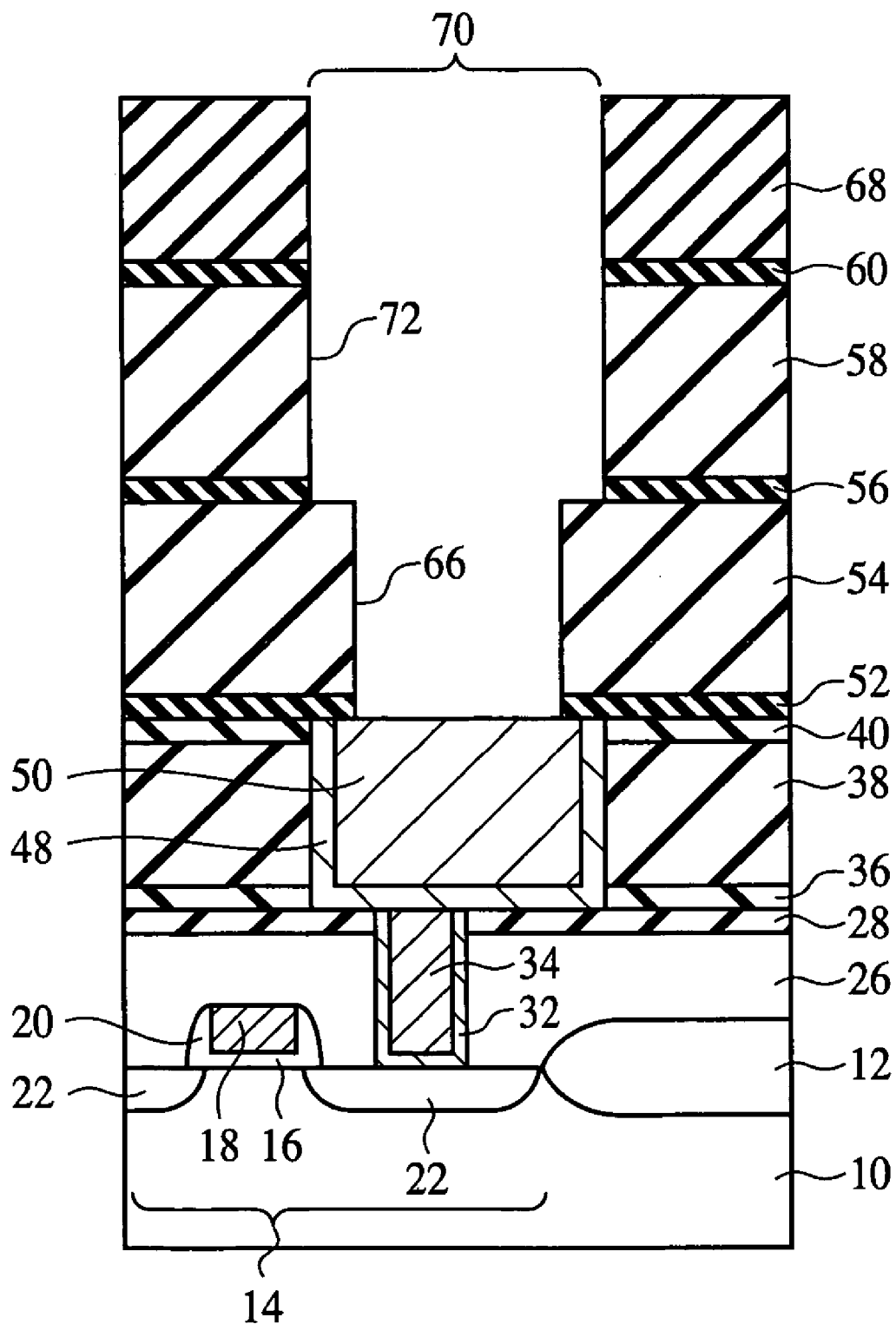
FIG. 7 is a sectional view of the semiconductor device in the step of the semiconductor device fabrication method according to the embodiment of the present invention, which illustrates the method (Part 7).
Figure 8:
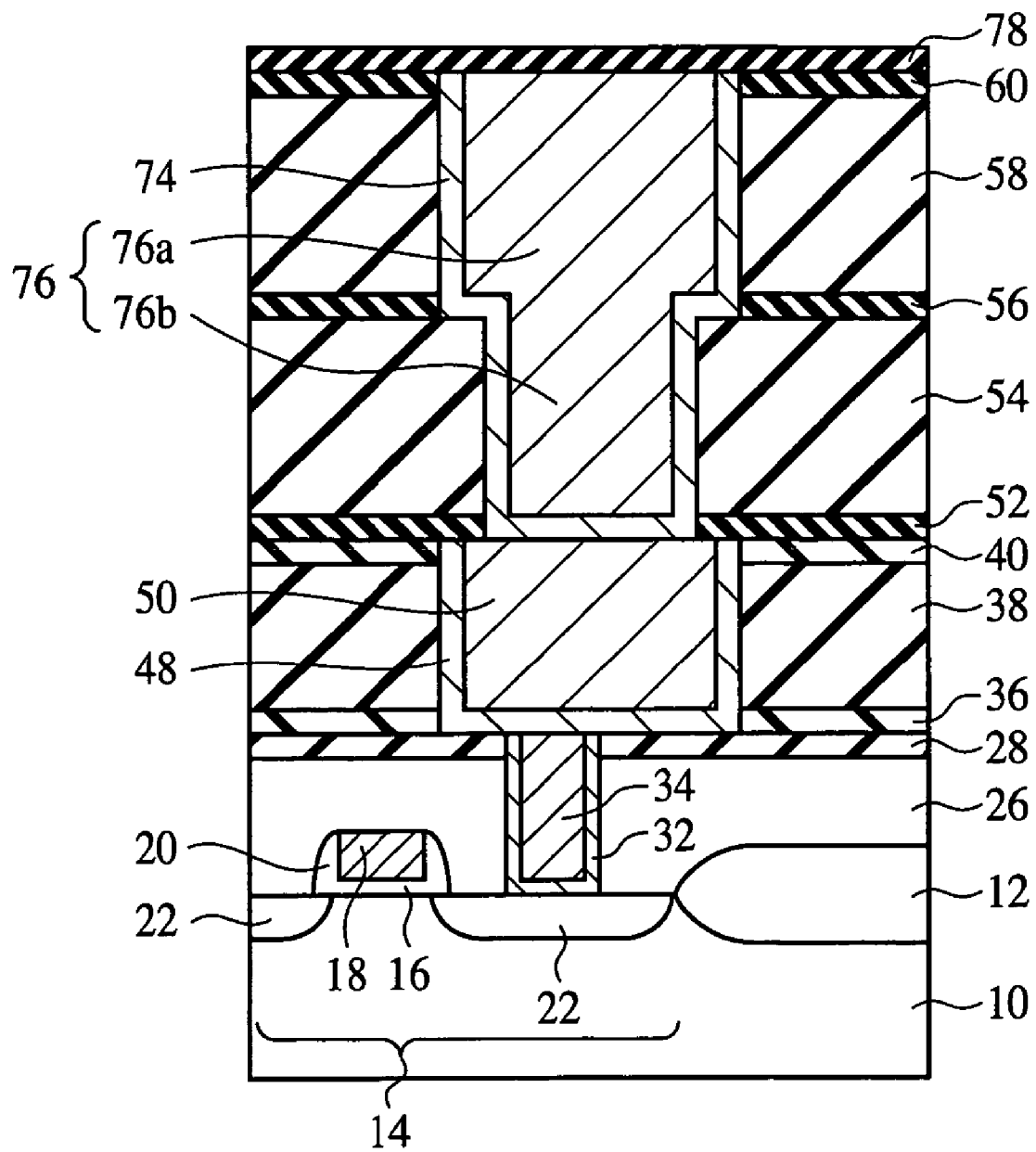
FIG. 8 is a sectional view of the semiconductor device in the step of the semiconductor device fabrication method according to the embodiment of the present invention, which illustrates the method (Part 8).

Then, as illustrated in FIG. 7, an opening 70 is formed in the photoresist film 68 by photolithography. The opening 70 is for forming an interconnection (a second metal interconnection layer) 76*a* which is the second layer.

Then, with the photoresist film 68 as the mask, the insulation film 60, the inter-layer insulation 58 and the insulation film 56 are etched. The etching uses fluorine plasmas using $CF_4$ gas and $CHF_3$ gas as the raw material. Thus, the trench 72 for the interconnection 76*a* to be buried in is formed in the insulation film 60, the inter-layer insulation film 58 and the insulation film 56. The trench 72 is continuous to the contact hole 66.

Next, a barrier film (not illustrated) of a 10 nm-thickness TaN film is formed on the entire surface by, e.g., sputtering. The barrier film is for preventing the diffusion of the Cu in the interconnection 76*a* and the conductor plug 76*b* which will be described later. Then, a seed film (not illustrated) of a 10 nm-thickness Cu film is formed on the entire surface by, e.g., sputtering. The seed film functions as the electrode in forming the interconnection layer 76*a* and the conductor plug 76*b* of the Cu by electroplating. Thus, a layer film 74 of the barrier film and the seed film is formed.

Next, a 1400 nm-thickness Cu film 76 is formed by, e.g., electroplating.

Then, the Cu film 76 and the layer film 74 are polished by CMP until the surface of the insulation film 60 is exposed. Thus, the conductor plug 76*b* of the Cu is buried in the contact hole 66, and the interconnection 76*a* of the Cu is buried in the trench 72. The conductor plug 76*b* and the interconnection 76*a* are formed in one piece. The method for thus forming the conductor plug 76*b* and the interconnection 76*a* in a lump is called dual damascene.

Next, an insulation film 78 of a 30 nm-thickness SiC:O:H film is formed on the entire surface by, e.g., plasma enhanced CVD. The method of forming the insulation film 78 is the same as the above-described method of forming the insulation film 78. The insulation film 78 functions as the barrier film for preventing the diffusion of moisture.

Hereafter, the above-described steps are suitably repeated to form an interconnection (a third metal interconnection layer) not illustrated which is the third layer is formed.

Thus, a semiconductor device is fabricated by the semiconductor device fabrication method according to the present embodiment.

As described above, according to the present embodiment, after the porous inter-layer insulation films 38, 54, 58 have been formed, the dense insulation films 40, 56, 60 are formed on the porous inter-layer insulation films 38, 54, 58, and electron beams, UV rays or plasmas are applied to the porous inter-layer insulation films 38, 54, 58 through the dense insulation films 40, 56, 60. According to the present embodiment, the porous inter-layer insulation films 38, 54, 58 are cured by using electron beams, etc., whereby the porous inter-layer insulation films 38, 54, 58 can have very high mechanical strength. According to the present embodiment, the inter-layer insulation films 38, 54, 58 are kept from cracking and are kept from being broken in bonding, etc. Furthermore, according to the present embodiment, electron beams, etc. are applied through the dense insulation films 40, 56, 60, whereby the porous inter-layer insulation films 38, 54, 58 are kept form being damaged. Thus, according to the present embodiment, the moisture absorbency increase of the porous inter-layer insulation films 38, 54, 58 can be prevented, and the density increase of the porous inter-layer insulation film 38, 54, 58 can be prevented. Thus, according to the present embodiment, the dielectric constant increase of the porous inter-layer insulation films 38, 54, 58 can be prevented. According to the present embodiment, the inter-layer insulation films 38, 54, 58 of low dielectric constant and high mechanical strength can be formed. According to the present embodiment, the inter-layer insulation films 38, 54, 58 of low dielectric constant and high mechanical strength can be formed, whereby semiconductor devices of high operation speed and high reliability can be provided.

Modified Embodiments

The present invention is not limited to the above-described embodiment and can cover other various modifications.

For example, the method of forming the porous inter-layer insulation films is not limited to the above. The porous inter-layer insulation films may be formed by any other forming method. The materials of the porous inter-layer insulation films are not limited to the above.

The method of forming the dense insulation films is not limited to the above. The dense insulation films may be formed by any other forming method. The materials of the dense insulation films are not limited to the above.

EXAMPLES

Examples 1 to 6

First, insulation film materials containing cluster silica (silica cluster precursors) were prepared as follows. That is, 20.8 g (0.1 mol) of tetraethoxysilane, 17.8 g (0.1 mol) of methyltriethoxysilane, 23.6 g (0.1 mol) of glycidoxypropyltrimethoxysilane and 39.6 g of methylisobutylketone are each loaded in a 200 ml reaction vessel, and 16.2 g of 1% tetrabutylammoniumhydroxide aqueous solution was dropped in 10 minutes. The drop was followed by 2 hour aging reaction. Then, 5 g of magnesium sulfate was added to remove excessive water. Then, ethanol generated in the aging reaction was removed by a rotary evaporator until the reaction solution became 50 ml. 20 ml of methylisobutylketone was added to the thus obtained reaction solution, and the insulation film materials (silica cluster precursors) were prepared.

Then, the insulation film materials were applied to silicon wafers (semiconductor substrates) by spin coating. Conditions for the application were 3000 rotations/minute, and 30 seconds.

Next, 200° C. thermal processing (soft bake) was performed with a hot plate to thereby form the porous inter-layer insulation films. The film thicknesses of the porous inter-layer insulation films were as shown in TABLE 1-1 and 1-2. The reflective index was measured on the porous inter-layer insulation films on this stage. The values of the reflective index were as shown in TABLEs 1-1 and 1-2.

TABLE 1-1

| | | Example 1 | Example 2 | Example 3 | Example 4 | Example 5 |
|---|---|---|---|---|---|---|
| Before Electron Beam Cure | Inter-layer Insulation Film Thickness | 210 nm | 210 nm | 210 nm | 210 nm | 210 nm |
| | Inter-layer Insulation Film Refractive Index | 1.28 | 1.28 | 1.28 | 1.28 | 1.28 |
| Electron Beam Cure Conditions | Dense Insulation Film | SiO$_2$ | SiO$_2$ | SiO$_2$ | SOG | SOG |
| | Substrate Temperature | 200° C. | 300° C. | 400° C. | 200° C. | 300° C. |
| | Acceleration Voltage | 15 keV | 15 keV | 15 keV | 15 keV | 15 keV |
| | Time | 300 sec | 300 sec | 300 sec | 300 sec | 300 sec |
| | Atmosphere | Ar | Ar | Ar | Ar | Ar |
| Inter-layer Insulation Film After Electron Beam Cure | Film Thickness | 203 nm | 202 nm | 202 nm | 206 nm | 203 nm |
| | Refractive Index | 1.282 | 1.284 | 1.285 | 1.284 | 1.286 |
| | Modulus Of Elasticity | 15 GPa | 14 GPa | 15 GPa | 13 GPa | 14 GPa |
| | Hardness | 1.2 GPa | 1.2 GPa | 1.2 GPa | 1.2 GPa | 1.2 GPa |
| | Dielectric Constant | 2.3 | 2.3 | 2.3 | 2.3 | 2.3 |

TABLE 1-2

| | | Example 6 | Control 1 | Control 2 | Control 3 | Control 4 |
|---|---|---|---|---|---|---|
| Before Electron Beam Cure | Inter-layer Insulation Film Thickness | 210 nm | 210 nm | 210 nm | 210 nm | 210 nm |
| | Inter-layer Insulation Film Refractive Index | 1.28 | 1.28 | 1.28 | 1.28 | 1.28 |
| | Dense Insulation Film | SOG | — | None | None | None |
| Electron Beam Cure Conditions | Substrate Temperature | 400° C. | — | 200° C. | 300° C. | 400° C. |
| | Acceleration Voltage | 15 keV | — | 15 keV | 15 keV | 15 keV |
| | Time | 300 sec | — | 300 sec | 300 sec | 300 sec |
| | Atmosphere | Ar | — | Ar | Ar | Ar |
| Inter-layer Insulation Film After Electron Beam Cure | Film Thickness | 203 nm | 210 nm | 194 nm | 182 nm | 181 nm |
| | Refractive Index | 1.285 | 1.28 | 1.321 | 1.343 | 1.367 |
| | Modulus Of Elasticity | 14 GPa | 8 GPa | 13 GPa | 14 GPa | 16 GPa |
| | Hardness | 1.2 GPa | 0.7 GPa | 1.2 GPa | 1.2 GPa | 1.3 GPa |
| | Dielectric Constant | 2.3 | 2.3 | 2.6 | 3.3 | 3.5 |

The dense insulation films were formed on the porous inter-layer insulation films. The insulation films shown in TABLEs 1-1 and 1-2 were formed as the dense insulation films.

Next, with the dense insulation films formed on the porous inter-layer insulation films, electron beams were applied to the porous inter-layer insulation films through the dense insulation films (electron beam cure). The substrate temperature, the acceleration voltage, electron beam application period of time and the atmosphere in the chamber were set as indicated in TABLEs 1-1 and 1-2.

The porous inter-layer insulation films thus cured with the electron beams were measured, and the result indicated in TABLEs 1-1 and 1-2 was obtained. As evident in TABLEs 1-1 and 1-2, in Examples 1 to 6, the refractive index of the inter-layer insulation films made substantially no change before and after the application of the electron beams. This means that in Examples 1 to 6, the inter-layer insulation films did not substantially shrink. That is, in Examples 1 to 6, the shrinkage of the inter-layer insulation films by the application of the electron beams is prevented, and the inter-layer insulation films have low density.

As evident in TABLEs 1-1 and 1-2, in Examples 1 to 6, sufficiently high modulus of elasticity and strength were obtained. As evident in TABLEs 1-1 and 1-2, in Examples 1 to 6, the effective dielectric constant is sufficiently small. These mean that in Examples 1 to 6, the inter-layer insulation films have good mechanical strength and low dielectric constant.

[Control 1]

In the same way as in Examples 1 to 6, an insulation film material (porous silica precursor) was prepared, and the insulation film material was applied to a silicon wafer, and thermal processing (soft bake) was performed. Thus, the porous inter-layer insulation film was prepared.

The thus formed porous inter-layer insulation film was measured. The result shown in TABLEs 1-1 and 1-2 was obtained. As evident in TABLE 1-2, in Control 1, the modulus of elasticity and the hardness are low. This means that the mechanical strength of the porous inter-layer insulation film is low.

[Controls 2 to 4]

In the same way as in Examples 1 to 6, insulation film materials (porous silica precursors) were prepared, and the insulation film materials were applied to silicon wafers, and thermal processing (soft bake) was performed. Thus, porous inter-layer insulation films were formed.

Then, without forming dense insulation films on the porous inter-layer insulation films, electron beams were applied to the porous inter-layer insulation films (electron beam cure). The substrate temperature, the acceleration voltage, the application period of time and the atmosphere in the chamber were set as indicated in TABLE 1-2.

The thus electron beam cured porous inter-layer insulation films were measured, and the result shown in TABLE 1-2 was obtained. As evident in TABLE 1-2, in Controls 2 to 4, the refractive index is relatively high. This means that in Controls 2 to 4, the inter-layer insulation film excessively shrank and had high density. As evident in TABLE 1-2, in Controls 2 to 4, the effective dielectric constant is high.

Examples 7 to 12

First, in the same way as in Examples 1 to 6, insulation film materials (porous silica precursors) were prepared. The insulation film materials were applied to silicon wafers, and thermal processing (soft bake) was performed. The porous inter-layer insulation films were thus formed.

Then, dense insulation films were formed on the porous inter-layer insulation films. The dense insulation films were the insulation films shown in TABLEs 2-1 and 2-2.

Next, with the dense insulation films formed on the porous inter-layer insulation film, UV rays were applied to the porous inter-layer insulation films through the dense insulation films (UV ray cure). The UV lamp was a high-pressure mercury lamp. The substrate temperature and the application period of time were set as shown in TABLEs 2-1 and 2-2.

TABLE 2-1

|  |  | Example 7 | Example 8 | Example 9 | Example 10 | Example 11 |
|---|---|---|---|---|---|---|
| Before UV Ray Cure | Inter-layer Insulation Film Thickness | 210 nm | 210 nm | 210 nm | 210 nm | 210 nm |
|  | Inter-layer Insulation Film Refractive Index | 1.28 | 1.28 | 1.28 | 1.28 | 1.28 |
|  | Dense Insulation Film | SiO$_2$ | SiO$_2$ | SiO$_2$ | SOG | SOG |
| UV Ray Cure Conditions | Substrate Temperature | 200° C. | 300° C. | 400° C. | 200° C. | 300° C. |
|  | Time | 600 sec | 600 sec | 600 sec | 600 sec | 600 sec |
| Inter-layer Insulation Film After UV Ray Cure | Film Thickness | 203 nm | 202 nm | 202 nm | 206 nm | 203 nm |
|  | Refractive Index | 1.282 | 1.282 | 1.281 | 1.283 | 1.282 |
|  | Modulus Of Elasticity | 12 GPa | 14 GPa | 14 GPa | 13 GPa | 13 GPa |
|  | Hardness | 1.2 GPa | 1.2 GPa | 1.2 GPa | 1.2 GPa | 1.2 GPa |
|  | Dielectric Constant | 2.3 | 2.3 | 2.3 | 2.3 | 2.3 |

TABLE 2-2

|  |  | Example 12 | Control 1 | Control 5 | Control 6 | Control 7 |
|---|---|---|---|---|---|---|
| Before UV Ray Cure | Inter-layer Insulation Film Thickness | 210 nm | 210 nm | 210 nm | 210 nm | 210 nm |
|  | Inter-layer Insulation Film Refractive Index | 1.28 | 1.28 | 1.28 | 1.28 | 1.28 |
|  | Dense Insulation Film | SOG | — | None | None | None |
| UV Ray Cure Conditions | Substrate Temperature | 400° C. | — | 200° C. | 300° C. | 400° C. |
|  | Time | 600 sec | — | 600 sec | 600 sec | 600 sec |
| Inter-layer Insulation Film After UV Ray Cure | Film Thickness | 203 nm | 210 nm | 200 nm | 198 nm | 199 nm |
|  | Refractive Index | 1.282 | 1.28 | 1.305 | 1.299 | 1.312 |
|  | Modulus Of Elasticity | 15 GPa | 8 GPa | 13 GPa | 14 GPa | 15 GPa |
|  | Hardness | 1.2 GPa | 0.7 GPa | 1.2 GPa | 1.2 GPa | 1.2 GPa |
|  | Dielectric Constant | 2.3 | 2.3 | 2.4 | 2.6 | 2.5 |

The thus UV ray cured porous inter-layer insulation films were measured, and the result as shown in TABLEs 2-1 and 2-2 was obtained. As evident in TABLEs 2-1 and 2-2, in Examples 7 to 12, the refractive index of the inter-layer insulation films do not substantially change before and after the UV application. This means that the inter-layer insulation films did not substantially shrink. That is, in Examples 7 to 12, the shrinkage of the inter-layer insulation films by the application of the UV rays is prevented, and the inter-layer insulation films have low densities.

As evident in TABLEs 2-1 and 2-2, in Examples 7 to 12, sufficiently high modulus of elasticity and strength were obtained. As evident in TABLEs 2-1 and 2-2, in Examples 7 to 12, the effective dielectric constant is sufficiently small. These mean that in Examples 7 to 12, the inter-layer insulation films have good mechanical strength and low dielectric constant.

[Controls 5 to 7]

In the same way as in Examples 1 to 6, insulation film materials (porous silica precursors) were prepared. The insulation film materials were applied to silicon wafers, and thermal processing (soft bake) were performed. Thus, porous inter-layer insulation films were formed.

Next, without forming dense insulation films on the porous inter-layer insulation films, UV rays were applied to the porous inter-layer insulation films (UV ray cure). The substrate temperature and the application period of times were set as shown in TABLE 2-2.

Thus UV ray cured porous inter-layer insulation films were measured, and the result shown in TABLE 2-2 was obtained. As evident in TABLE 2-2, in Controls 5 to 7, the refractive index was relatively high. This means that the inter-layer insulation films excessively shrank, and the density of the inter-layer insulation films was large. As evident in TABLE 2-2, in Controls 5 to 7, the effective dielectric constant is high.

Examples 13 to 18

First, in the same way as in Examples 1 to 6, insulation film materials (porous silica precursors) were prepared. The insulation film materials were applied to silicon wafers, and thermal processing (soft bake) was performed. Thus, porous inter-layer insulation films were formed.

Next, dense insulation films were formed on the porous inter-layer insulation films. The dense insulation films were the insulation films shown in TABLE 3-1 and 3-2.

Next, with the dense insulation films formed on the porous inter-layer insulation films, plasmas were applied to the porous inter-layer insulation film through the dense insulation films (plasma cure). The substrate temperature and the application period of time were set as shown in TABLEs 3-1 and 3-2.

TABLE 3-1

|  |  | Example 13 | Example 14 | Example 15 | Example 16 | Example 17 |
|---|---|---|---|---|---|---|
| Before Plasma Cure | Inter-layer Insulation Film Thickness | 210 nm | 210 nm | 210 nm | 210 nm | 210 nm |
|  | Inter-layer Insulation Film Refractive Index | 1.28 | 1.28 | 1.28 | 1.28 | 1.28 |
| Plasma Cure Conditions | Dense Insulation Film | $SiO_2$ | $SiO_2$ | $SiO_2$ | SOG | SOG |
|  | Substrate Temperature | 400° C. | 400° C. | 400° C. | 400° C. | 400° C. |
|  | Kind Of Plasma | $O_2$ | $O_2$ | $O_2$ | $H_2$ | $H_2$ |
|  | Applied Power | 500 W | 500 W | 500 W | 500 W | 500 W |
|  | Time | 60 sec | 90 sec | 120 sec | 60 sec | 90 sec |
| Inter-layer Insulation Film After Plasma Cure | Film Thickness | 204 nm | 207 nm | 203 nm | 206 nm | 203 nm |
|  | Refractive Index | 1.282 | 1.281 | 1.283 | 1.282 | 1.282 |
|  | Modulus Of Elasticity | 12 GPa | 14 GPa | 14 GPa | 13 GPa | 13 GPa |
|  | Hardness | 1.2 GPa | 1.2 GPa | 1.2 GPa | 1.2 GPa | 1.2 GPa |
|  | Dielectric Constant | 2.3 | 2.3 | 2.3 | 2.3 | 2.3 |

TABLE 3-2

|  |  | Example 18 | Control 1 | Control 8 | Control 9 |
|---|---|---|---|---|---|
| Before Plasma Cure | Inter-layer Insulation Film Thickness | 210 nm | 210 nm | 210 nm | 210 nm |
|  | Inter-layer Insulation Film Refractive Index | 1.28 | 1.28 | 1.28 | 1.28 |
| Plasma Cure Conditions | Dense Insulation Film | SOG | — | None | None |
|  | Substrate Temperature | 400° C. | — | 400° C. | 400° C. |
|  | Kind Of Plasma | $H_2$ | — | $O_2$ | $H_2$ |
|  | Applied Power | 500 W | — | 500 W | 500 W |
|  | Time | 120 sec | — | 60 sec | 60 sec |
| Inter-layer Insulation Film After Plasma Cure | Film Thickness | 202 nm | 210 nm | 184 nm | 178 nm |
|  | Refractive Index | 1.282 | 1.28 | 1.362 | 1.341 |
|  | Modulus Of Elasticity | 15 GPa | 8 GPa | 16 GPa | 15 GPa |
|  | Hardness | 1.2 GPa | 0.7 GPa | 1.2 GPa | 1.2 GPa |
|  | Dielectric Constant | 2.3 | 2.3 | 3.5 | 3.4 |

The thus plasma cured porous inter-layer insulation films were measured, and the result shown in TABLEs 3-1 and 3-2 was obtained. As evident in TABLEs 3-1 and 3-2, in Examples 13 to 18, the refractive index of the inter-layer insulation films do not substantially change before and after the plasma application. This means that the inter-layer insulation films did not substantially shrink. That is, in Examples 13 to 18, the shrinkage of the inter-layer insulation films by the application of the plasmas was prevented, and the inter-layer insulation films have low density.

As evident in TABLEs 3-1 and 3-2, in Examples 13 to 18, sufficiently high modulus of elasticity and strength were obtained. As evident in TABLEs 3-1 and 3-2, in Examples 13 to 18, the effective dielectric constant is sufficiently low. These mean that in Examples 13 to 18, the inter-layer insulation films have good mechanical strength and low dielectric constant.

[Controls 8 and 9]

First, in the same way as in Examples 1 to 6, insulation film materials (porous silica precursors) were prepared. The insulation film materials were applied to silicon wafers, and thermal processing (soft bake) was performed. Thus, porous inter-layer insulation films were prepared.

Next, without forming the dense insulation films formed on the porous inter-layer insulation films, plasmas were applied to the porous inter-layer insulation films (plasma cure). The substrate temperature and the application period of time were set as shown in TABLE 3-2.

The thus plasma cured porous inter-layer insulation films were measured, and the result shown in TABLE 3-2 was obtained. As evident in TABLE 3-2, in Controls 8 and 9, the refractive index was relatively high. This means that the inter-layer insulation films excessively shrink, and the density of the inter-layer insulation films is high. As evident in TABLE 3-2, in Controls 8 and 9, the effective dielectric constant is high.

Example 19

First, the device isolation film 12 was formed on the semiconductor substrate 10 by LOCOS. Then, the gate electrode 18 is formed on the device region 14 with the gate insulation film 16 formed therebetween. The sidewall insulation film 20 is formed on the side wall of the gate electrode 18. Next, with the sidewall insulation film 20 and the gate electrode 18 as the mask, a dopant impurity is implanted into the semiconductor substrate 10 to thereby form the source/drain diffused layer 22 in the semiconductor substrate 10 on both sides of the gate electrode 18. Thus, a transistor 24 including the gate electrode 18 and he source/drain diffused layer 22 was formed (see FIG. 1A).

Next, the inter-layer insulation film 26 was formed on the entire surface by CVD. Next, on the inter-layer insulation film 26, the stopper film 28 was formed. Then, by photolithography, the contact hole 30 was formed down to the source/drain diffused layer 22 (see FIG. 1B).

Next, an adhesion layer 32 of a 50 nm-thickness TiN film is formed on the entire surface by, e.g., sputtering. Then, a tungsten film 34 is formed on the entire surface by, e.g., CVD. Then, the adhesion layer 32 and the tungsten film 34 are polished by, e.g., CMP until the surface of the stopper film 28 is exposed. Thus, the conductor plug 34 of the tungsten is buried in the contact hole 30 (see FIG. 1C).

Next, the insulation film 36 of the SiC:O:H film of a 30 nm-thickness was formed o the entire surface by plasma enhanced CVD. Then, in the same way as in Examples 1 to 6, the porous inter-layer insulation film 38 was formed on the entire surface. The film thickness of the porous inter-layer insulation film 38 was 160 nm (see FIG. 2A).

Next, the dense insulation film 40 of a 30 nm-thickness silicon oxide film was formed on the entire surface by plasma enhanced CVD. The density of the dense insulation film 40 was 2 g/cm$^3$ (see FIG. 2B).

Next, with the dense insulation film 40 present on the porous insulation film 38, electron beams were applied to the porous insulation film 38 through the dense insulation film 40 (electron beam cure) (see FIG. 2C). Conditions for the application of the electron beams were the same as in Example 3.

Next, the photoresist film 42 was formed on the entire surface by spin coating. Next, the opening 44 for forming the first layer interconnection 50 was formed in the photoresist film by photolithography. The opening 44 was formed in a 100 nm-interconnection width and at a 100 nm-pitch. Then, with the photoresist film 42 as the mask, the interconnection film 40, the inter-layer insulation film 38 and the insulation film 36 were etched. In the etching, fluorine plasmas using $CF_4$ gas and $CHF_3$ gas were used. Thus, the trench 46 for the interconnection 50 to be buried in was formed in the insulation film 40, the inter-layer insulation film 38 and the insulation film 36. Then, the photoresist film 42 was released (see FIG. 3A).

Next, the barrier film of a 10 nm-thickness TaN was formed on the entire surface by sputtering. Next, the seed film of a 10 nm-thickness Cu film was formed on the entire surface by sputtering. Thus, the layer film 48 of the barrier film and the seed film was formed. Next, the 600 nm-thickness Cu film 50 was formed by electroplating. Then, the Cu film 50 and the layer film 48 were polished until the surface of the insulation film 40 was exposed. Thus, interconnection 50 of Cu was buried in the trench 46. Next, the insulation film 52 of the SiC:O:H film of a 30 nm-thickness was formed on the entire surface by plasma enhanced CVD (see FIG. 3B).

Then, in the same way as in Examples 1 to 6, the porous inter-layer insulation film 54 was formed. The film thickness of the inter-layer insulation film 54 was 180 nm. Next, the dense insulation film 56 of the SiC:O:H film of a 30 nm-thickness was formed on the entire surface (see FIG. 4A).

Then, with the dense insulation film 56 present on the porous inter-layer insulation film 54, electron beams were applied to the inter-layer insulation film 54 through the insulation film 56 (electron beam cure). Conditions for the application of electron beams to the inter-layer insulation film 54 through the insulation film 56 were the same as in Example 3 (see FIG. 4B).

Next, in the same way as Examples 1 to 6, the porous inter-layer insulation film 58 was formed. The film thickness of the porous inter-layer insulation film 58 was, e.g., 160 nm. Next, the dense insulation film 60 of a 30 nm-thickness silicon oxide film was formed on the entire surface by plasma enhanced CVD (see FIG. 5A).

Next, with the dense insulation film 60 present on the porous inter-layer insulation film 58, electron beams were applied to the inter-layer insulation film 58 through the insulation film 60 (electron beam cure). Conditions for the application of the electron beams to the inter-layer insulation film 58 through the insulation film 60 were the same as in Example 3 (see FIG. 5B).

Next, the-photoresist film 62 was formed on the entire surface by spin coating. Next, the opening 64 for forming the contact hole 66 was formed in the photoresist film 62 by photolithography. Next, with the photoresist film 62 as the mask, the insulation film 60, the inter-layer insulation film 58, the insulation film 56, the inter-layer insulation film 54 and the insulation film 52 were etched. In the etching, fluorine plasmas using $CF_4$ gas and $CHF_3$ gas as the raw material was used. The composition ratio of the etching gas, the pressure for the etching, etc. were suitably changed, whereby the insulation film 60, the inter-layer insulation film 58, the insulation film 56, the inter-layer insulation film 54 and the insulation film 52 were etched. Thus, the contact hole 66 was formed down to the interconnection 50 (see FIG. 6). Then, the photoresist film was released.

Next, the photoresist film 68 was formed on the entire surface by spin coating. Next, the opening 70 for forming the second layer interconnection 76a was formed in the photoresist film 68 by photolithography. Next, with the photoresist film 68 as the mask, the insulation film 60, the inter-layer insulation film 58 and the insulation film 56 were etched. In the etching, fluorine plasmas using $CF_4$ gas and $CHF_3$ gas as the raw material were used. Thus, the trench 72 for the interconnection 76a to be buried in were formed in the insulation film 60, the inter-layer insulation film 58 and the insulation film 56 (see FIG. 7).

Next, the barrier film of a 10 nm-thickness TaN film was formed on the entire surface by sputtering. Next, the seed film of a 10 nm-thickness Cu film was formed on the entire surface by sputtering. The layer film 74 of the barrier film and the seed film was formed. Next, the 1400 nm-thickness Cu film 76 was formed. Next, the Cu film 76 and the inter-layer insulation film 74 were polished by CMP until the surface of the insulation film 60 was exposed. Thus, the conductor plug 76b of the Cu was buried in the contact hole 66 while the interconnection 76a of the Cu was buried in the trench 72. Then, the insulation film 78 of the SiC:O:H film of a 30 nm-thickness was formed on the entire surface by plasma enhanced CVD (see FIG. 8). Then, the above-described steps were suitably repeated to thereby form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 91%.

The effective dielectric constant between the interconnections was computed and was 2.6. The effective dielectric constant is a dielectric constant measured with not only the porous inter-layer insulation film but also other insulation films being present around the interconnections. The effective dielectric constant is measured with not only the porous inter-layer insulation film of low dielectric constant but also the insulation films of relatively high dielectric constant present around the interconnections and has a larger value larger than the dielectric constant of the porous inter-layer insulation film.

The semiconductor device was left at 200° C. for 3000 hours, and the resistance of the interconnections were measured. No resistance increase was confirmed.

[Control 10]

FIGS. 9A to 15 are sectional views of the semiconductor device according to controls in the steps of the method for fabricating the semiconductor device, which illustrate the method.

Figure 9A:
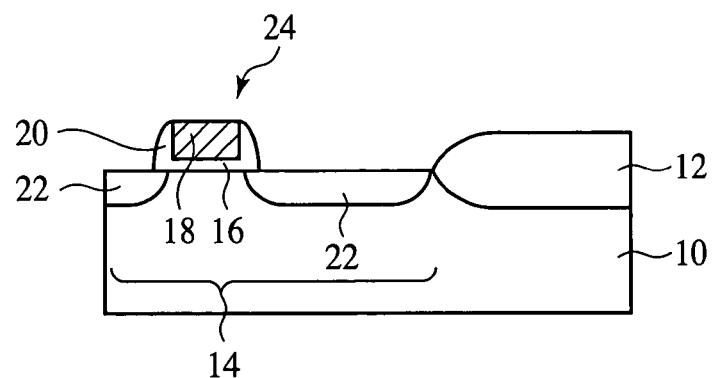
FIGS. 9A and 9C are sectional views of a semiconductor device in the steps of a semiconductor device fabrication method according to a control, which illustrate the method (Part 1).

First, in the same way as in Example 19, the transistor 24 was formed (see FIG. 9A). The inter-layer insulation film 26 and the stopper film 28 were formed (see FIG. 9B). Then, the conductor 34 was buried in the contact hole 30 (see FIG. 9C).

Figure 10A:
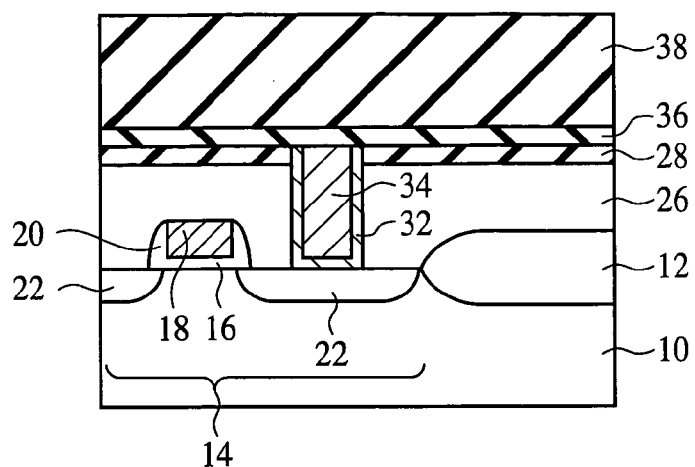
FIGS. 10A and 10C are sectional views of a semiconductor device in the steps of a semiconductor device fabrication method according to a control, which illustrate the method (Part 2).
Figure 10B:
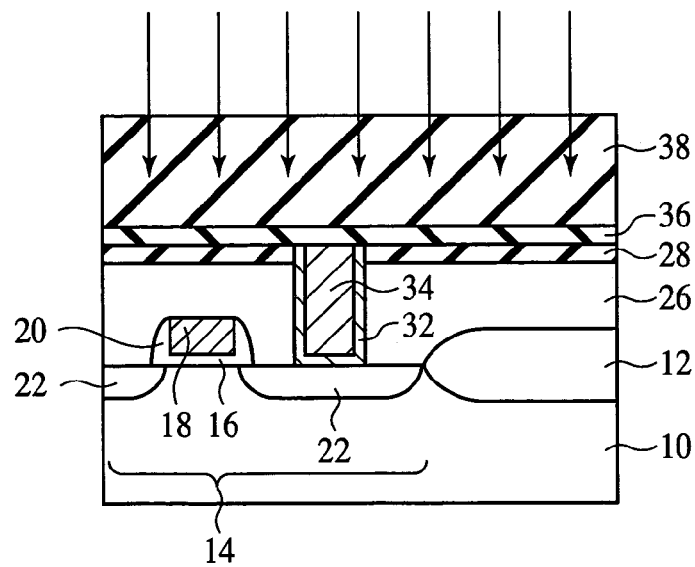

Next, in the same way as in Example 19, the insulation film 36 was formed, and then the porous inter-layer insulation film 38 was formed (see FIG. 10A). Next, without forming the dense insulation film on the porous inter-layer insulation film 38, electron beams were applied to the porous inter-layer insulation film 38 (electron beam cure). Conditions for the application of the electron beams were the same as in Control 4 (see FIG. 10B). Then, an insulation film 40 of a 30 nm-silicon oxide film was formed on the entire surface by plasma enhanced CVD (see FIG. 10C).

Figure 11A:
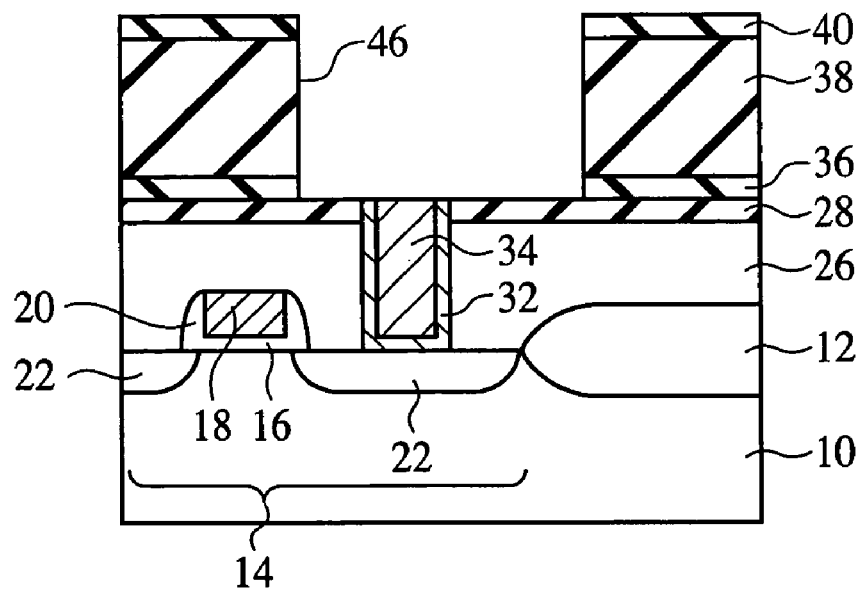
FIGS. 11A and 11B are sectional views of a semiconductor device in the steps of a semiconductor device fabrication method according to a control, which illustrate the method (Part 3).
Figure 11B:
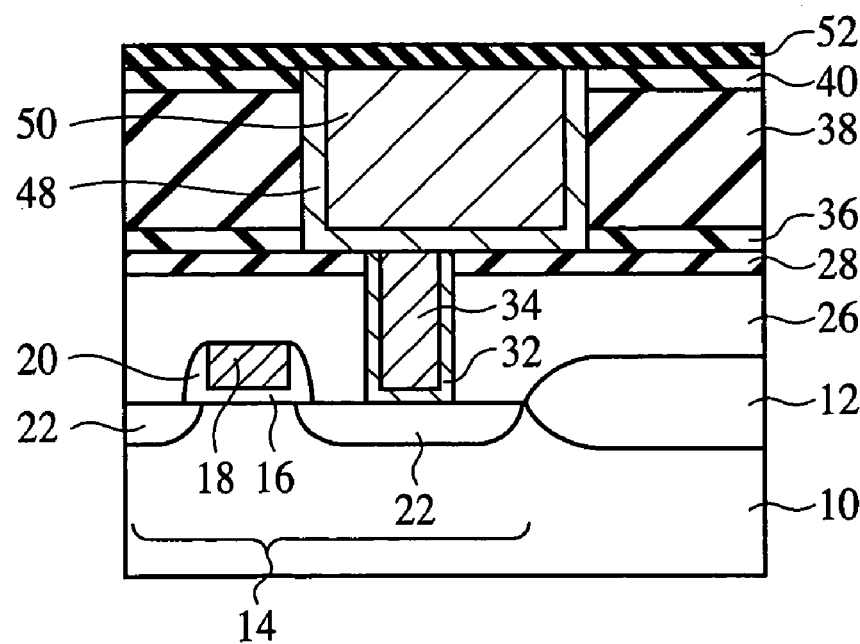

Next, in the same way as in Example 19, the trench 46 was formed in the insulation film 40, the porous inter-layer insulation film 38 and the insulation film 36 (see FIG. 11A). Then, in the same way as in Example 19, the interconnection 50 was buried in the insulation film 40, the inter-layer insulation film 38 and the insulation film 36. Then, in the same way as in Example 19, the insulation film 52 was formed (see FIG. 11B).

Figure 12A:
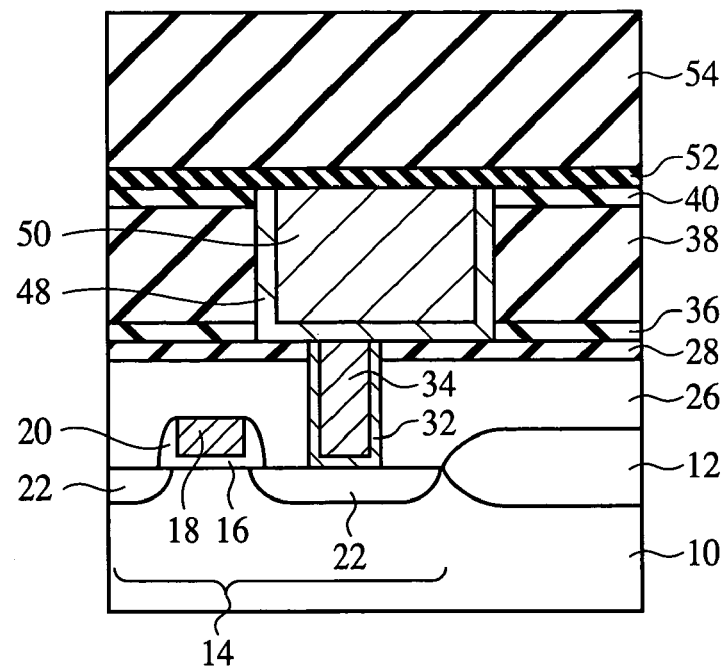
FIGS. 12A and 12B are sectional views of a semiconductor device in the steps of a semiconductor device fabrication method according to a control, which illustrate the method (Part 4).
Figure 12B:
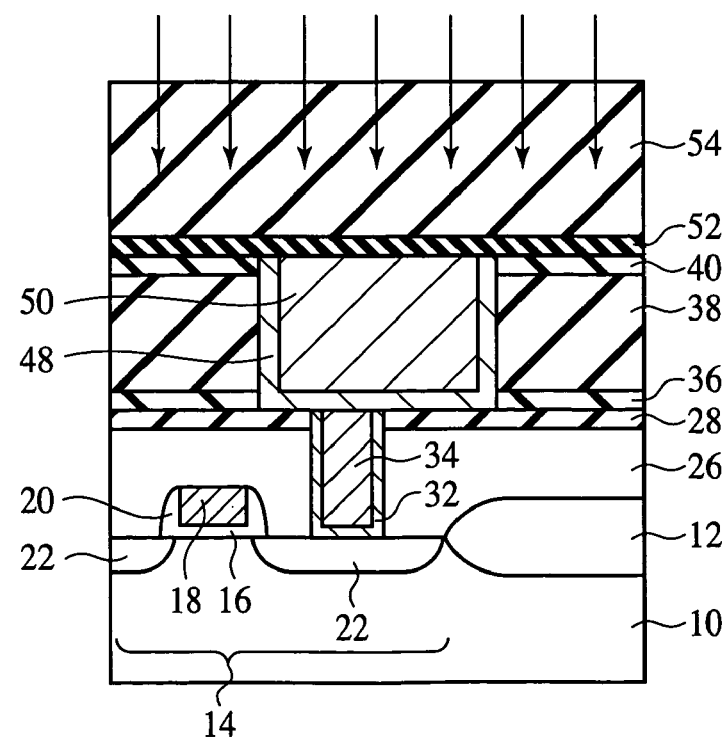

Next, in the same way as in Example 19, the porous inter-layer insulation film 54 was formed (see FIG. 12A).

Next, without forming the dense insulation film on the porous inter-layer insulation film 54, electron beams were applied to the porous insulation film 54 (electron beam cure). Conditions for the application of the electron beams were the same as in Control 4 (see FIG. 12B).

Figure 13A:
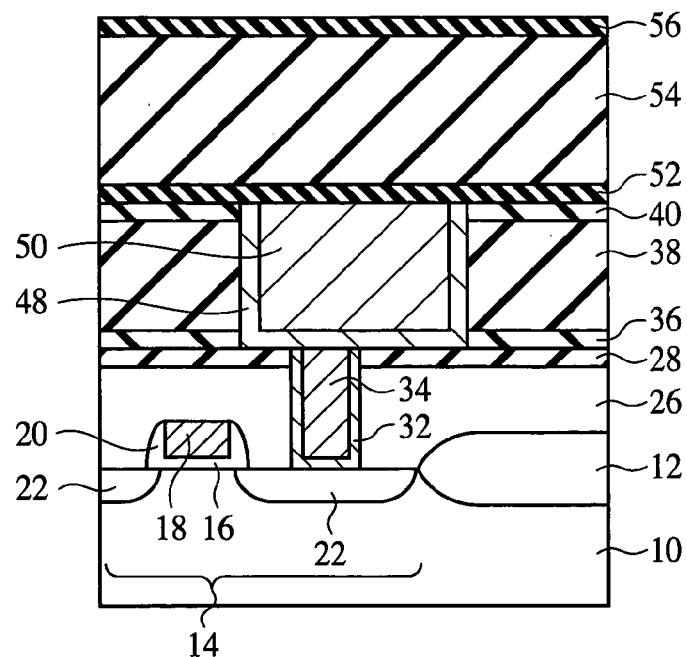
FIGS. 13A and 13B are sectional views of a semiconductor device in the steps of a semiconductor device fabrication method according to a control, which illustrate the method (Part 5).

Next, the insulation film 56 of the SiC:O:H film of a 30 nm-thickness was formed on the entire surface (see FIG. 13A).

Figure 13B:
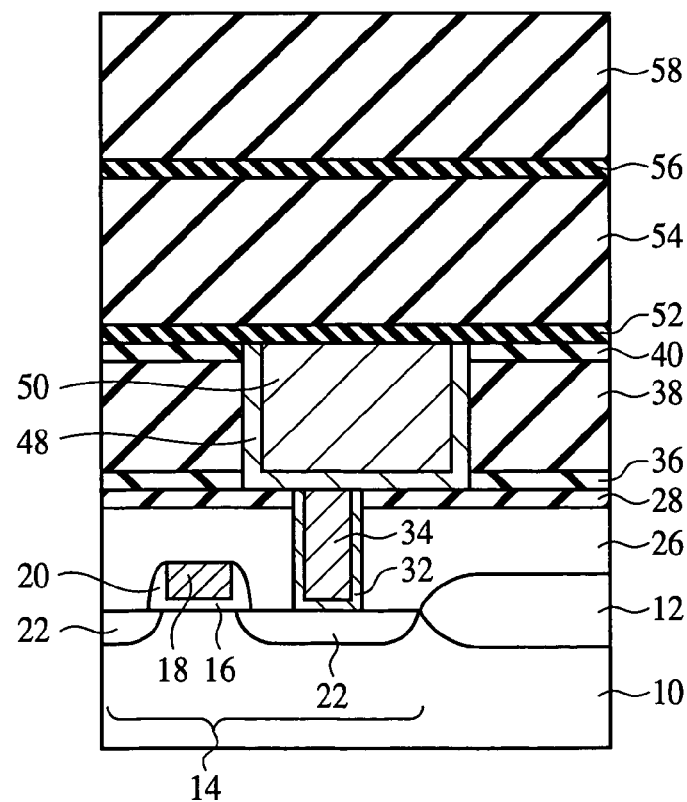

Then, in the same way as in Example 19, the porous inter-layer insulation film 58 was formed (see FIG. 13B).

Then, without forming the dense insulation film on the porous inter-layer insulation film 58, electron beams were applied to the porous inter-layer insulation film 58 (electron beam cure). Conditions for the application of the electron beams were the same as in Control 4 (see FIG. 14A).

Figure 14A:
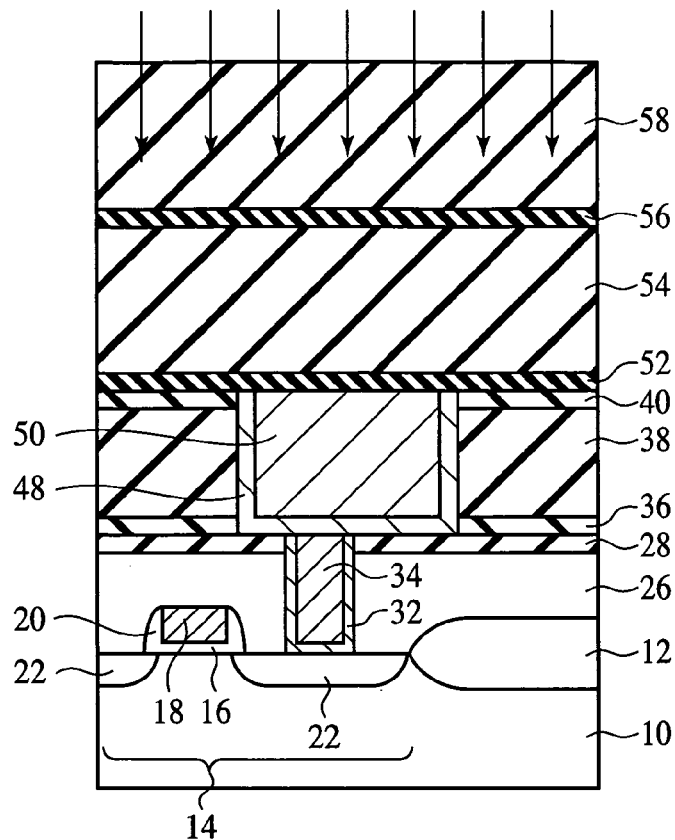
FIGS. 14A and 14B are sectional views of a semiconductor device in the steps of a semiconductor device fabrication method according to a control, which illustrate the method (Part 6).
Figure 14B:
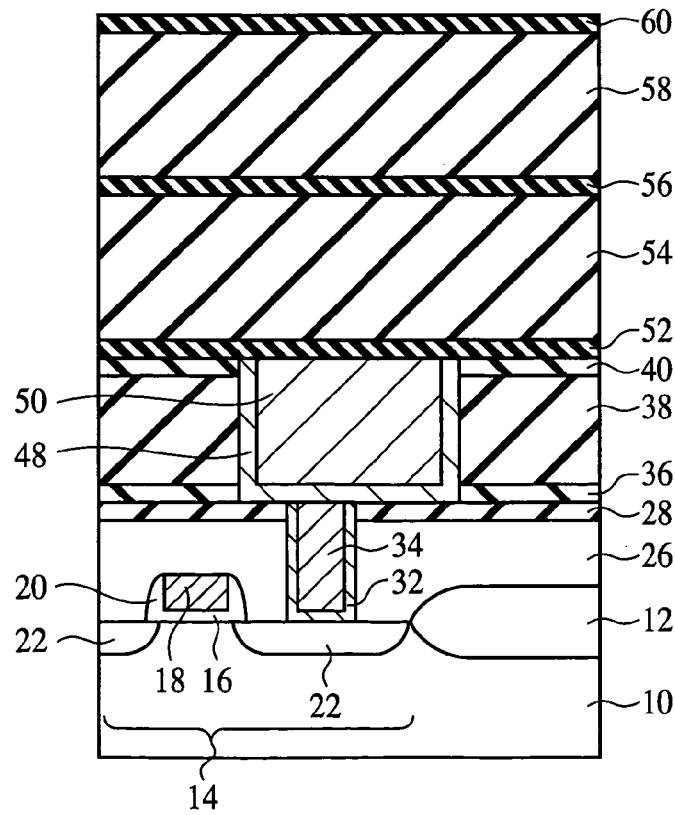

Next, the insulation film 60 of a 30 nm-thickness silicon oxide film was formed on the entire surface by plasma enhanced CVD (see FIG. 14B).

Figure 15:
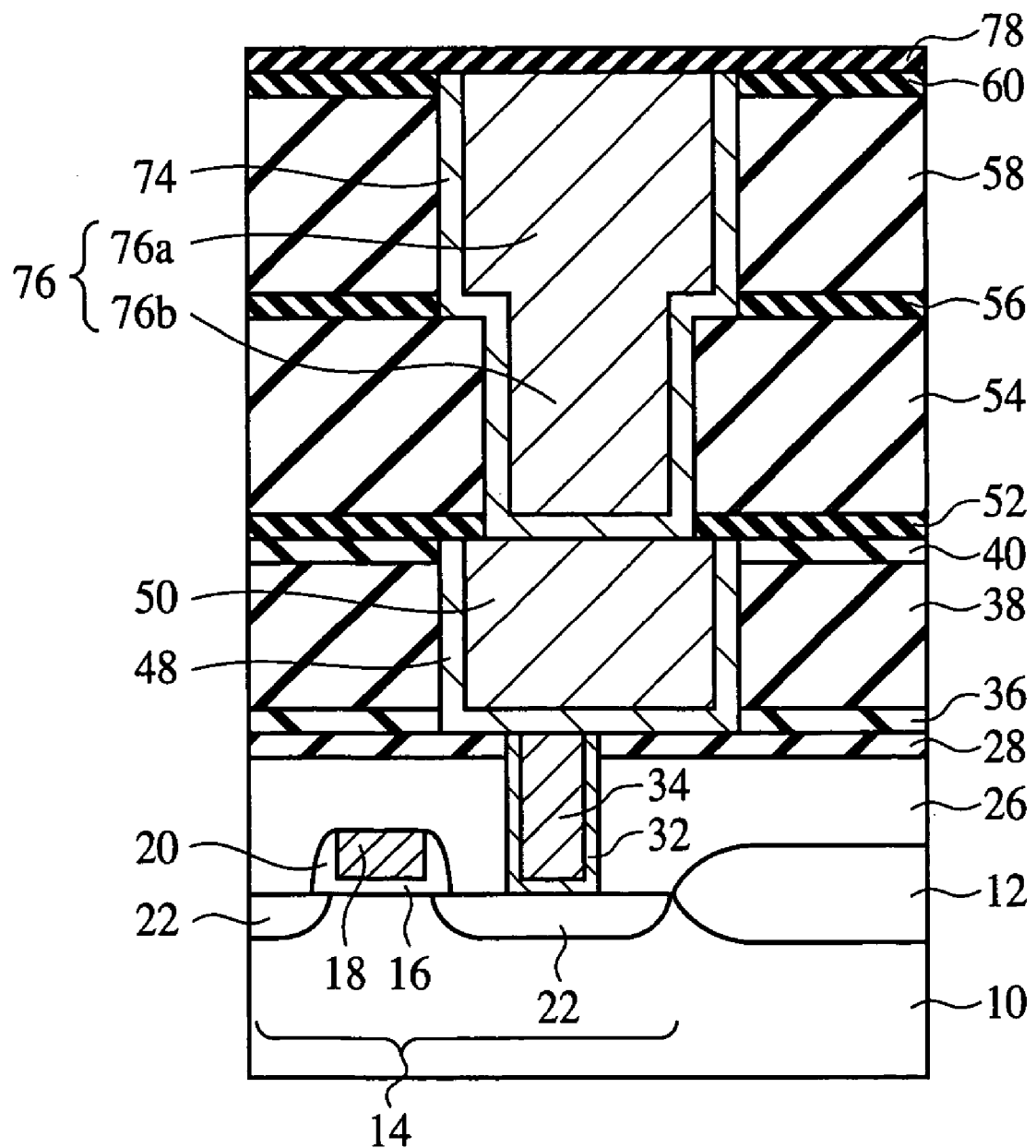
FIG. 15 is a sectional view of a semiconductor device in the steps of a semiconductor device fabrication method according to a control, which illustrates the method (Part 7).

Then, in the same way as in Example 19, the conductor plug 76b and the interconnection 76a were buried in the inter-layer insulation films 54, 58, etc. by dual damascene. Next, in the same way as in Example 19, the insulation film 78 was formed (FIG. 15). Then, the above-described steps were suitably repeated to form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 34%. The effective dielectric constant between the interconnections was computed and was 3.8. The semiconductor device was left at 200° C. for 3000 hours, and the resistance of the interconnections were measured. The resistance increase was confirmed.

Example 20

First, in the same way as in Example 19, the transistor 24 was formed (see FIG. 1A). The inter-layer insulation film 26 and the stopper film 28 were formed (see FIG. 1B), and then the conductor plug 34 was buried in the contact hole 30 (see FIG. 1C).

Next, in the same way as in Example 19, the insulation film 36 was formed. Then, the porous inter-layer insulation film 38 was formed (see FIG. 2A).

Then, in the same way as in Example 19, the dense insulation film 40 was formed on the porous inter-layer insulation film 38 (see FIG. 2B).

Next, with the dense insulation film 40 present on the porous inter-layer insulation film 38, UV rays were applied to the inter-layer insulation film 38 through the insulation film 40 (UV ray cure). Conditions for the application of the UV rays to the inter-layer insulation film 38 through the insulation film 40 was the same as in Example 9.

Next, in the same way as in Example 19, the trench 46 was formed in the insulation film 40, the porous inter-layer insulation film 38 and the insulation film 36 (see FIG. 3A).

Then, in the same way as in Example 19, the interconnection 50 was buried in the insulation film 36, the inter-layer insulation film 38 and the insulation film 40. Next, in the same way as in Example 19, the insulation film 52 was formed (FIG. 3B).

Then, in the same way as in Example 19, the porous inter-layer insulation film 54 was formed. Then, in the same way as in Example 19, the dense insulation film 56 is formed on the porous inter-layer insulation film 54 (see FIG. 4A).

Next, with the dense insulation film 56 present on the porous inter-layer insulation film 54, UV rays were applied to the inter-layer insulation film 54 through the insulation film 56 (UV ray cure). Conditions for the application of the UV rays to the inter-layer insulation film 54 through the insulation film 56 were the same as in Example 9.

Next, in the same way as in Example 19, the porous inter-layer insulation film 58 was formed. Then, in the same way as in Example 19, the dense insulation film 60 was formed on the porous inter-layer insulation film 58 (see FIG. 5A).

Then, with the dense insulation film 60 present on the porous inter-layer insulation film 58, UV rays were applied to the inter-layer insulation film 58 through the insulation film 60 (UV ray cure). Conditions for the application of the UV rays to the inter-layer insulation film 58 through the insulation film 60 were the same as in Example 9 (FIG. 5B).

Next, in the same way as in Example 19, the contact hole 66 was formed in the insulation film 60, the inter-layer insulation film 58, the insulation film 56, the inter-layer insulation film 54 and the insulation film 52 (see FIG. 6).

Next, in the same way as in Example 19, a trench 72 was formed in the insulation film 60, the inter-layer insulation film 58 and he insulation film 56 (see FIG. 7).

Then, in the same way as in Example 19, the interconnection 76a was buried in the trench 72 while the conductor plug 76b was buried in the contact hole 66. Next, in the same way as in Example 19, the insulation film 78 was formed (see FIG. 8). Then, the above-described steps were suitably repeated to form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 87%. The effective dielectric constant between the interconnections was computed and was 2.58. The semiconductor device was left at 200° C. for 3000 hours, and the resistance of the interconnections were measured. No resistance increase was confirmed.

[Control 11]

Figure 9B:
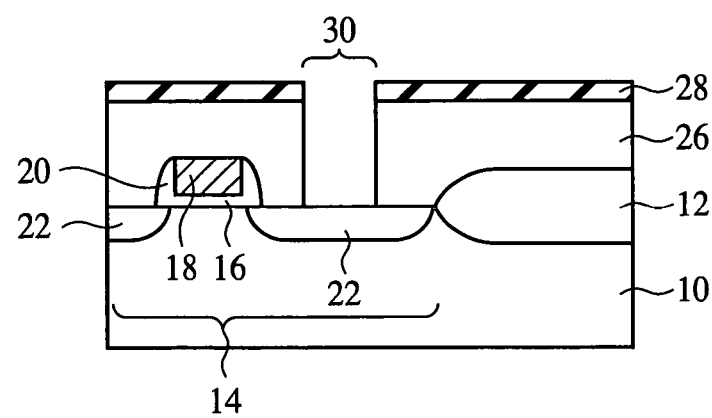

First, in the same way as in Example 19, the transistor 24 was formed (see FIG. 9A), and the inter-layer insulation film 26 and the stopper film 28 were formed (see FIG. 9B). Then, the conductor plug 34 was buried in the contact hole 30 (see FIG. 9C).

Then, in the same way as in Example 19, the insulation film 36 was formed, and then the porous inter-layer insulation film 38 was formed (see FIG. 10A).

Next, without the dense insulation film formed on the porous inter-layer insulation film 38, UV rays were applied to the porous inter-layer insulation film 38 (UV ray cure). Conditions for the application of the UV rays were the same as in Control 7 (see FIG. 10B).

Figure 10C:
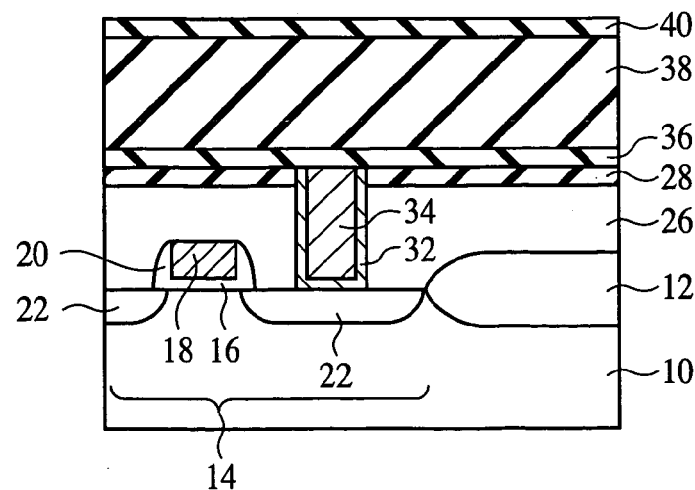

Next, the insulation film 40 of a 30 nm-thickness silicon oxide film was formed on the entire surface by plasma enhanced CVD (see FIG. 10C).

Next, in the same way as in Example 19, the trench 46 was formed in the insulation film 40, the porous inter-layer insulation film 38 and the insulation film 36 (see FIG. 11A). Next, in the same way as in Example 19, the interconnection 50 was buried in the insulation film 40, the inter-layer insulation film 38 and the insulation film 36. Then, in the same way as in Example 19, the insulation film 52 was formed (see FIG. 11B).

Next, in the same way as in Example 19, the porous inter-layer insulation film 54 was formed (see FIG. 12A). Next, without forming the dense insulation film on the porous inter-layer insulation film 54, UV rays were applied to the porous inter-layer insulation film 54 (UV ray cure). Conditions for the application of the UV rays were the same as in Control 7 (see FIG. 12B).

Next, the insulation film 56 of the SiC:O:H film of a 30 nm-thickness was formed on the entire surface (see FIG. 13A).

Next, in the same way as in Example 19, the porous inter-layer insulation film 58 was formed (see FIG. 13B).

Next, without forming the dense insulation film on the porous inter-layer insulation film 58, UV rays were applied to the porous inter-layer insulation film 58 (UV ray cure). Conditions for the application of the UV rays were the same as in Control 7 (see FIG. 14A).

Then, an insulation film of a 30 nm-thickness silicon oxide film was formed on the entire surface by plasma enhanced CVD (see FIG. 14B).

Next, in the same way as in Example 19, the conductor plug 76b and the interconnection 76a were buried in the inter-layer insulation films 54, 58, etc. by dual damascene. Next, in the same way as in Example 19, the insulation film 78 was formed (see FIG. 15). Then, the above-described steps were suitably repeated to form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 64%. The effective dielectric constant between the interconnections was computed and was 3.6. The semiconductor device was left at 200° C. for 3000 hours, and the resistance of the interconnections were measured. The resistance increase was confirmed.

Example 21

First, in the same way as in Example 19, the transistor 24 was formed (see FIG. 1A). The inter-layer insulation film 26 and the stopper film 28 were formed (see FIG. 1B). Then, the conductor plug 34 was buried in the contact hole 30 (see FIG. 1C).

Next, in the same way as in Example 19, the insulation film 36 was formed, and then the porous inter-layer insulation film 38 was formed (see FIG. 2A).

Then, in the same way as in Example 19, the dense insulation film 40 was formed on the porous inter-layer insulation film 38 (see FIG. 2B).

Next, with the dense insulation film 40 present on the porous inter-layer insulation film 38, plasmas were applied to the inter-layer insulation film 38 through the insulation film 40 (plasma cure). Conditions for the application of the plasmas to the inter-layer insulation film 38 through the insulation film 40 were the same as in Example 18.

Next, in the same way as in Example 19, the trench 46 was formed in the insulation film 40, the porous inter-layer insulation film 38 and the insulation film 36 (see FIG. 3A).

Next, in the same way as in Example 19, the interconnection 50 was buried in the insulation film 36, the inter-layer insulation film 38 and the insulation film 40. Next, in the same way as in Example 19, the insulation film 52 was formed (see FIG. 3B).

Then, in the same way as in Example 19, the porous inter-layer insulation film 54 was formed. Then, in the same way as in Example 9, the dense insulation film 56 was formed on the porous inter-layer insulation film 54 (see FIG. 4A).

Next, with the dense insulation film 56 present on the porous inter-layer insulation film 54, plasmas were applied to the porous inter-layer insulation film 54 through the insulation film 56 (plasma cure). Conditions for the application of the plasmas to the inter-layer insulation film 54 through the insulation film 56 were the same as in Example 18.

Next, in the same way as in Example 19, the porous inter-layer insulation film 58 was formed. Then, in the same way as in Example 19, the dense insulation film 60 was formed on the porous inter-layer insulation film 58 (see FIG. 5A).

Next, with the dense insulation film 60 present on the porous inter-layer insulation film 58, plasmas were applied to the inter-layer insulation film 58 through the insulation film 60 (plasma cure). Conditions for the application of the plasmas to the inter-layer insulation film 58 through the insulation film 60 were the same as in Example 18 (see FIG. 5B).

Next, in the same way as in Example 19, the contact hole 66 was formed in the insulation film 60, the inter-layer insulation film 58, the insulation film 56, the inter-layer insulation film 54 and the insulation film 52 (see FIG. 6).

Next, in the same way as in Example 19, the trench 72 was formed in the insulation film 60, the inter-layer insulation film 58 and the insulation film 56 (see FIG. 7).

Next, in the same way as in Example 19, the interconnection 76a is buried in the trench 72 while the conductor plug 76b was buried in the contact hole 66. Next, in the same way as in Example 19, the insulation film 78 was formed (see FIG. 8). Then, the above-described steps were suitably repeated to form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 96%. The effective dielectric constant between the interconnections was computed and was 2.58. The semiconductor device was left at 200° C. for 3000 hours, and the resistance of the interconnections were measured. No resistance increase was confirmed.

[Control 12]

First, in the same way as in Example 19, the transistor 24 was formed (see FIG. 9A), and the inter-layer insulation film 26 and the stopper film 28 were formed (see FIG. 9B). Then, the conductor plug 34 was buried in the contact hole 30 (see FIG. 9C).

Next, in the same way as in Example 19, the insulation film 36 was formed, and then, the porous inter-layer insulation film 38 was formed (see FIG. 10A).

Next, without forming the dense insulation film on the porous inter-layer insulation film 38, plasmas were applied to the porous inter-layer insulation film 38 (plasma cure). Conditions for the application of the plasmas were the same as in Control 9 (see FIG. 10B).

Next, the insulation film 40 of a 30 nm-thickness silicon oxide film was formed on the entire surface by plasma enhanced CVD (see FIG. 10C).

Next, in he same way as in Example 19, the trench 46 was formed in the insulation film 40, the porous inter-layer insulation film 38 and the insulation film 36 (see FIG. 11A). Next, in the same way as in Example 19, the interconnection 50 was buried in the insulation film 40, the inter-layer insulation film 38 and he insulation film 36. Next, in the same way as in Example 19, the insulation film 52 was formed (see FIG. 11B).

Next, in the same way as in Example 19, the porous inter-layer insulation film 54 was formed (see FIG. 12A). Next, without forming the dense insulation film on the porous inter-layer insulation film 54, plasmas were applied to the porous inter-layer insulation film 54 (plasma cure). Conditions for the application of the plasmas were the same as in Control 9 (see FIG. 12B).

Next, the insulation film 56 of the SiC:O:H film of a 30 nm-thickness on the entire surface (see FIG. 13A).

Next, in the same way as in Example 19, the porous inter-layer insulation film 58 was formed (see FIG. 13B).

Then, without forming the dense insulation film on the porous inter-layer insulation film 58, plasmas were applied to the porous inter-layer insulation film 58 (plasma cure). Conditions for the application of the plasmas were the same as in Control 9 (see FIG. 14A).

Then, the insulation film 60 of a 30 nm-thickness silicon oxide film was formed on the entire surface by plasma enhanced CVD (see FIG. 14B).

Next, in the same way as in Example 19, the conductor plug 76b and the interconnection 76a were buried in the inter-layer insulation films 54, 58, etc. by dual damascene. Then, in the same way as in Example 19, the insulation film 78 was formed (see FIG. 15). Then, the above-described steps were suitably repeated to form the third layer interconnection.

The semiconductor device which was thus fabricated as described above was fabricated so that the interconnections and the conductor plugs were formed, electrically connecting serially one million of the conductor plugs. The yield was measured on the semiconductor device. The yield was 48%. The effective dielectric constant between the interconnections was computed and was 3.8. The semiconductor device was left at 200° C. for 3000 hours, and the resistance of the interconnections were measured. The resistance increase was confirmed.

Examples 22 to 27

In the same way as in Examples 1 to 6, insulation film materials (porous silica precursors) were prepared, and the insulation film materials were applied to silicon wafers, and thermal processing (soft bake) was performed. Thus, the porous inter-layer insulation films were prepared.

The thus formed porous inter-layer insulation films were measured. The result shown in TABLEs 4-1 to 4-3 are obtained.

TABLE 4-1

|  |  | Example 22 | Example 23 | Control 13 |
|---|---|---|---|---|
| Inter-layer Insulation Film Before UV Ray Cure | Film Thickness (nm) | 180 | | |
| | Refractive Index | 1.28 | | |
| | Elastic Modulus (Gpa) | 10 | | |
| | Hardness (Gpa) | 1 | | |
| | Cross-linking Percentage (%) | 65 | | |
| | Diameter of Pore (nm) | 0.7-1.4 | | |
| | Tensile Strength (kg/cm$^2$) | 523 | | |
| | Dielectric Constant | 2.3 | | |
| Dense Insulation Film | Kind of Dense Insulation Film | SiO$_2$ | SOG | None |
| | Film Thickness (nm) | 30 | 50 | — |
| Condition of UV Ray Cure | Kind of Lamp | High-pressure Mercury Lamp | | |
| | Energy (eV) | 4.9 | | |
| | Substrate Temperature | 400 | | |
| Inter-layer Insulation Film After UV Ray Cure | Film Thickness (nm) | 175 | 176 | 163 |
| | Refractive Index | 1.283 | 1.283 | 1.344 |
| | Elastic Modulus (Gpa) | 13 | 13 | 15 |
| | Hardness (GPa) | 1.2 | 1.2 | 1.4 |
| | Cross-linking Percentage (%) | 72 | 70 | 75 |
| | Diameter of Pore (nm) | 1.2-1.5 | 1.1-1.4 | 1.1-1.4 |
| | Tensile Strength (kg/cm$^2$) | 621 | 635 | 632 |
| | Dielectric Constant | 2.3 | 2.3 | 3.4 |

TABLE 4-2

|  |  | Example 24 | Example 25 | Control 14 |
|---|---|---|---|---|
| Inter-layer Insulation Film Before UV Ray Cure | Film Thickness (nm) | 180 | | |
| | Refractive Index | 1.28 | | |
| | Elastic Modulus (Gpa) | 10 | | |
| | Hardness (Gpa) | 1 | | |
| | Cross-linking Percentage (%) | 65 | | |
| | Diameter of Pore (nm) | 0.7-1.4 | | |
| | Tensile Strength (kg/cm$^2$) | 523 | | |
| | Dielectric Constant | 2.3 | | |
| Dense Insulation Film | Kind of Dense Insulation Film | SiO$_2$ | SOG | None |
| | Film Thickness (nm) | 30 | 50 | — |
| Condition of UV Ray Cure | Kind of Lamp | Xenon Excimer Lamp | | |
| | Energy (eV) | 7.2 | | |
| | Substrate Temperature | 400 | | |

TABLE 4-2-continued

|  |  | Example 24 | Example 25 | Control 14 |
|---|---|---|---|---|
| Inter-layer Insulation Film After UV Ray Cure | Film Thickness (nm) | 175 | 176 | 163 |
|  | Refractive Index | 1.283 | 1.283 | 1.344 |
|  | Elastic Modulus (Gpa) | 13 | 13 | 15 |
|  | Hardness (GPa) | 1.2 | 1.2 | 1.4 |
|  | Cross-linking Percentage (%) | 75 | 76 | 80 |
|  | Diameter of Pore (nm) | 1.2-1.5 | 1.2-1.5 | 1.1-1.4 |
|  | Tensile Strength (kg/cm$^2$) | 652 | 665 | 672 |
|  | Dielectric Constant | 2.3 | 2.3 | 3.4 |

TABLE 4-3

|  |  | Example 26 | Example 27 | Control 15 |
|---|---|---|---|---|
| Inter-layer Insulation Film Before UV Ray Cure | Film Thickness (nm) |  | 180 |  |
|  | Refractive Index |  | 1.28 |  |
|  | Elastic Modulus (Gpa) |  | 10 |  |
|  | Hardness (Gpa) |  | 1 |  |
|  | Cross-linking Percentage (%) |  | 65 |  |
|  | Diameter of Pore (nm) |  | 0.7-1.4 |  |
|  | Tensile Strength (kg/cm$^2$) |  | 523 |  |
|  | Dielectric Constant |  | 2.3 |  |
| Dense Insulation Film | Kind of Dense Insulation Film | SiO$_2$ | SOG | None |
|  | Film Thickness (nm) | 30 | 50 | — |
| Condition of UV Ray Cure | Kind of Lamp |  | Low-pressure Mercury Lamp |  |
|  | Energy (eV) |  | 6.7 |  |
|  | Substrate Temperature |  | 400 |  |
| Inter-layer Insulation Film After UV Ray Cure | Film Thickness (nm) | 175 | 176 | 163 |
|  | Refractive Index | 1.283 | 1.283 | 1.344 |
|  | Elastic Modulus (Gpa) | 13 | 13 | 15 |
|  | Hardness (GPa) | 1.2 | 1.2 | 1.4 |
|  | Cross-linking Percentage (%) | 75 | 75 | 78 |
|  | Diameter of Pore (nm) | 1.2-1.5 | 1.2-1.5 | 1.1-1.4 |
|  | Tensile Strength (kg/cm$^2$) | 653 | 654 | 662 |
|  | Dielectric Constant | 2.3 | 2.3 | 3.4 |

Dense insulation films were formed on the porous inter-layer insulation films. The insulation films shown in TABLEs 4-1 to 4-3 were formed as the dense insulation films.

Next, with the dense insulation films formed on the porous inter-layer insulation films, UV rays were applied to the porous inter-layer insulation films through the dense insulation films (UV cure). The kind of the UV lump, and the energy of the UV rays and the substrate temperature were set as indicated in TABLEs 4-1 to 4-3.

The porous inter-layer insulation films thus cured with the UV rays were measured, and the result as shown in TABLEs 4-1 to 4-3 was obtained. As evident in TABLEs 4-1 to 4-3, in Examples 22 to 27, the refractive index of the inter-layer insulation films made substantially no change before and after the application of the UV rays. This means that even when any kind of UV lamp is used in applying the UV rays to the porous inter-layer insulation films through the dense insulation films, the inter-layer insulation films are not substantially shrunk, and the inter-layer insulation films can be of low density.

As evident in TABLEs 4-1 to 4-3, in Examples 22 to 27, sufficiently high modulus of elasticity and strength were obtained. As evident in TABLEs 4-1 to 4-3, in Examples 22 to 27, the effective dielectric constant is sufficiently small. These mean that even when any kind of UV lamp is used in applying the UV rays to the porous inter-layer insulation films through the dense insulation films, the inter-layer insulation films can have good mechanical strength and low dielectric constant.

As evident in TABLEs 4-1 to 4-3, in Examples 22 to 27, the inter-layer insulation films had relatively small dispersions of the size of the pores. This means that even when any kind of UV lamp is used in applying the UV rays to the porous inter-layer insulation films through the dense insulation films, the dispersions of the pores can be made small.

As evident in TABLEs 4-1 to 4-3, in Examples 22 to 27, relatively high density can be obtained. This means that even when any kind of UV lamp is used in applying the UV rays to the porous inter-layer insulation films through the dense insulation films, the inter-layer insulation films can have high tensile strength with respect to the base.

[Controls 13 to 15]

In the same way as in, e.g., Examples 1 to 6, porous inter-layer insulation films were prepared by preparing insulation film materials (porous silica precursors), applying the insulation film materials to silicon wafers and making thermal processing (soft bake).

Then, UV rays were applied to the porous inter-layer insulation films without dense insulation films formed on the porous inter-layer insulation films (UV cure). The kind of the UV lamp, the energy of the UV rays and the substrate temperature were set as shown in TABLEs 4-1 to 4-3.

The thus UV cured porous inter-layer insulation films were measured, and the result as shown in TABLEs 4-1 to 4-3 was given. In Controls 13 to 15, the refractive index was relatively high. This means that even when any kind of UV lamp is used in applying the UV rays to the porous inter-layer insulation films without the dense insulation films formed on the porous inter-layer insulation films, the inter-layer insulation films were excessively shrunk and had densities increased. As evident in TABLEs 4-1 to 4-3, in Controls 13 to 15, the effective dielectric constant was high.

Examples 28 to 34

First, in the same way as in Examples 1 to 6, the porous inter-layer insulation films were prepared by preparing the insulation film materials (porous silica precursors), applying the insulation film materials to silicon wafers and making thermal processing (soft bake).

The thus-prepared porous inter-layer insulation films were measured, and the result as shown in TABLEs 5-1 to 5-3 was obtained.

TABLE 5-1

|  |  | Example 28 | Example 29 | Example 30 | Example 31 |
|---|---|---|---|---|---|
| Inter-layer Insulation Film | Film Thickness (nm) |  | 180 |  |  |
|  | Refractive Index |  | 1.28 |  |  |

TABLE 5-1-continued

|  |  | Example 28 | Example 29 | Example 30 | Example 31 |
|---|---|---|---|---|---|
| Before Plasma Cure | Elastic Modulus (Gpa) | 10 | | | |
| | Hardness (Gpa) | 1 | | | |
| | Cross-linking Percentage (%) | 65 | | | |
| | Diameter of Pore (nm) | 0.7-1.4 | | | |
| | Tensile Strength (kg/cm$^2$) | 523 | | | |
| | Dielectric Constant | 2.3 | | | |
| Dense Insulation Film | Kind of Dense Insulation Film | SiO$_2$ | SOG | SiO$_2$ | SOG |
| | Film Thickness (nm) | 30 | 50 | 60 | 70 |
| Condition of Plasma Cure | Kind of Plasma | H$_2$ | | | |
| | Irradiation Energy (eV) | 4.5 | 9 | 18 | 36 |
| | Substrate Temperature | 400 | | | |
| Inter-layer Insulation Film After Plasma Cure | Film Thickness (nm) | 175 | 176 | 175 | 174 |
| | Refractive Index | 1.283 | 1.283 | 1.283 | 1.283 |
| | Elastic Modulus (Gpa) | 13 | 12 | 13 | 13 |
| | Hardness (GPa) | 1.2 | 1.2 | 1.2 | 1.2 |
| | Cross-linking Percentage (%) | 72 | 72 | 73 | 75 |
| | Diameter of Pore (nm) | 1.0-1.4 | 1.1-1.4 | 1.1-1.4 | 1.1-1.4 |
| | Tensile Strength (kg/cm$^2$) | 631 | 634 | 642 | 650 |
| | Dielectric Constant | 2.3 | 2.3 | 2.3 | 2.3 |

TABLE 5-2

|  |  | Example 32 | Example 33 | Example 34 |
|---|---|---|---|---|
| Inter-layer Insulation Film Before Plasma Cure | Film Thickness (nm) | 180 | | |
| | Refractive Index | 1.28 | | |
| | Elastic Modulus (Gpa) | 10 | | |
| | Hardness (Gpa) | 1 | | |
| | Cross-linking Percentage (%) | 65 | | |
| | Diameter of Pore (nm) | 0.7-1.4 | | |
| | Tensile Strength (kg/cm$^2$) | 523 | | |
| | Dielectric Constant | 2.3 | | |
| Dense Insulation Film | Kind of Dense Insulation Film | SOG | SOG | SOG |
| | Film Thickness (nm) | 70 | 70 | 70 |
| Condition of Plasma Cure | Kind of Plasma | H$_2$ | | |
| | Irradiation Energy (eV) | 54 | 72 | 90 |
| | Substrate Temperature | 400 | | |
| Inter-layer Insulation Film After Plasma Cure | Film Thickness (nm) | 174 | 173 | 174 |
| | Refractive Index | 1.283 | 1.282 | 1.282 |
| | Elastic Modulus (Gpa) | 14 | 14 | 15 |
| | Hardness (GPa) | 1.2 | 1.3 | 1.3 |
| | Cross-linking Percentage (%) | 77 | 77 | 77 |
| | Diameter of Pore (nm) | 1.2-1.5 | 1.2-1.5 | 1.2-1.5 |
| | Tensile Strength (kg/cm$^2$) | 655 | 649 | 652 |
| | Dielectric Constant | 2.3 | 2.32 | 2.32 |

TABLE 5-3

|  |  | Control 16 | Control 17 | Control 18 | Control 19 |
|---|---|---|---|---|---|
| Inter-layer Insulation Film Before Plasma Cure | Film Thickness (nm) | 180 | | | |
| | Refractive Index | 1.28 | | | |
| | Elastic Modulus (Gpa) | 10 | | | |
| | Hardness (Gpa) | 1 | | | |
| | Cross-linking Percentage (%) | 65 | | | |
| | Diameter of Pore (nm) | 0.7-1.4 | | | |
| | Tensile Strength (kg/cm$^2$) | 523 | | | |
| | Dielectric Constant | 2.3 | | | |
| Dense Insulation Film | Kind of Dense Insulation Film | SOG | SOG | SOG | None |
| | Film Thickness (nm) | 70 | 70 | 70 | — |
| Condition of Plasma Cure | Kind of Plasma | H$_2$ | | | |
| | Irradiation Energy (eV) | 110 | 120 | 0.5 | 18 |
| | Substrate Temperature | 400 | | | |
| Inter-layer Insulation Film | Film Thickness (nm) | 170 | 170 | 178 | 150 |
| | Refractive Index | 1.301 | 1.301 | 1.28 | 1.354 |

TABLE 5-3-continued

|  |  | Control 16 | Control 17 | Control 18 | Control 19 |
|---|---|---|---|---|---|
| After Plasma Cure | Elastic Modulus (Gpa) | 16 | 16 | 10 | 17 |
|  | Hardness (GPa) | 1.3 | 1.3 | 1 | 1.5 |
|  | Cross-linking Percentage (%) | 80 | 80 | 68 | 82 |
|  | Diameter of Pore (nm) | 1.1-1.3 | 1.1-1.3 | 0.7-1.4 | 0.5-0.6 |
|  | Tensile Strength (kg/cm$^2$) | 660 | 660 | 550 | 655 |
|  | Dielectric Constant | 2.7 | 2.7 | 2.3 | 3.5 |

Next, dense insulation films were formed on the porous inter-layer insulation films. As the dense insulation films, the insulation films as shown in TABLEs 5-1 to 5-3 were formed.

Then, with the dense insulation films formed on the porous inter-layer insulation films, plasmas were applied to the porous inter-layer insulation film through the dense insulation films (plasma cure). As the reactive gas for generating the plasmas, hydrogen gas was used as shown in TABLEs 5-1 to 5-3. The application energy of the plasmas was set at 1-100 eV as shown in TABLEs 5-1 to 5-3. The temperature of substrates was set as shown in TABLEs 5-1 to 5-3.

The thus plasma cured porous inter-layer insulation films were measured, and the result as shown in TABLEs 5-1 to 5-3 was given. As evident in TABLEs 5-1 to 5-3, in Examples 28 to 34, the refractive index of the inter-layer insulation films did not substantially change before and after the application of the plasmas. This means that the application energy of the plasmas for applying the plasmas to the porous inter-layer insulation film through the dense insulate films is set at 1-100 eV, whereby the inter-layer insulation films are not excessively shrunk. That is, it is seen that in Examples 28 to 34, the inter-layer insulation films of low density can be obtained without being excessively shrunk.

As evident in TABLEs.5-1 to 5-3, in Examples 28 to 34, sufficiently high modulus of elasticity and strength were obtained. As evident in TABLEs 5-1 to 5-3, in Examples 28 to 34, the effective dielectric constant is sufficiently small. This means that the application energy of the plasmas is set at 1-100 eV for the application of the plasmas to the porous inter-layer insulation film through the dense insulation films, whereby the inter-layer insulation films can have good mechanical strength and low dielectric constant.

As evident in TABLEs 5-1 to 5-3, in Examples 28 to 34, the inter-layer insulation films had relatively small dispersion of the size of the pores. This means that the application energy of the plasmas for applying the plasmas to the porous inter-layer insulation films through the dense insulation films is set at 1-100 eV, whereby the dispersion of the size of the pores can be made small.

As evident in TABLEs 5-1 to 5-3, in Examples 28 to 34, relatively high tensile strength was obtained. This means that the application energy of the plasmas for applying the plasmas to the porous inter-layer insulation film through the dense insulation films is set at 1-100 eV, whereby the inter-layer insulation films having high tensile strength with respect to the base can be formed.

[Controls 16 and 17]

First, in the same way as in Examples 1 to 6, the porous inter-layer insulation films were prepared by preparing insulation film materials (porous silica precursors), applying the insulation film materials to silicon wafers and making thermal processing (soft bake).

Next, dense insulation films were formed on the porous inter-layer insulation films. As the dense insulation films, the insulation films as shown in TABLEs 5-1 to 5-3 were formed.

Then, with the dense insulation films formed on the porous inter-layer insulation films, plasmas were applied to the porous inter-layer insulation films through the dense insulation films (plasma cure). As the reactive gas for generating the plasmas, hydrogen gas was used as shown in TABLEs 5-1 to 5-3. The application energy of the plasmas was set as shown in TABLEs 5-1 to 5-3. That is, in Control 16, the plasma application energy was set at 110 eV, and in Control 17, the plasma application energy, 120 eV. The substrate temperature was set as shown in TABLEs 5-1 to 5-3.

The thus cured porous inter-layer insulation films were measured, and the result as shown in TABLEs 5-1 to 5-3 was given. As evident in TABLEs 5-1 to 5-3, in Controls 16 and 17, the refractive index was relatively high. This means that when the application energy of the plasmas is above 100 eV, the porous inter-layer insulation films were excessively shrunk, and the density of the porous inter-layer insulation films becomes high.

As evident in TABLEs 5-1 to 5-3, in Controls 16 and 17, the effective dielectric constant was high. This means that when the application energy of the plasmas is above 100 eV, the porous inter-layer insulation films are excessively shrunk, and the effective dielectric constant becomes high.

[Control 18]

First, in the same way as in Examples 1 to 6, a porous inter-layer insulation film was prepared by preparing an insulation film material (porous silica precursor), applying the insulation film material to a silicon wafer and making thermal processing (soft bake).

Then, a dense insulation film was formed on the porous inter-layer insulation film. As the dense insulation film, the insulation film as shown in TABLEs 5-1 to 5-3 was formed.

Then, with the dense insulation film formed on the porous inter-layer insulation film, the plasmas were applied to the porous inter-layer insulation film through the dense insulation film (plasma cure). As the reactive gas for generating the plasmas, hydrogen gas was used as shown in TABLEs 5-1 to 5-3. The application energy of the plasmas was set at 0.5 eV as shown in TABLEs 5-1 to 5-3. The substrate temperature was set as shown in TABLEs 5-1 to 5-3.

The thus plasma cured porous inter-layer insulation film was measured, and the result as shown in TABLEs 5-1 to 5-3 was given. As evident in TABLEs 5-1 to 5-3, in Control 18, the dispersion of the size of the pores were relatively large. This means that when the application energy of the plasmas is below 1 eV, the cross-linking reaction in the porous inter-layer insulation film does not sufficiently advances, and pores whose sizes have not sufficiently increased are present.

As evident in TABLEs 5-1 to 5-3, in Control 18, the tensile strength was low. This means that when the application energy of the plasmas is below 1 eV, the porous inter-layer insulation film cannot be sufficiently cured.

[Control 19]

First in the same way as in Examples 1 to 6, a porous inter-layer insulation film was formed by preparing an insulation film material (porous silica precursor), applying the insulation film material to a silicon wafer and making thermal processing (soft bake).

Then, plasmas were applied to the porous inter-layer insulation film without forming a dense insulation film on the porous inter-layer insulation film (plasma cure). As the reactive gas for generating the plasmas, as shown in TABLEs 5-1 to 5-3, hydrogen gas was used. The application energy of the plasmas and the substrate temperature were set as shown in TABLEs 5-1 to 5-3.

The thus plasma cured porous inter-layer insulation film was measured, and the result as shown in FIG. 5 was given. As evident in TABLEs 5-1 to 5-3, in Control 19, the sizes of pores was small. This means that when the plasmas are applied to the porous inter-layer insulation film without forming the dense insulation film on the porous inter-layer insulation film, the porous inter-layer insulation film is excessively shrunk to decrease the sizes of the pores, and the density of the porous inter-layer insulation film increased.

As evident in TABLEs 5-1 to 5-3, in Control 19, the effective dielectric constant was high. This means that when the plasmas are applied to the porous inter-layer insulation film without forming a dense insulation film on the porous inter-layer insulation film, the porous inter-layer insulation film is excessively shrunk, and the effective dielectric constant is increased.

[Controls 35 to 41]

In the same way as in Examples 1 to 6, porous inter-layer insulation films were prepared by preparing insulation film materials (porous silica precursors), applying the insulation film materials to silicon wafers and making thermal processing (soft bake).

The thus formed porous inter-layer insulation films were measured, and the result as shown in TABLEs 6-1 to 6-3 was given.

TABLE 6-1

| | | Example 35 | Example 36 | Example 37 | Example 38 |
|---|---|---|---|---|---|
| Inter-layer Insulation Film Before Plasma Cure | Film Thickness (nm) | 180 | | | |
| | Refractive Index | 1.28 | | | |
| | Elastic Modulus (Gpa) | 10 | | | |
| | Hardness (Gpa) | 1 | | | |
| | Cross-linking Percentage (%) | 65 | | | |
| | Diameter of Pore (nm) | 0.7-1.4 | | | |
| | Tensile Strength (kg/cm$^2$) | 523 | | | |
| | Dielectric Constant | 2.3 | | | |
| Dense Insulation Film | Kind of Dense Insulation Film | SiO$_2$ | SOG | SiO$_2$ | SOG |
| | Film Thickness (nm) | 30 | 50 | 60 | 70 |
| Condition of Plasma Cure | Kind of Plasma | O$_2$ | | | |
| | Irradiation Energy (eV) | 4.5 | 9 | 18 | 36 |
| | Substrate Temperature | 400 | | | |
| Inter-layer Insulation Film After Plasma Cure | Film Thickness (nm) | 176 | 174 | 175 | 174 |
| | Refractive Index | 1.283 | 1.282 | 1.283 | 1.282 |
| | Elastic Modulus (Gpa) | 12 | 12 | 13 | 13 |
| | Hardness (GPa) | 1.2 | 1.2 | 1.2 | 1.2 |
| | Cross-linking Percentage (%) | 73 | 73 | 74 | 75 |
| | Diameter of Pore (nm) | 1.0-1.4 | 1.1-1.4 | 1.1-1.4 | 1.1-1.4 |
| | Tensile Strength (kg/cm$^2$) | 629 | 632 | 640 | 654 |
| | Dielectric Constant | 2.3 | 2.3 | 2.3 | 2.3 |

TABLE 6-2

| | | Example 39 | Example 40 | Example 41 |
|---|---|---|---|---|
| Inter-layer Insulation Film Before Plasma Cure | Film Thickness (nm) | 180 | | |
| | Refractive Index | 1.28 | | |
| | Elastic Modulus (Gpa) | 10 | | |
| | Hardness (Gpa) | 1 | | |
| | Cross-linking Percentage (%) | 65 | | |
| | Diameter of Pore (nm) | 0.7-1.4 | | |
| | Tensile Strength (kg/cm$^2$) | 523 | | |
| | Dielectric Constant | 2.3 | | |
| Dense Insulation Film | Kind of Dense Insulation Film | SOG | SOG | SOG |
| | Film Thickness (nm) | 70 | 70 | 70 |
| Condition of Plasma Cure | Kind of Plasma | O$_2$ | | |
| | Irradiation Energy (eV) | 54 | 72 | 90 |
| | Substrate Temperature | 400 | | |
| Inter-layer Insulation Film After Plasma Cure | Film Thickness (nm) | 173 | 173 | 172 |
| | Refractive Index | 1.283 | 1.283 | 1.283 |
| | Elastic Modulus (Gpa) | 14 | 14 | 14 |
| | Hardness (GPa) | 1.2 | 1.3 | 1.3 |
| | Cross-linking Percentage (%) | 77 | 77 | 77 |
| | Diameter of Pore (nm) | 1.2-1.4 | 1.2-1.4 | 1.1-1.3 |
| | Tensile Strength (kg/cm$^2$) | 662 | 655 | 670 |
| | Dielectric Constant | 2.3 | 2.31 | 2.32 |

TABLE 6-3

|  |  | Control 20 | Control 21 | Control 22 | Control 23 |
|---|---|---|---|---|---|
| Inter-layer Insulation Film Before Plasma Cure | Film Thickness (nm) | | | 180 | |
| | Refractive Index | | | 1.28 | |
| | Elastic Modulus (Gpa) | | | 10 | |
| | Hardness (Gpa) | | | 1 | |
| | Cross-linking Percentage (%) | | | 65 | |
| | Diameter of Pore (nm) | | | 0.7-1.4 | |
| | Tensile Strength (kg/cm$^2$) | | | 523 | |
| | Dielectric Constant | | | 2.3 | |
| Dense Insulation Film | Kind of Dense Insulation Film | SOG | SOG | SOG | None |
| | Film Thickness (nm) | 70 | 70 | 70 | — |
| Condition of Plasma Cure | Kind of Plasma | | | O$_2$ | |
| | Irradiation Energy (eV) | 110 | 120 | 0.5 | 18 |
| | Substrate Temperature | | | 400 | |
| Inter-layer Insulation Film After Plasma Cure | Film Thickness (nm) | 170 | 170 | 177 | 148 |
| | Refractive Index | 1.312 | 1.322 | 1.28 | 1.356 |
| | Elastic Modulus (Gpa) | 15 | 16 | 10 | 17 |
| | Hardness (GPa) | 1.2 | 1.3 | 2 | 1.5 |
| | Cross-linking Percentage (%) | 80 | 82 | 69 | 84 |
| | Diameter of Pore (nm) | 1.1-1.3 | 1.1-1.3 | 0.7-1.4 | 0.5-0.7 |
| | Tensile Strength (kg/cm$^2$) | 674 | 672 | 556 | 660 |
| | Dielectric Constant | 2.8 | 2.8 | 2.3 | 3.6 |

Next, dense insulation films were formed on the porous inter-layer insulation films. As the dense insulation films, the insulation films as shown in TABLEs 6-1 to 6-3 were formed.

Then, with the dense insulation films formed on the porous inter-layer insulation film, plasmas were applied to the porous inter-layer insulation film through the dense insulation film (plasma cure). As the reactive gas for generating the plasmas, oxygen gas was used as shown in TABLEs 6-1 to 6-3. The application energy of the plasmas and the substrate temperature were set as shown in TABLEs 6-1 to 6-3.

The thus plasma cured porous inter-layer insulation films measured, and the result as shown in TABLEs 6-1 to 6-3 was given. As evident in TABLEs 6-1 to 6-3, in Examples 35 to 41, the refractive index of the inter-layer insulation film did not substantially change before and after the application of the plasmas. This means that when the plasmas are applied to the porous inter-layer insulation films through the dense insulation films, the application energy of the plasmas is set at 1-100 eV, whereby the inter-layer insulation films are not excessively shrunk. That is, it is seen that in Examples 35 to 41, the inter-layer insulation films of low density can be formed without being excessively shrunk.

As evident in TABLEs 6-1 to 6-3, in Examples 35 to 41, sufficiently high modulus of elasticity and strength were obtained. As evident in TABLEs 6-1 to 6-3, in Examples 35 to 41, the effective dielectric constant was sufficiently low. This means that when the plasmas are applied to the porous inter-layer insulation films through the dense insulation films, the application energy of the plasmas is set 1-100 eV, whereby the inter-layer insulation film can have good mechanical strength and low dielectric constant.

As evident in TABLEs 6-1 to 6-3, in Examples 35 to 41, the inter-layer insulation films had relatively small dispersion of the size of the pores. This means that when the plasmas are applied to the porous inter-layer insulation films through the dense insulation films, the application energy of the plasmas is set at 1-100 eV, whereby the dispersion of the size of the pores can be made small.

As evident in TABLEs 6-1 to 6-3, in Examples 35 to 41, relatively high tensile strength was obtained. This means that when the plasmas are applied to the porous inter-layer insulation films through the dense insulation films, the application energy of the plasmas is set at 1-100 eV, whereby the inter-layer insulation film can have high tensile strength with respect to the base.

[Controls 20 and 21]

First, in the same way as in Examples 1 to 6, porous inter-layer insulation films were formed by preparing insulation film materials (porous silica precursors), applying the insulation film materials to silicon wafers and making thermal processing (soft bake).

Then, dense insulation films were formed on the porous inter-layer insulation films. As the dense insulation films, the insulation films as shown in TABLEs 6-1 to 6-3 were formed.

Then, with the dense insulation films formed on the porous inter-layer insulation films, plasmas were applied to the porous inter-layer insulation films through the dense insulation film (plasma cure). As the reactive gas for generating the plasmas, oxygen gas was used as shown in TABLEs 6-1 to 6-3. The application energy of the plasmas was set as shown in TABLEs 6-1 to 6-3. That is, in Control 20, the plasma application energy was set at 110 eV, and in Control 21, the plasma application energy was set at 120 eV. The substrate temperature was set as shown in TABLEs 6-1 to 6-3.

The thus plasma cured porous inter-layer insulation films were measured, and the result as shown in TABLEs 6-1 to 6-3 was given. As evident in TABLEs 6-1 to 6-3, in Controls 20 and 21, the refractive index was relatively high. This means that when the application energy of the plasmas is above 100 eV, the porous inter-layer insulation films are excessively shrunk, and the density of the porous inter-layer insulation films is increased.

As evident in TABLEs 6-1 to 6-3, in Controls 20 and 21, the effective dielectric constant was high. This means that when the application energy of the plasmas is above 100 eV, the inter-layer insulation films are excessively shrunk, and the effective dielectric constant is increased.

[Control 22]

First, in the same way as in Examples 1 to 6, porous inter-layer insulation films were formed by preparing insulation film materials (porous silica precursors), applying the insulation film materials to silicon wafer and making thermal processing (soft bake).

Then, dense insulation films were formed on the porous inter-layer insulation films. As the dense insulation films, the insulation films as shown in TABLEs 6-1 to 6-3 were formed.

Then, with the dense insulation films formed on the porous inter-layer insulation films, plasmas were applied to the porous inter-layer insulation films through the dense insulation films (plasma cure). As the reactive gas for generating the plasmas, as shown in FIG. 6, oxygen gas was used. The application energy of the plasmas and the substrate temperature were set as shown in TABLEs 6-1 to 6-3.

The thus plasma cured porous inter-layer insulation films were measured, and the result as shown in TABLEs 6-1 to 6-3 was given. As evident in TABLEs 6-1 to 6-3, in Control 22, the dispersion of the size of the pores were relatively large. This means that when the application energy of the plasmas is below 1 eV, the cross-linking reaction in the porous inter-layer insulation films does not sufficiently advances, and the pores whose sizes have not sufficiently increased are present.

As evident in TABLEs 6-1 to 6-3, in Control 18, the tensile strength was low. This means that when the application energy of the plasmas is below 1 eV, the porous inter-layer insulation film cannot be sufficiently cured.

[Control 23]

First, in the same way as in Examples 1 to 6, a porous inter-layer insulation film was formed by preparing an insulation film material (porous silica precursor), applying the insulation film material to a silicon wafer and making thermal processing (soft bake).

Next, plasmas were applied to the porous inter-layer insulation film without forming a dense insulation film on the porous inter-layer insulation film (plasma cure). As the reactive gas for generating the plasmas, as shown in TABLEs 6-1 to 6-3, oxygen gas was used. The application energy of the plasmas and the substrate temperature were set as shown in TABLEs 6-1 to 6-3.

The thus plasma cured porous inter-layer insulation film was measured, and the result as shown in TABLEs 6-1 to 6-3 was given. As evident in TABLEs 6-1 to 6-3, in Control 23, the sizes of the pores were small. This means that when the plasmas are applied to the porous inter-layer insulation film without forming the dense insulation film on the porous inter-layer insulation film, the porous inter-layer insulation film is excessively shrunk to decrease the sizes of the pores, and the density of the porous inter-layer insulation film is increased.

As evident in TABLEs 6-1 to 6-3, in Control 23, the effective dielectric constant was high. This means that when the plasmas are applied to the porous inter-layer insulation film without forming the dense insulation film on the porous inter-layer insulation film, the porous inter-layer insulation film is excessively shrunk, and the effective dielectric constant is increased.

Example 42

First, in the same way as in Example 19, a transistor 24 was fabricated (see FIG. 1A), an inter-layer insulation film 26 and a stopper film 28 are formed (see FIG. 1B). Then, a conductor plug 34 is buried in a contact hole 30 (see FIG. 1C).

Next, in the same way as in Example 19, an insulation film 36 is formed, and then, a porous inter-layer insulation film 38 was formed (see FIG. 2A).

Next, in the same way as in Example 19, a dense insulation film 40 was formed o the porous inter-layer insulation film 38 (see FIG. 2B).

Then, with the dense insulation film 40 formed on the porous inter-layer insulation film 38, UV rays were applied to the inter-layer insulation film 38 through the insulation film 40 (UV cure). Conditions for applying the UV rays to the inter-layer insulation film 38 through the insulation film 40 are the same as in Example 22.

Then, in the same way as in Example 19, a trench 46 is formed in the insulation film 40, the porous inter-layer insulation film 38 and the insulation film 36 (see FIG. 3A).

Next, in the same way as in Example 19, an interconnection 50 was buried in the insulation film 36, the inter-layer insulation film 38 and the insulation film 40. Next, in the same way as in Example 19, an insulation film 52 was formed (see FIG. 3B).

Then, in the same way as in Example 19, a porous inter-layer insulation film 54 was formed. Then, in the same way as in Example 19, a dense insulation film 56 was formed on the porous inter-layer insulation film 54 (see FIG. 4A).

Next, with the dense insulation film 56 formed on the porous inter-layer insulation film 54, UV rays were applied to the inter-layer insulation film 54 through the insulation film 56 (UV cure). Conditions for applying the UV rays to the inter-layer insulation film 54 through the insulation film 56 were the same as in Example 22.

Then, in the same way as in Example 19, a porous inter-layer insulation film 58 was formed. Then, in the same way as in Example 19, a dense insulation film 60 was formed on the porous inter-layer insulation film 58 (see FIG. 5A).

Next, with the dense insulation film 60 formed on the porous inter-layer insulation film 58, UV rays were applied to the inter-layer insulation film 58 through the insulation film (UV cure). Conditions for applying the UV rays to the porous inter-layer insulation film 58 through the insulation film 60 were the same as in example 22 (see FIG. 5B).

Next, in the same way as in Example 19, a contact hole 60 is formed in the insulation film 60, the inter-layer insulation film 58, the insulation film 56, the inter-layer insulation film 54 and the insulation film 52 (see FIG. 6).

Then, in the same way as in Example 19, a trench 72 is formed in the insulation film 60, the inter-layer insulation film 58 and the insulation film 56 (see FIG. 7).

Then, in the same way as in Example 19, an interconnection 76a is buried in the trench 72 while a conductor plug 76b was buried in the contact hole 66. Next, in the same way as in Example 19, an insulation film 78 was formed (see FIG. 8). Then, the same steps as above were repeated to thereby form the third layer interconnection.

The thus fabricated semiconductor device had interconnections and conductor plugs formed, electrically connected serially to one million conductor plugs, and the yield was measured. The yield was 90%. The effective dielectric constant between the interconnections was computed, and the effective dielectric constant was 2.6. The resistance of the interconnections was measured after left at 200° C. for 3000 hours, and no resistance rise was confirmed.

[Control 24]

Figure 9C:
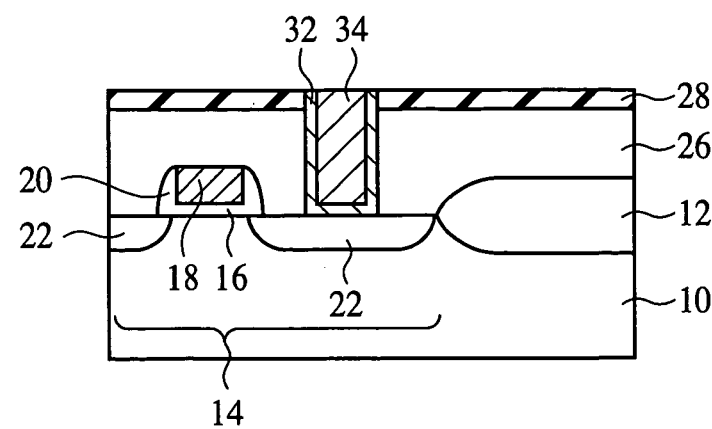

First, in the same way as in Example 19, a transistor 24 was fabricated (see FIG. 9A), an inter-layer insulation film 26 and a stopper film 28 were formed (see FIG. 9B), and a conductor plug 34 was buried in a contact hole 30 (see FIG. 9C).

Next, in the same way as in Example 19, an insulation film 36 was formed, and then a porous inter-layer insulation film 38 was formed (see FIG. 10A).

Next, without a dense insulation film formed on the porous inter-layer insulation film 38, UV rays were applied to the porous inter-layer insulation film 38 (UV cure). Conditions for applying the UV rays were the same as in Control 13 (see FIG. 10B).

Next, an insulation film 40 of a 30 nm-thickness silicon oxide film was formed on the entire surface by plasma-enhanced CVD (see FIG. 10C).

Next, in the same way as in Example 19, a trench 46 was formed in the insulation film 40, the porous inter-layer insulation film 38 and the insulation film 36 (see FIG. 11A). Then, in the same way as in Example 19, an interconnection 50 was buried in the insulation film 40, the inter-layer insulation film 38 and the insulation film 36. Then, in the same way as in Example 19, an insulation film 52 was formed (see FIG. 11B).

Next, in the same way as in Example 19, a porous inter-layer insulation film 54 was formed (see FIG. 12A). Then, without a dense insulation film formed on the porous inter-layer insulation film 54, UV rays were applied to the porous inter-layer insulation film 54 (UV cure). Conditions for applying the UV rays were the same as in Control 13 (see FIG. 12B).

Next, an insulation film 56 of a 30 nm-thickness SiC:O:H film on the entire surface (see FIG. 13A).

Then, in the same way as in Example 19, a porous inter-layer insulation film 58 was formed (see FIG. 13B).

Next, without a dense insulation film formed on the porous inter-layer insulation film 58, UV rays were applied to the porous inter-layer insulation film 58 (UV cure). Conditions for applying the UV rays were the same as in Control 13 (see FIG. 14A).

Next, an insulation film 60 of a 30 nm-thickness silicon oxide film was formed on the entire surface by plasma CVD (see FIG. 14B).

Next, in the same way as in Example 19, a conductor plug 76b and an interconnection 76a were buried in the inter-layer insulation films 54, 58, etc. by dual damascene. Then, in the same way as in Example 19, an insulation film 78 was formed (see FIG. 15). Then, the same steps as above were repeated to thereby form the third layer interconnection.

The thus fabricated semiconductor device had interconnections and conductor plugs formed, electrically connected serially to one million conductor plugs, and the yield was measured. The yield was 34%. The effective dielectric constant between the interconnections was computed, and the effective dielectric constant was 3.8. The resistance of the interconnections was measured after left at 200° C. for 3000 hours, and resistance rise was confirmed.

Example 43

Figure 1C:
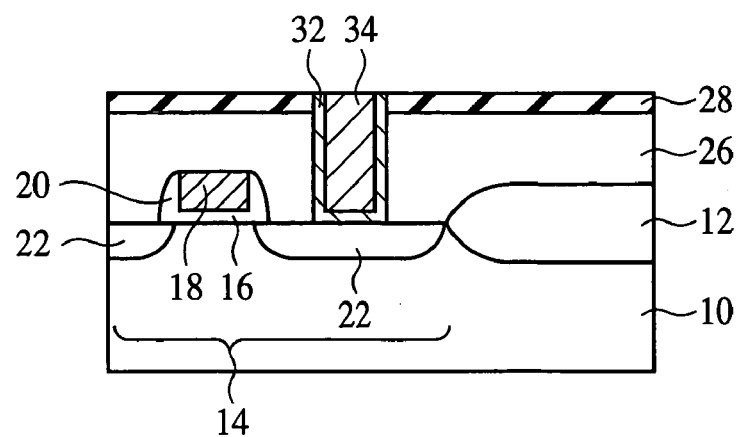

First, in the same way as in Example 19, a transistor 24 was fabricated (see FIG. 1A), an inter-layer insulation film 26 and a stopper film 28 were formed (see FIG. 1B), and then a conductor plug 34 was buried in a contact hole 30 (see FIG. 1C).

Next, in the same way as in Example 19, an insulation film 36 was formed, and then a porous inter-layer insulation film 38 was formed (see FIG. 2A).

Next, in the same way as in Example 19, a dense insulation film 40 was formed on the porous inter-layer insulation film 38 (see FIG. 2B).

Then, with the dense insulation film 40 present on the porous inter-layer insulation film 38, plasmas were applied to the inter-layer insulation film 38 through the insulation film 40 (plasma cure). Conditions for applying the plasmas to the inter-layer insulation film 38 through the insulation film 40 were the same as in Example 29.

Next, in the same way as in Example 19, a trench 46 was formed in the insulation film 40, the porous inter-layer insulation film 38 and the insulation film 36 (see FIG. 3A).

Next, in the same way as in Example 19, an interconnection 50 was buried in the insulation film 36, the inter-layer insulation film 38 and the insulation film 40. Then, in the same was as in Example 19, an insulation film 52 was formed (see FIG. 3B).

Then, in the same way as in Example 19, a porous inter-layer insulation film 54 was formed. Then, in the same way as in Example 19, a dense insulation film 56 was formed on the porous inter-layer insulation film 54 (see FIG. 4A).

Then, with the dense insulation film 56 present on the porous inter-layer insulation film 54, plasmas were applied to the inter-layer insulation film 54 through the insulation film 56 (plasma cure). Conditions for applying the plasmas to the inter-layer insulation film 54 through the insulation film 56 were the same as in Example 29.

Next, in the same way as in Example 19, a porous inter-layer insulation film 58 was formed. Then, in the same way as in Example 19, a dense insulation film 60 was formed on the porous inter-layer insulation film 58 (see FIG. 5A).

Then, with the dense insulation film 60 present on the porous inter-layer insulation film 58, plasmas were applied to the inter-layer insulation film 58 through the insulation film 60 were the same as in Example 29 (see FIG. 5B).

Next, in the same way as in Example 19, a contact hole 66 was formed in the insulation film 60, the inter-layer insulation film 58, the insulation film 56, the inter-layer insulation film 54 and the insulation film 52 (see FIG. 6).

Then, in the same way as in Example 19, a trench 72 was formed in the insulation film 60, the inter-layer insulation film 58 and the insulation film 56 (see FIG. 7).

Next, in the same way as in Example 19, an interconnection 76a was buried in the trench 72 while a conductor plug 76b was buried it he contact hole 66. Next, in the same way as in Example 19, an insulation film 78 was formed (see FIG. 8). Then, the same steps as above were repeated to thereby form the third layer interconnection.

The thus fabricated semiconductor device had interconnections and conductor plugs formed, electrically connected serially to one million conductor plugs, and the yield was measured. The yield was 92%. The effective dielectric constant between the interconnections was computed, and the effective dielectric constant was 2.57. The resistance of the interconnections was measured after left at 200° C. for 3000 hours, and no resistance rise was confirmed.

[Control 25]

First, in the same way as in Example 19, a transistor 24 was fabricated (see FIG. 1a), an inter-layer insulation film 26 and a stopper film 28 were formed (see FIG. 1B), and then a conductor plug 34 was buried in a contact hole 30 (see FIG. 1C).

Next, in the same way as in Example 19, an insulation film 36 was formed, and then a porous inter-layer insulation film 38 was formed (see FIG. 2A).

Next, in the same way as in Example 19, a dense insulation film 40 was formed on the porous inter-layer insulation film 38 (see FIG. 2B).

Next, with the dense insulation film 40 formed on the porous inter-layer insulation film 38, plasmas were applied to the inter-layer insulation film 38 through the insulation film 40 (plasma cure). Conditions for applying the plasmas to the inter-layer insulation film 38 through the insulation film 40 were the same was those in Control 16.

Next, in the same way as in Example 19, a trench 46 was formed in the insulation film 40, the porous inter-layer insulation film 38 and the insulation film 36 (see FIG. 3A).

Next, in the same way as in Example 19, an interconnection 50 was buried in the insulation film 36, the inter-layer insulation film 38 and the insulation film 40. Then, in the same way as in Example 19, an insulation film 52 was formed (see FIG. 3B).

Next, in the same way as in Example 19, a porous inter-layer insulation film 54 was formed. Next, in the same way as in Example 19, a dense insulation film 56 was formed on the porous inter-layer insulation film 54 (see FIG. 4A).

Next, with the dense insulation film 56 present on the porous inter-layer insulation film 54, plasmas were applied to the inter-layer insulation film 54 through the insulation film 56 (plasma cure). Conditions for applying the plasmas to the inter-layer insulation film 54 through the insulation film 56 were the same as in Control 16.

Next, in the same way as in Example 19, a porous inter-layer insulation film 58 was formed. Then, in the same way as in Example 19, a dense insulation film 60 was formed on the porous inter-layer insulation film 58 (see FIG. 5A).

Next, with the dense insulation film 60 present on the porous inter-layer insulation film 58, plasmas were applied to the inter-layer insulation film 58 through the insulation film 60 (plasma cure). Conditions for applying the plasmas to the inter-layer insulation film 58 through the insulation film 60 were the same as in Control 16 (see FIG. 5B).

Then, in the same way as in Example 19, a contact hole 66 was formed in the insulation film 60, the inter-layer insulation film 58, the insulation film 56, the inter-layer insulation film 54 and the insulation film 52 (see FIG. 6).

Next, in the same way as in Example 19, a trench 72 was formed in the insulation film 60, the inter-layer insulation film 58 and the insulation film 56 (see FIG. 7).

Then, in the same way as in Example 19, an interconnection 76a is buried in the trench 72 while a conductor plug 76b was buried in the contact hole 66. Then, in the same way as in Example 19, an insulation film 78 was formed (see FIG. 8). Then, the same steps as above were repeated to thereby form the third layer interconnection.

The thus fabricated semiconductor device had interconnections and conductor plugs formed, electrically connected serially to one million conductor plugs, and the yield was measured. The yield was 76%. The effective dielectric constant between the interconnections was computed, and the effective dielectric constant was 2.94. The resistance of the interconnections was measured after left at 200° C. for 3000 hours, and no resistance rise was confirmed.

[Control 26]

First, in the same way as in Example 19, a transistor 24 was fabricated (see FIG. 1A), an inter-layer insulation film 26 and a stopper film 28 were formed (see FIG. 1B), and a conductor plug 34 was buried in a contact hole 30 (see FIG. 1C).

Next, in the same way as in Example 19, an insulation film 36 was formed, and then a porous inter-layer insulation film 36 was formed (see FIG. 2A).

Next, in the same way as in Example 19, a dense insulation film 40 was formed on the porous inter-layer insulation film 38 (see FIG. 2B).

Then, with the dense insulation film 40 present on the porous inter-layer insulation film 38, plasmas were applied to the inter-layer insulation film 38 through the insulation film 40 (plasma cure). Conditions for applying the plasmas to the inter-layer insulation film 38 through the insulation film 40 were the same as in Control 18.

Then, in the same way as in Example 19, a trench 46 was formed in the insulation film 40, the porous inter-layer insulation film 38 and the insulation film 36 (see FIG. 3A).

Next, in the same way as in Example 19, an interconnection 50 was buried in the insulation film 36, the inter-layer insulation film 38 and the insulation film 40. Then, in the same way as in Example 19, an insulation film 52 was formed (FIG. 3B).

Next, in the same way as in Example 19, a porous inter-layer insulation film 54 was formed. Then, in the same way as in Example 19, a dense insulation film 56 was formed on the porous inter-layer insulation film 54 (see FIG. 4A).

Next, with the dense insulation film 56 present on the porous inter-layer insulation film 54, plasmas were applied to the inter-layer insulation film 54 through the insulation film 56 (plasma cure). Conditions for applying the plasmas to the inter-layer insulation film 54 through the insulation film 56 were the same as in Control 18.

Next, in the same way as in Example 19, a porous inter-layer insulation film 58 was formed. Next, in the same way as in Example 19, a dense insulation film 60 was formed on the porous inter-layer insulation film 58 (see FIG. 5A).

Then, with the dense insulation film 60 present on the porous inter-layer insulation film 58, plasmas were applied to the inter-layer insulation film 58 through the insulation film 60 (plasma cure). Conditions for applying the plasmas to the inter-layer insulation film 58 through the insulation film 60 were the same as in Control 18 (see FIG. 5B).

Next, in the same way as in Example 19, a contact hole 66 was formed in the insulation film 60, the inter-layer insulation film 58, the insulation film 56, the inter-layer insulation film 54 and the insulation film 52 (see FIG. 6).

Next, in the same way as in Example 19, a trench 72 was formed in the insulation film 60, the inter-layer insulation film 58 and the insulation film 56 (see FIG. 7).

Next, in the same way as in Example 19, an interconnection 76a was buried in the trench 72 while a conductor plug 76b was buried in the contact hole 66. Next, in the same way as in Example 19, an insulation film 78 was formed (see FIG. 8). Then, the same steps as above were repeated to thereby form the third layer interconnection.

The thus fabricated semiconductor device had interconnections and conductor plugs formed, electrically connected serially to one million conductor plugs, and the yield was measured. The yield was 82%. The effective dielectric constant between the interconnections was computed, and the effective dielectric constant was 2.94. The resistance of the interconnections was measured after left at 200° C. for 3000 hours, and no resistance rise was confirmed.

[Control 27]

First, in the same way as in Example 19, a transistor 24 was fabricated (see FIG. 9A), an inter-layer insulation film 26 and a stopper film 28 were formed (see FIG. 9B), and then a conductor plug 34 was buried in a contact hole 30 (see FIG. 9C).

Next, in the same way as in Example 19, an insulation film 36 was formed, and then a porous inter-layer insulation film 38 was formed (see FIG. 10A).

Next, without a dense insulation film formed on the porous inter-layer insulation film 38, plasmas were applied to the porous inter-layer insulation film 38 (plasma cure). Conditions for applying the plasmas are the same as in Control 19 (see FIG. 10B).

Next, an insulation film 40 of a 30 nm-thickness silicon oxide film was formed on the entire surface by plasma CVD (see FIG. 10C)

Next, in the same way as in Example 19, a trench 46 was formed in the insulation film 40, the porous inter-layer insulation film 38 and the insulation film 36 (see FIG. 11A). Next, in the same way as in Example 19, an interconnection 50 was buried in the insulation film 40, the inter-layer insulation film 38 and the insulation film 36. Next, in the same way as in Example 19, an insulation film 52 was formed (see FIG. 11B).

Then, in the same way as in Example 19, a porous inter-layer insulation film 54 was formed (see FIG. 12A). Next, without a dense insulation film formed on the porous inter-layer insulation film 54, plasmas were applied to the inter-layer insulation film 54 (plasma cure). Conditions for applying the plasmas were the same as in Control 19 (see FIG. 12B).

Next, an insulation film 56 of a 30 nm-thickness SiC:O:H film on the entire surface (see FIG. 3A).

Next, in the same way as in Example 19, a porous inter-layer insulation film 58 was formed (see FIG. 13B).

Next, without a dense insulation film formed on the porous inter-layer insulation film 58, plasmas were applied to the porous inter-layer insulation film 58 (plasma cure). Conditions for the application of the plasmas were the same as in Control 19 (see FIG. 14A).

Next, an insulation film 60 of a 30 nm-thickness silicon oxide film was formed on the entire surface by plasma CVD (see FIG. 14B).

Next, in the same way as in Example 19, a conductor plug 76b and an interconnection 76a were buried in the inter-layer insulation films 54, 58, etc. by dual damascene. Next, in the same way as in Example 19, an insulation film 78 was formed (see FIG. 15). Then, the same steps as above were repeated to thereby form the third layer interconnection.

The thus fabricated semiconductor device had interconnections and conductor plugs formed, electrically connected serially to one million conductor plugs, and the yield was measured. The yield was 42%. The effective dielectric constant between the interconnections was computed, and the effective dielectric constant was 3.6. The resistance of the interconnections was measured after left at 200° C. for 3000 hours, and resistance rise was confirmed.

What is claimed is:

1. A semiconductor device fabrication method comprising the steps of:
    forming a first porous insulation film over a semiconductor substrate;
    forming over the first porous insulation film a second insulation film the density of which is higher than that of the first porous insulation film; and
    applying electron beams, UV rays or plasmas to the first porous insulation film with the second insulation film present on the first porous insulation film to cure the first porous insulation film,
    wherein the density of the second insulation film is 1-3 g/cm$^3$.

2. The semiconductor device fabricating method according to claim 1, wherein
    in the step of curing the first porous insulation film, the semiconductor substrate is not heated, but UV rays or plasmas are applied to thereby cure the first porous insulation film.

3. The semiconductor device fabrication method according to claim 1, wherein
    the density of the second insulation film is 1-2.5 g/cm$^3$.

4. The semiconductor device fabrication method according to claim 1, wherein
    the step of forming the first porous insulation film includes the step of applying an insulation film material containing a thermally decomposable compound and the step of performing thermal processing to decompose the thermally decomposable compound to form pores in the insulation film material to thereby make the first porous insulation film.

5. The semiconductor device fabrication method according to claim 1, wherein
    in the step of forming the first porous insulation film, the first porous insulation film is formed by vapor deposition.

6. The semiconductor device fabrication method according to claim 1, wherein
    in the step of forming the first porous insulation film, the first porous insulation film is formed by vapor deposition using a raw material containing thermally decomposable atomic groups or oxidation decomposable atomic groups while the atomic groups are being decomposed.

7. The semiconductor device fabrication method according to claim 1, wherein
    in the step of forming a second insulation film, the second insulation film of a silicon oxide film, a carbon-doped silicon oxide film, a SiC hydride film, a SiC nitride film or a SiC hydride oxide film is formed by vapor deposition.

8. The semiconductor device fabrication method according to claim 1, wherein
    the step of forming a second insulation film includes the step of forming a silicon oxide film by application, and the step of thermally processing the silicon oxide film to form the second insulation film of the silicon oxide film.

9. The semiconductor device fabrication method according to claim 1, further comprising, after the step of curing the first porous insulation film,
    the steps of forming a trench in the first porous insulation film and the second insulation film; and burying an interconnection in the trench.

10. The semiconductor device fabrication method according to claim 1, wherein
    in the step of curing the first porous insulation film, thermal processing is performed while electron beams, UV rays or plasmas are being applied to thereby cure the first porous insulation film.

11. The semiconductor device fabrication method according to claim 10, wherein
    the thermal processing temperature in the step of curing the first porous insulation film is 200-500° C.

12. A semiconductor device fabrication method comprising the steps of:
    forming a first porous insulation film over a semiconductor substrate;
    forming over the first porous insulation film a second insulation film the density of which is higher than that of the first porous insulation film; and
    applying electron beams, UV rays or plasmas to the first porous insulation film with the second insulation film present on the first porous insulation film to cure the first porous insulation film,
    wherein in the step of curing the first porous insulation film, plasmas are applied at a 1-100 eV application energy to cure the first porous insulation film.

13. A semiconductor device fabrication method comprising the steps of:
   forming a first porous insulation film over a semiconductor substrate;
   forming over the first porous insulation film a second insulation film the density of which is higher than that of the first porous insulation film; and
   applying electron beams, UV rays or plasmas to the first porous insulation film with the second insulation film present on the first porous insulation film to cure the first porous insulation film,
   wherein the film thickness of the second insulation film is 5-70 nm.

14. The semiconductor device fabrication method according to claim 13, wherein
   the film thickness of the second insulation film is 10-50 nm.

15. A semiconductor device fabrication method comprising the steps of:
   forming a first porous insulation film over a semiconductor substrate;
   forming over the first porous insulation film a second insulation film the density of which is higher than that of the first porous insulation film; and
   applying electron beams, UV rays or plasmas to the first porous insulation film with the second insulation film present on the first porous insulation film to cure the first porous insulation film,
   wherein the step of forming the first porous insulation film includes the step of applying an insulation material containing a cluster compound, and the step of performing thermal processing to evaporate a solvent in the insulation film material to thereby make the first porous insulation film.

16. A semiconductor device fabrication method comprising the steps of:
   forming a first porous insulation film over a semiconductor substrate;
   forming over the first porous insulation film a second insulation film the density of which is higher than that of the first porous insulation film; and
   applying electron beams, UV rays or plasmas to the first porous insulation film with the second insulation film present on the first porous insulation film to cure the first porous insulation film,
   wherein the step of forming the first porous insulation film includes the step of applying an insulation film material containing a thermally decomposable compound and the step of performing thermal processing to decompose the thermally decomposable compound to form pores in the insulation film material to thereby make the first porous insulation film, and
   the thermal processing temperature in the step of forming the first porous insulation film is 200-350° C.

17. A semiconductor device fabricating method comprising the steps of:
   forming a first porous insulation film over a semiconductor substrate;
   forming over the first porous insulation film a second insulation film the density of which is higher than that of the first porous insulation film; and
   applying electron beams, UV rays or plasmas to the first porous insulation film with the second insulation film present on the first porous insulation film to cure the first porous insulation film,
   wherein the step of forming the first porous insulation film includes the step of applying an insulation film material containing a thermally decomposable compound and the step of performing thermal processing to decompose the thermally decomposable compound to form pores in the insulation film material to thereby make the first porous insulation film,
   in the step of forming a first insulation film, the thermal processing is made so that the cross-linking percentage in the first porous insulation film becomes 10-90%.

* * * * *